US011088040B2

(12) United States Patent
Lin et al.

(10) Patent No.: US 11,088,040 B2
(45) Date of Patent: Aug. 10, 2021

(54) CELL-LIKE FLOATING-GATE TEST STRUCTURE

(71) Applicant: Taiwan Semiconductor Manufacturing Co., Ltd., Hsin-Chu (TW)

(72) Inventors: Meng-Han Lin, Hsinchu (TW); Chih-Ren Hsieh, Changhua (TW); Ya-Chen Kao, Fuxing Township (TW); Chen-Chin Liu, Hsinchu (TW); Chih-Pin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/578,303

(22) Filed: Sep. 21, 2019

(65) Prior Publication Data
US 2020/0020601 A1    Jan. 16, 2020

Related U.S. Application Data

(62) Division of application No. 15/962,177, filed on Apr. 25, 2018, now Pat. No. 10,535,574.
(Continued)

(51) Int. Cl.
*H01L 21/66*    (2006.01)
*H01L 27/11529*    (2017.01)
(Continued)

(52) U.S. Cl.
CPC ........ *H01L 22/34* (2013.01); *H01L 27/11524* (2013.01); *H01L 27/11526* (2013.01);
(Continued)

(58) Field of Classification Search
CPC .............. H01L 22/34; H01L 27/11524; H01L 27/11529; H01L 27/11519; H01L 29/4234;
(Continued)

(56) References Cited

U.S. PATENT DOCUMENTS 5,864,501 A    1/1999  Lee
6,285,584 B1*  9/2001  Ahrens .................. G11C 16/14
                                          257/E27.103
(Continued)

FOREIGN PATENT DOCUMENTS

TW    200516727 A    5/2005
TW    200843040 A    11/2008

OTHER PUBLICATIONS

Notice of Allowance dated Oct. 8, 2019 in connection with U.S. Appl. No. 15/962,177.
(Continued)

*Primary Examiner* — Mouloucoulaye Inoussa
(74) *Attorney, Agent, or Firm* — Eschweiler & Potashnik, LLC

(57) ABSTRACT

Various embodiments of the present application are directed to an integrated circuit (IC) comprising a floating gate test device with a cell-like top layout, as well as a method for forming the IC. In some embodiments, the IC comprises a semiconductor substrate and the floating gate test device. The floating gate test device is on the semiconductor substrate, and comprises a floating gate electrode and a control gate electrode overlying the floating gate electrode. The floating gate electrode and the control gate electrode partially define an array of islands, and further partially define a plurality of bridges interconnecting the islands. The islands
(Continued)

and the bridges define the cell-like top layout and may, for example, prevent process-induced damage to the floating gate test device.

20 Claims, 40 Drawing Sheets

Related U.S. Application Data

(60) Provisional application No. 62/560,967, filed on Sep. 20, 2017.

(51) Int. Cl.
  *H01L 27/11524* (2017.01)
  *H01L 27/11526* (2017.01)
  *H01L 29/423* (2006.01)
  *H01L 27/11519* (2017.01)

(52) U.S. Cl.
  CPC .. *H01L 27/11529* (2013.01); *H01L 29/42328* (2013.01); *H01L 27/11519* (2013.01)

(58) Field of Classification Search
  CPC ......... H01L 27/11568; H01L 27/11573; H01L 21/28282; H01L 21/28518; H01L 23/5226; H01L 27/1157; H01L 29/42344; H01L 29/66833; H01L 29/792; H01L 21/31051; H01L 21/31105; H01L 21/31144; H01L 29/66553; H01L 29/66545; H01L 21/823468; G11C 11/5671; G11C 16/0466; G11C 16/0475

USPC ................ 257/306, 316, 324, 506, E27.081, 257/E27.097; 438/239, 287, 267
  See application file for complete search history.

(56) References Cited

U.S. PATENT DOCUMENTS

| | | | |
|---|---|---|---|
| 6,365,457 B1* | 4/2002 | Choi | H01L 27/11521 |
| | | | 438/258 |
| 9,543,315 B1* | 1/2017 | Chakihara | H01L 27/11573 |
| 9,543,316 B2* | 1/2017 | Lee | H01L 23/535 |
| 10,026,742 B2 | 7/2018 | Kim et al. | |
| 2006/0079052 A1 | 4/2006 | Kanamori | |
| 2007/0026612 A1 | 2/2007 | Lee | |
| 2007/0257299 A1* | 11/2007 | Chen | H01L 27/115 |
| | | | 257/315 |
| 2008/0285344 A1* | 11/2008 | Ruttkowski | H01L 27/115 |
| | | | 365/185.05 |
| 2009/0184364 A1 | 7/2009 | Terada | |
| 2009/0283764 A1 | 11/2009 | Kim et al. | |
| 2015/0263139 A1* | 9/2015 | Fujii | H01L 29/40114 |
| | | | 257/296 |
| 2016/0336415 A1* | 11/2016 | Wu | H01L 29/788 |

OTHER PUBLICATIONS

Ex Parte Quayle Office Action dated Aug. 16, 2019 in connection with U.S. Appl. No. 15/962,177.

* cited by examiner ns (1,088,040 B2)

CELL-LIKE FLOATING-GATE TEST STRUCTURE

REFERENCE TO RELATED APPLICATIONS

This Application is a Divisional of U.S. application Ser. No. 15/962,177, filed on Apr. 25, 2018, which claims the benefit of U.S. Provisional Application No. 62/560,967, filed on Sep. 20, 2017. The contents of the above-referenced Patent Applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component that can be created) has decreased. Some advancements in the evolution of ICs include embedded memory technology. Embedded memory technology is the integration of memory devices with logic devices on the same semiconductor chip, such that the memory devices support operation of the logic devices. Embedded memory finds application in, among other things, smart cards and automotive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B through FIGS. 27A and 27B illustrate a series of cross-sectional views of some embodiments a method for forming an IC comprising a floating gate test device with a cell-like top layout.

FIGS. 29A and 29B through FIGS. 41A and 41B illustrates a series of cross-sectional views of some alternative embodiments of the method of FIGS. 5A and 5B through FIGS. 27A and 27B in which the method has a gate replacement process.

DETAILED DESCRIPTION

Figure 1A:
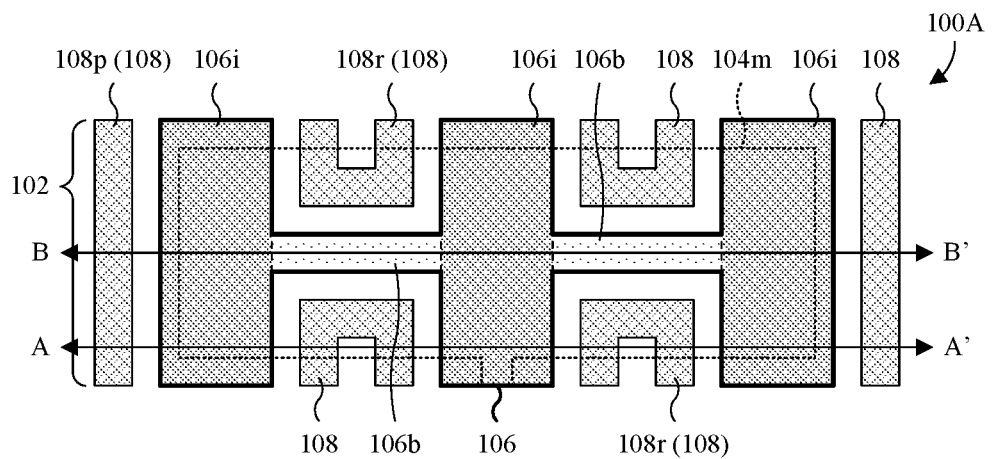
FIGS. 1 and 1B illustrate top layout views of various embodiments of an integrated circuit (IC) comprising a floating gate test device with a cell-like top layout.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to a method for manufacturing an integrated circuit (IC) with embedded memory technology, a memory cell structure and a floating gate test device structure are formed on a semiconductor memory region of a semiconductor substrate. The floating gate test device structure comprises a floating gate dielectric layer and a floating gate electrode overlying the floating gate dielectric layer. The floating gate test device may, for example, be employed to test the quality of the floating gate dielectric layer since the quality of the floating gate dielectric layer is representative of the life span of the memory cell structure. A hard mask layer is formed covering the semiconductor substrate, and a planarization is performed into a top surface of the hard mask layer to flatten the top surface. The hard mask layer is patterned to remove the hard mask layer from a semiconductor logic region of the semiconductor substrate, and to define a memory hard mask covering the memory cell structure and the floating gate test device structure, but not the semiconductor logic region. Residual material remaining from formation of the memory cell structure and the floating gate test device structure is removed from the semiconductor logic region with the memory hard mask in place. Logic device layers are then deposited and patterned on the of the semiconductor logic region to form a logic device structure on the of the semiconductor logic region.

A challenge with the method is a height of the memory cell structure and a height of the floating gate test device structure exceed a height of the logic device structure, thereby precluding application of the method in future process nodes. A solution is to reduce the heights respectively of the floating gate test device structure and memory cell structure before forming the memory hard mask. An etch-back layer is deposited covering the memory cell structure and the floating gate test device structure, and a non-selective etch back is subsequently performed to reduce the heights respectively of the memory cell structure and the floating gate test device structure. The non-selective etch back etches the etch-back layer, the memory cell structure, and the floating gate test device structure until the heights respectively of the memory cell structure and the floating gate test device structure are sufficiently reduced.

While the non-selective etch back is effective at reducing the height of the memory cell structure, the non-selective etch back is ineffective at reducing the height of the floating gate test device structure. The floating gate test device structure has a bulk floating gate top layout covering a large area of the semiconductor substrate compared to a bulk floating gate top layout of the memory cell structure. A bulk top layout may, for example, be a top layout that has a single area, instead of multiple smaller areas, and that has a single boundary extending in a closed path. The bulk floating gate top layouts respectively propagate to a top of the floating gate test device structure and a top of the memory cell structure, such that the floating gate test device structure has a bulk, large-area top layout and the top of the memory cell structure has a bulk, small-area top layout. The difference in area between the bulk, large-area top layout and the bulk, small-area top layout causes etch-back material of the etch-back layer to more readily accumulate on the floating gate test device structure than on the memory cell structure during deposition of the etch-back layer, whereby the etch-back layer is thicker on the floating gate test device structure than on the memory cell structure. Because there is more etch-back material to etch through on the floating gate test device structure, the floating gate test device structure is minimally etched during the non-selective etch back compared to the memory cell structure. Further, a height of the floating gate test device structure exceeds that of the memory cell structure upon completion of the non-selective etch back.

Because the height of the floating gate test device structure exceeds that of the memory cell structure, and the top surface of the memory hard mask is flat or substantially flat, a first thickness of the memory hard mask on the floating gate test device structure is less than a second thickness of the memory hard mask on the memory cell structure. As a result, the floating gate test device structure has less protection and may be destroyed or severely damaged while forming the logic device structure. For example, removing the residual material on the semiconductor logic region may partially remove the memory hard mask. Due to the reduced thickness of the memory hard mask on the floating gate test device structure, the removal may also uncover the floating gate test device structure, but not the memory cell structure, and form an opening extending through the floating gate test device structure. The opening may extend to the floating gate electrode and the semiconductor memory region, and facilitate electrical shorting between the semiconductor memory region and the floating gate electrode during subsequent back-end-of-line (BEOL) processing.

In view of the foregoing, various embodiments of the present application provide a method for forming an IC comprising a floating gate test device structure with a cell-like top layout. In some embodiments, a floating gate test device structure is formed on a semiconductor substrate. The floating gate test device structure comprises a first floating gate electrode and a first control gate electrode overlying the first floating gate electrode. The first floating gate electrode and the first control gate electrode partially define an array of islands, and further partially define a plurality of bridges. The bridges interconnect the islands. A memory cell structure is formed on the semiconductor substrate, and comprises a second floating gate electrode and a second control gate electrode overlying the second floating gate electrode. An etch-back layer is formed covering the floating gate test device structure and the memory cell structure. The etch-back layer has a first thickness directly over the first control gate electrode, and further has a second thickness directly over the second control gate electrode. The first and second thicknesses are the same or substantially the same.

By forming the first floating gate electrode comprising the islands and the bridges, the floating gate electrode has a cell-like top layout. The cell-like top layout is a top layout having multiple small areas that are interconnected, instead of one large area, and is similar to a top layout of an array of memory cells. The cell-like top layout may prevent etch-back material of the etch-back layer from more readily accumulating atop the floating gate test device structure compared to the memory cell structure. This may, in turn, prevent the floating gate test device structure from being destroyed or damaged while forming a logic device structure, and/or may prevent electrical shorting between the semiconductor substrate and the first floating gate electrode during BEOL processing. The method may be performed at low cost, without extra reticles or photomasks, and without effecting the reliability and performance of the floating gate test device structure. Further, the method may be compatible with future process nodes, such as, for example, 28 nanometer process nodes, 20 nanometer process nodes, 16 nanometer process nodes, and smaller process nodes.

With reference to FIG. 1A, a top layout view 100A of some embodiments of an IC comprising a floating gate test device 102 with a cell-like top layout is provided. The floating gate test device 102 is on a semiconductor memory region 104*m* and comprises a gate stack 106. As seen hereafter, the gate stack 106 is defined by multiple gate electrodes (e.g., a floating gate electrode and a control gate electrode) stacked along an axis extending into and out of the page. The gate stack 106 comprises a plurality of islands 106*i* and a plurality of bridges 106*b*. For illustrative purposes, the hashing is varied between the islands 106*i* and the bridges 106*b*. However, it is to be understood that the islands 106*i* may be integrated and/or continuous with the bridges 106*b*.

The islands 106*i* are arranged in one or more rows and one or more columns to define an island array. In some embodiments, the islands 106*i* are arranged in a single row and multiple columns, or multiple rows and a single column. For example, the islands 106*i* may be arranged in three columns and one row. Further, in some embodiments, the islands 106*i* share a common top layout. For example, the islands 106*i* may have a rectangular top layout, a square top layout, a triangular top layout, or some other suitable top layout(s). As used herein, a term (e.g., top layout) with a suffix of "(s)" may, for example, be singular or plural. The bridges 106*b* are arranged between the islands 106*i* to interconnect the islands 106*i*, and each of the bridges 106*b* extends from direct contact with a corresponding first island of the islands 106*i* to a corresponding second island of the islands 106*i* that neighbors the corresponding first island. In some embodiments, the bridges 106*b* comprise a bridge for each pair of neighboring islands in the island array, and the bridge extends from direct contact with a first island of the pair to a second island of the pair. Further, in some embodiments, the bridges 106*b* share a common top layout, and/or the common top layout of the bridges 106*b* is smaller than the common top layout of the islands 106*i*. For example, the bridges 106*b* may have a rectangular top layout, a square top layout, a triangular top layout, or some other suitable top layout(s). The common top layout of the bridges 106*b* may, for example, be smaller than the common top layout of the islands 106*i* in terms of area, width, length, or some other suitable parameter(s).

In some embodiments, a plurality of test-device select gate electrodes 108 border the gate stack 106. The test-device select gate electrodes 108 may be or comprise, for example, metal, doped polysilicon, or some other suitable conductor(s). In some embodiments, the test-device select gate electrodes 108 comprise a plurality of recessed select gate electrodes 108*r* arranged completely or substantially completely within recesses defined by the gate stack 106. For ease of illustration, only some of the recessed select gate electrodes 108*r* are labeled 108*r*. The recessed select gate electrodes 108*r* may, for example, have a u-shaped top layout or some other suitable top layout(s). Further, in some embodiments, the test-device select gate electrodes 108 comprise a plurality of peripheral select gate electrodes 108*p* arranged to the sides of the gate stack 106, and arranged completely or substantially completely outside recesses defined by the gate stack 106. For ease of illustration, only one of the peripheral select gate electrodes 108*p* is labeled 108*p*. The peripheral select gate electrodes 108*p* may, for example, have a line-shaped top layout or some other suitable top layout(s).

By forming the floating gate test device 102 comprising the islands 106*i* and the bridges 106*b*, the floating gate test device 102 has a cell-like top layout made up of multiple small areas that are interconnected instead of one large area. As seen hereafter, this may prevent the floating gate test device 102 from becoming destroyed or damaged while forming a logic device of the IC, and/or may prevent electrical shorting between the semiconductor memory region 104*m* and a floating gate electrode (not shown) of the gate stack 106. Further, as seen hereafter, the floating gate test device 102 may be formed with the cell-like top layout at low cost, without extra reticles or photomasks, and without effecting the reliability and performance of the floating gate test device 102. Further yet, as seen hereafter, the floating gate test device 102 is compatible with future process nodes, such as, for example, 28 nanometer process nodes, 20 nanometer process nodes, 16 nanometer process nodes, and smaller process nodes.

Figure 1B:
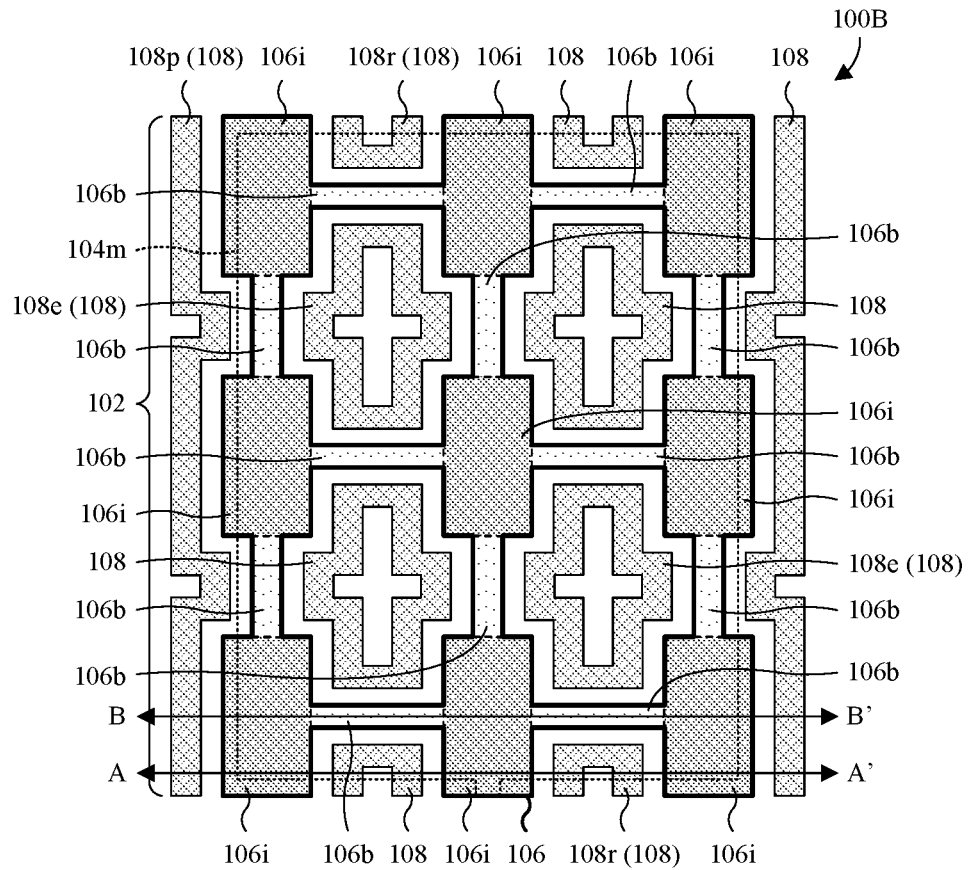

With reference to FIG. 1B, a top layout view 100B of some other embodiments of an IC comprising a floating gate test device 102 with a cell-like top layout is provided. FIG. 1B is a variant of FIG. 1A in which the islands 106*i* are arranged in a plurality of rows and a plurality of columns. For example, the islands 106*i* may be arranged in three rows and three columns. Further, in some embodiments, the test-device select gate electrodes 108 comprise one or more enclosed select gate electrodes 108*e* completely enclosed by the gate stack 106. For ease of illustration, only some of the enclosed select gate electrodes 108*e* are labeled 108*e*. The enclosed select gate electrodes 108*e* may, for example, have a ring-shaped-like top layout or some other suitable top layout(s). As used herein, a ring-shaped-like top layout is a ring-shaped top layout that is not limited to circular boundaries or sidewalls.

Figure 2A:
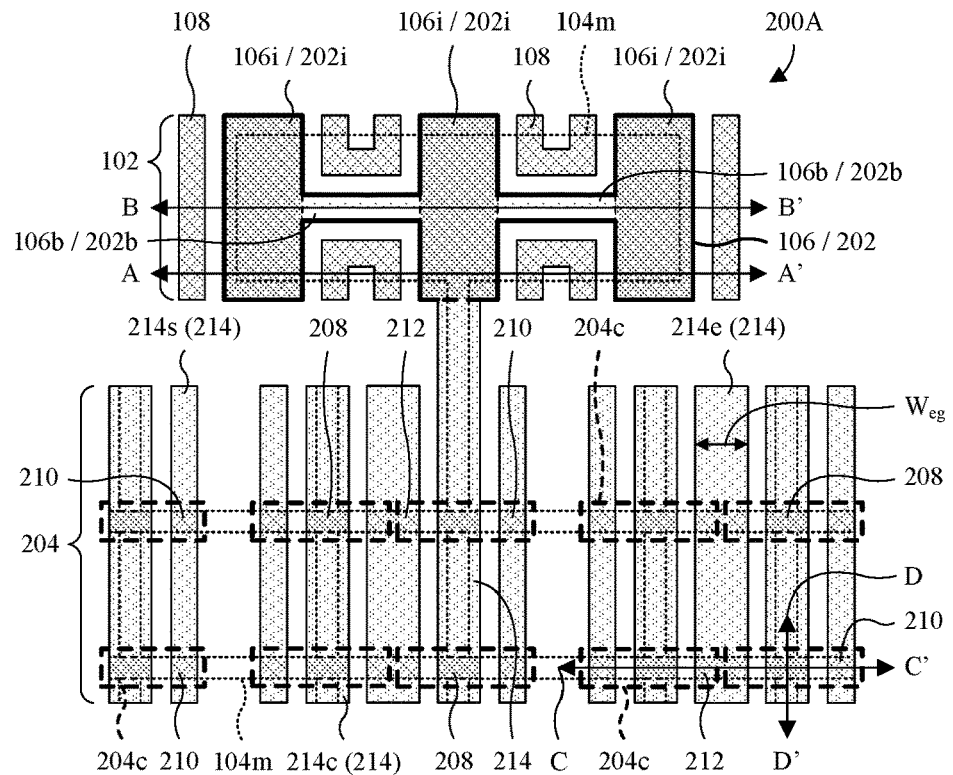
FIGS. 2A-2F illustrate various top layout views of some more detailed embodiments of the IC of FIG. 1A in which the IC comprises a memory cell array.

With reference to FIG. 2A, a top layout view 200A of some more detailed embodiments of the IC of FIG. 1A is provided. The floating gate test device 102 comprises a test-device control gate electrode 202 partially defining the gate stack 106. The test-device control gate electrode 202 may be or comprise, for example, metal, doped polysilicon, some other suitable conductor(s), or any combination of the foregoing. Further, the test-device control gate electrode 202 includes a plurality of control gate islands 202*i* and a plurality of control gate bridges 202*b*. For illustrative purposes, the hashing is varied between the control gate islands 202*i* and the control gate bridges 202*b*. However, it is to be understood that the control gate islands 202*i* may be integrated and/or continuous with the control gate bridges 202*b*.

The control gate islands 202*i* partially define the islands 106*i* of the gate stack 106, respectively, and are arranged in one or more rows and one or more columns to define a control gate island array. In some embodiments, the control gate island array has a single row and multiple columns, or multiple rows and a single column. Further, in some embodiments, the control gate islands 202*i* share a common top layout. For example, the control gate islands 202*i* may share a rectangular top layout, a square top layout, or some other suitable top layout(s). The control gate bridges 202*b* partially define the bridges 106*b* of the gate stack 106, respectively, and are arranged between the control gate islands 202*i* to interconnect the control gate islands 202*i*. Further, the control gate bridges 202*b* comprise a control gate bridge for each pair of neighboring control gate islands in the control gate island array, and the control gate bridge extends from direct contact with a first island of the pair to a second island of the pair. In some embodiments, the control gate bridges 202*b* share a common top layout. For example, the control gate bridges 202*b* may share a rectangular top layout or some other suitable top layout(s).

In some embodiments, the floating gate test device 102 borders a memory cell array 204. Further, in some embodiments, the memory cell array 204 rests on the semiconductor memory region 104*m*, and/or the semiconductor memory region 104*m* is continuous from the floating gate test device 102 to the memory cell array 204. The memory cell array 204 comprises a plurality of memory cells 204*c* arranged in a plurality of rows and a plurality of columns. For ease of illustration, only some of the memory cells 204*c* are labeled 204*c*. The memory cells 204*c* comprise a plurality of memory control gate electrodes 208, a plurality of memory select gate electrodes 210, and a plurality of memory erase gate electrodes 212. For ease of illustration, only some of the memory control gate electrodes 208 are labeled 208, only some of the memory select gate electrodes 210 are labeled 210, and only some of the memory erase gate electrodes 212 are labeled 212. The memory control gate electrodes 208, the memory select gate electrodes 210, and the memory erase gate electrodes 212 may be or comprise, for example, metal, doped polysilicon, or some other suitable conductor(s).

Each of the memory cells 204*c* includes a corresponding control gate electrode of the memory control gate electrodes 208, a corresponding select gate electrode of the memory select gate electrodes 210, and a corresponding erase gate electrode of the memory erase gate electrodes 212. The corresponding select gate electrode borders a first sidewall of the corresponding control gate electrode. The corresponding erase gate electrode borders a second sidewall of the corresponding control gate electrode that is opposite the first sidewall. Further, in some embodiments, the memory cells 204*c* are grouped into pairs, and the memory cells of each pair share the corresponding erase gate electrode.

In some embodiments, a plurality of inter-device lines 214 are electrically coupled to the memory cell array 204. For ease of illustration, only some of the inter-device lines 214 are labeled 214. The inter-device lines 214 are elongated in a common direction, and are each elongated in the common direction along a corresponding row or column of the memory cell array 204. In some embodiments, the inter-device lines 214 have line-shaped top layouts or some other suitable top layout(s) that is/are elongated. The inter-device lines 214 are conductive and may be or comprise, for example, metal, doped polysilicon, or some other suitable conductor(s). The inter-device lines 214 comprise a plurality of select gate inter-device lines 214s, a plurality of erase gate inter-device lines 214e, and a plurality of control gate inter-device lines 214c. For ease of illustration, only one of the select gate inter-device lines 214s is labeled 214s, only one of the erase gate inter-device lines 214e is labeled 214e, and only one of the control gate inter-device lines 214c is labeled 214c.

The select gate inter-device lines 214s are each integrated and continuous with select gate electrodes of the memory select gate electrodes 210 in the corresponding row or column of the memory cell array 204. The erase gate inter-device lines 214e are each integrated and continuous with erase gate electrodes of the memory erase gate electrodes 212 in the corresponding row or column of the memory cell array 204. The control gate inter-device lines 214c are each integrated and continuous with control gate electrodes of the memory control gate electrodes 208 in the corresponding row or column of the memory cell array 204. Further, in some embodiments, at least one of the control gate inter-device lines 214c extends beyond the memory cell array 204 to the floating gate test device 102, and is integrated and continuous with the test-device control gate electrode 202.

Note that the hashing is varied along the select gate inter-device lines 214s merely to emphasize the memory select gate electrodes 210. Further, the hashing is varied along the erase gate inter-device lines 214e merely to emphasize the memory erase gate electrodes 212. Further, the hashing is varied along the control gate inter-device lines 214c merely to emphasize the memory control gate electrodes 208. Therefore, the varied hashing should not be construed as limiting the composition of the select gate inter-device lines 214s, the memory select gate electrodes 210, the erase gate inter-device lines 214e, the memory erase gate electrodes 212, the control gate inter-device lines 214c, and the memory control gate electrodes 208.

Figure 2B:
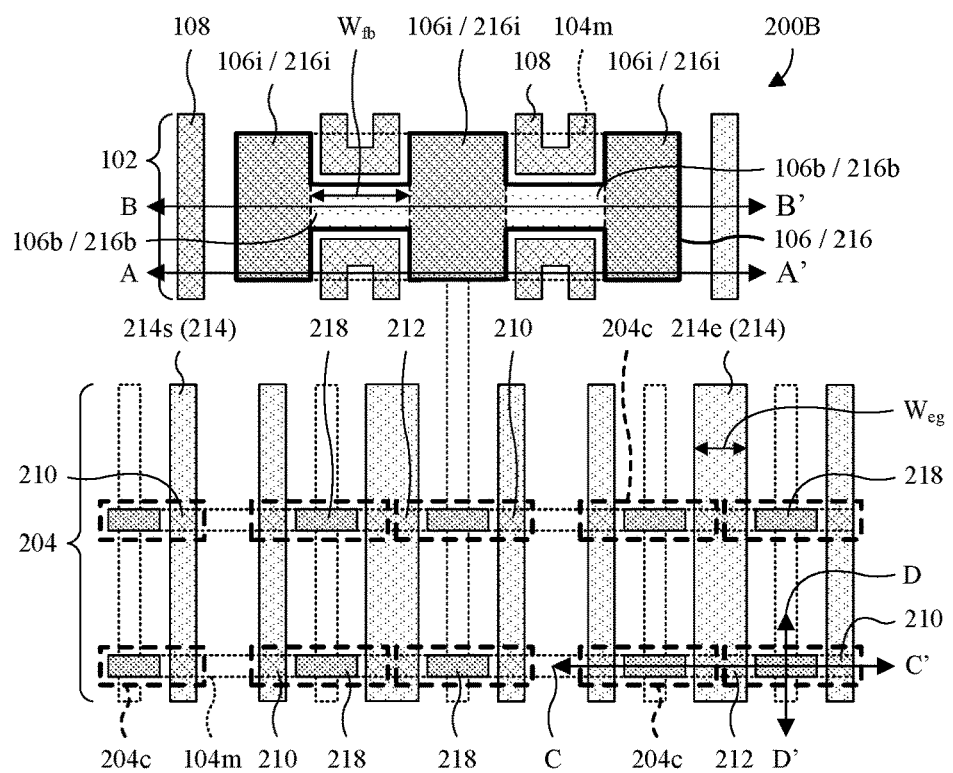

With reference to FIG. 2B, another top layout view 200B of some more detailed embodiments of the IC of FIG. 1 is provided. Whereas the top layout view 200A of FIG. 2A illustrates a control gate layout of the IC, the top layout view 200B of FIG. 2B illustrates a floating gate layout of the IC. As will be better seen hereafter, the control gate layout overlies the floating gate layout along an axis extending into and out of the page.

The floating gate test device 102 comprises a test-device floating gate electrode 216 partially defining the gate stack 106. The test-device floating gate electrode 216 may be or comprise, for example, metal, doped polysilicon, some other suitable conductor(s), or any combination of the foregoing. Further, the test-device floating gate electrode 216 includes a plurality of floating gate islands 216i and a plurality of floating gate bridges 216b. For illustrative purposes, the hashing is varied between the floating gate islands 216i and the floating gate bridges 216b. However, it is to be understood that the floating gate islands 216i may be continuous and/or integrated with the floating gate bridges 216b.

The floating gate islands 216i partially define the islands 106i of the gate stack 106, respectively, and are arranged in one or more rows and one or more columns to define a floating gate island array. In some embodiments, the floating gate island array has a single row and multiple columns, or multiple rows and a single column. Further, in some embodiments, the floating gate islands 216i share a common top layout. For example, the floating gate islands 216i may share a rectangular top layout, a square top layout, or some other suitable top layout(s). The floating gate bridges 216b partially define the bridges 106b of the gate stack 106, respectively, and are arranged between the floating gate islands 216i to interconnect the floating gate islands 216i. Further, the floating gate bridges 216b comprise a floating gate bridge for each pair of neighboring floating gate islands in the floating gate island array, and the floating gate bridge extends from direct contact with a first island of the pair to a second island of the pair. In some embodiments, the floating gate bridges 216b share a common top layout. For example, the floating gate bridges 216b may share a rectangular top layout or some other suitable top layout(s). The floating gate bridges 216b have a floating-gate-bridge width $W_{fb}$. In some embodiments, each of the floating gate bridges 216b individually has the floating-gate-bridge width $W_{fb}$.

The memory cells 204c comprise the plurality of memory select gate electrodes 210 and the plurality of memory erase gate electrodes 212, and further comprise a plurality of memory floating gate electrodes 218. For ease of illustration, only some of the memory cells 204c are labeled 204, only some of the memory floating gate electrodes 218 are labeled 218, only some of the memory select gate electrodes 210 are labeled 210, and only some of the memory erase gate electrodes 212 are labeled 212. Each of the memory cells 204c includes a corresponding floating gate electrode of the memory floating gate electrodes 218, a corresponding select gate electrode of the memory select gate electrodes 210, and a corresponding erase gate electrode of the memory erase gate electrodes 210. The corresponding select gate electrode borders a first sidewall of the corresponding floating gate electrode. The corresponding erase gate electrode borders a second sidewall of the corresponding floating gate electrode that is opposite the first sidewall. The memory erase gate electrodes 212 have an erase-gate width $W_{eg}$. In some embodiments, each of the erase gate electrodes 212 individually has the erase-gate width $W_{eg}$. In some embodiments, the floating-gate-bridge width $W_{fb}$ is greater than or equal to the erase-gate width $W_{eg}$.

Figure 2C:
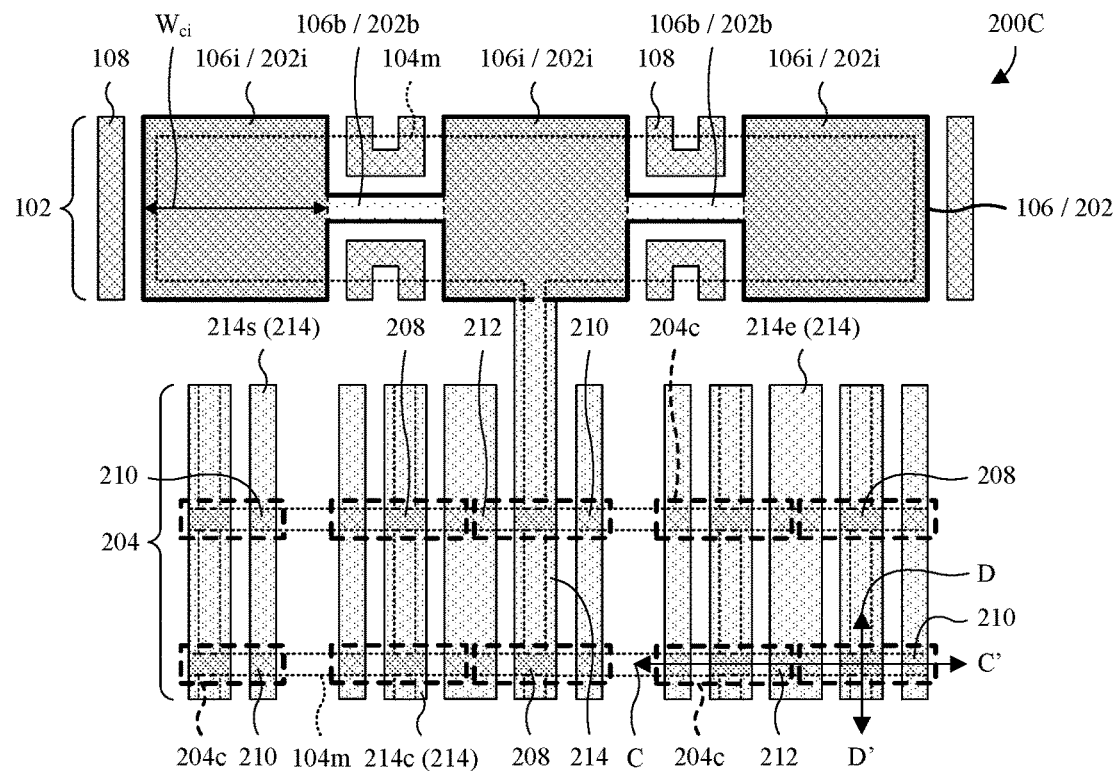
Figure 2D:
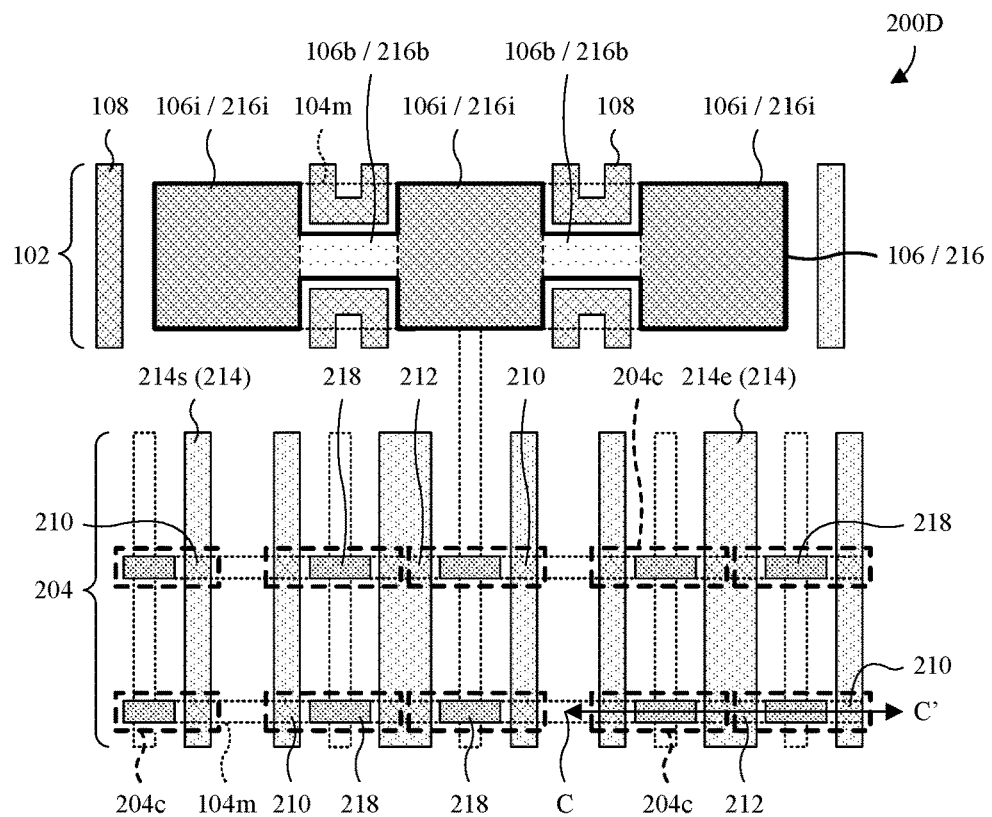

With reference to FIGS. 2C and 2D, top layout views 200C, 200D of some alternative embodiments respectively of the top layout views 200A, 200B of FIGS. 2A and 2B are provided in which the control gate islands 202i and the floating gate islands 216i are square shaped (e.g., all four sides are the same length or approximately the same length). Other shapes and/or sizes are, however, amenable in other embodiments.

Figure 2E:
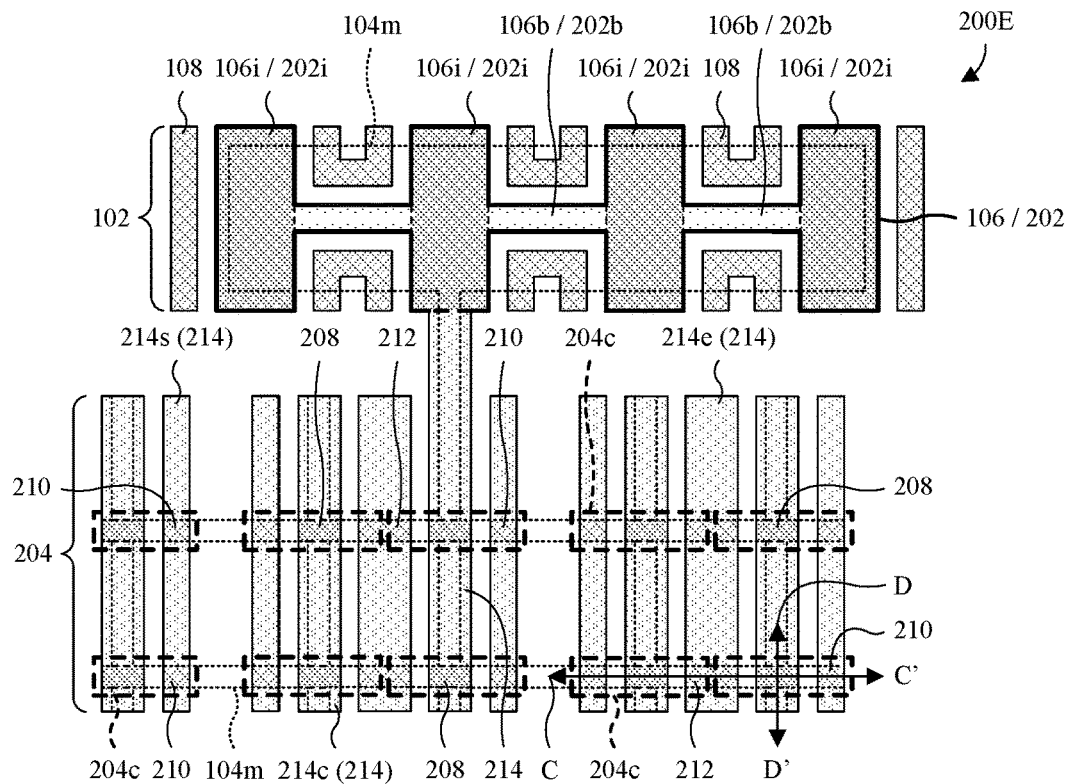
Figure 2F:
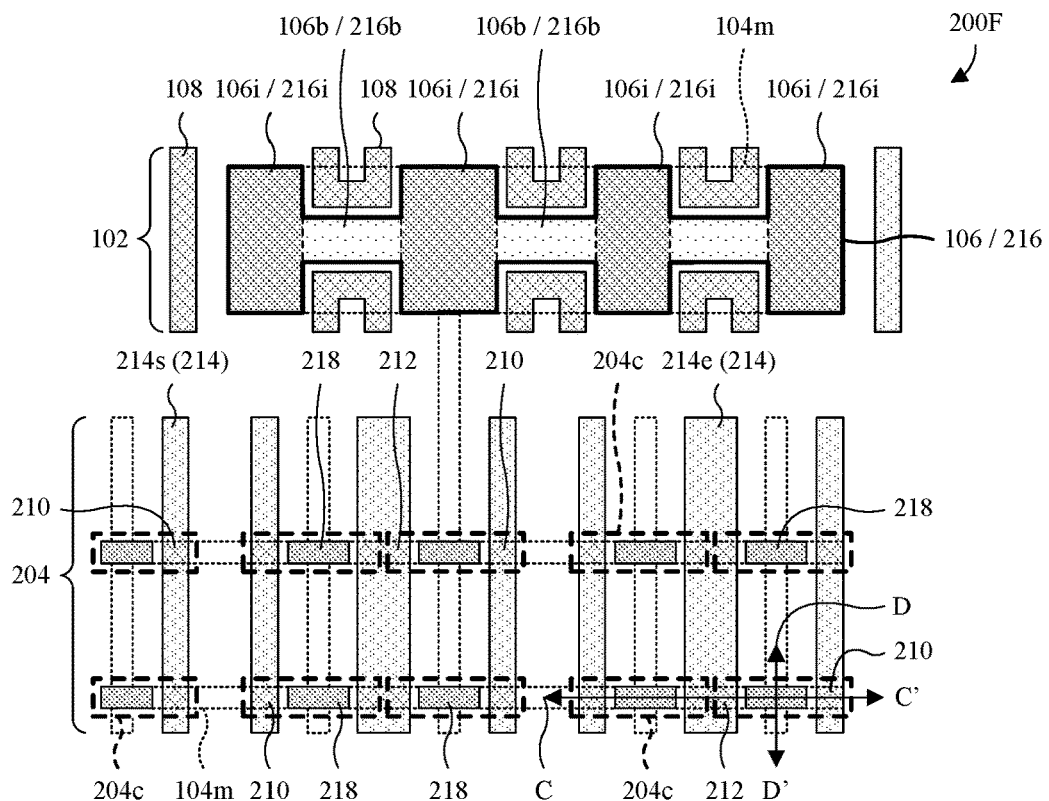

With reference to FIGS. 2E and 2F, top layout views 200E, 200F of some alternative embodiments respectively of the top layout views 200A, 200B of FIGS. 2A and 2B are provided in which an additional island 106i and an additional bridge 106b have been added to a single side of the gate stack 106. In other embodiments, more islands and more bridges may be added to the single side of the gate stack 106 and/or to other sides of the gate stack 106.

Figure 3A:
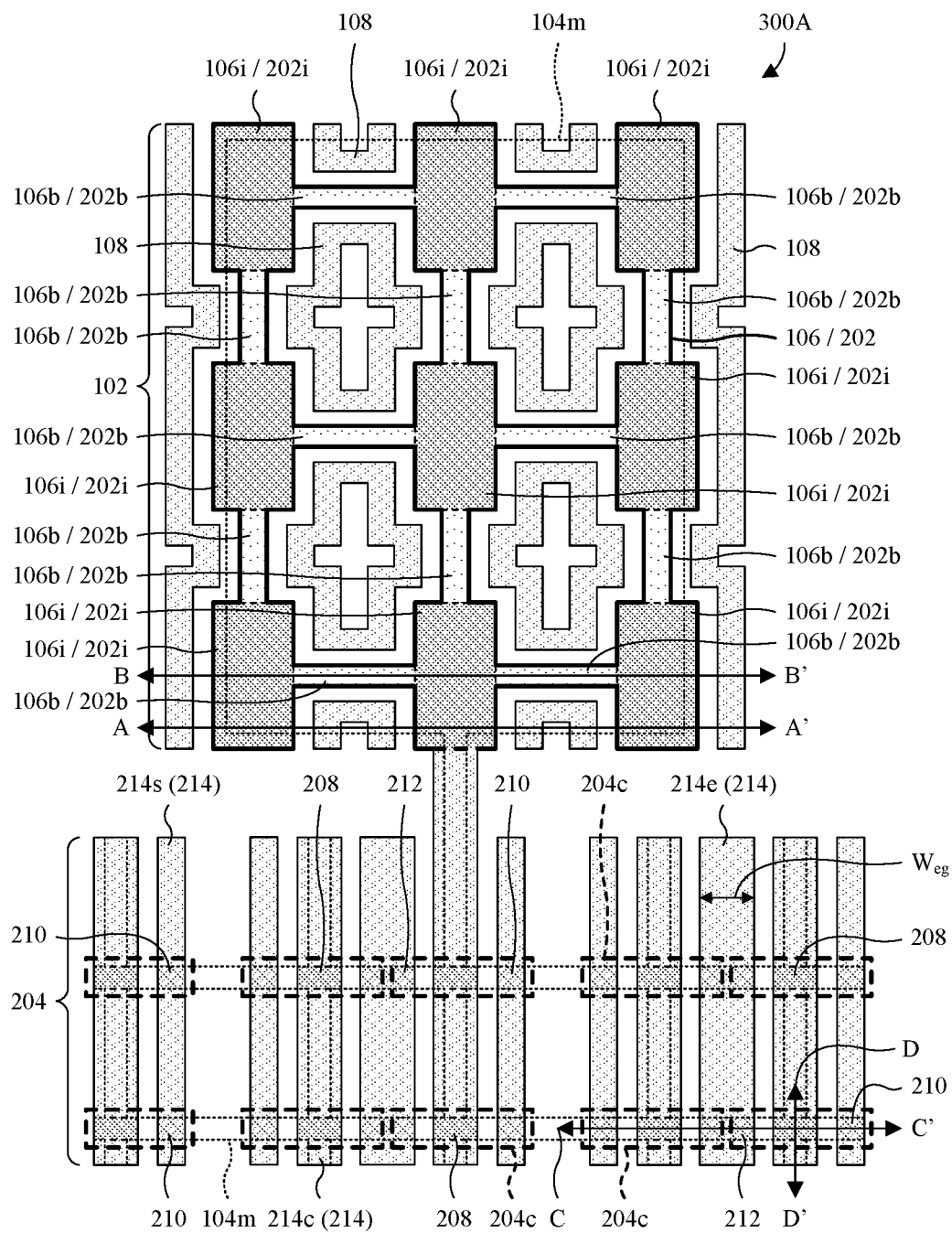
FIGS. 3A-3H illustrate various top layout views of some more detailed embodiments of the IC of FIG. 1B in which the IC comprises a memory cell array.
Figure 3B:
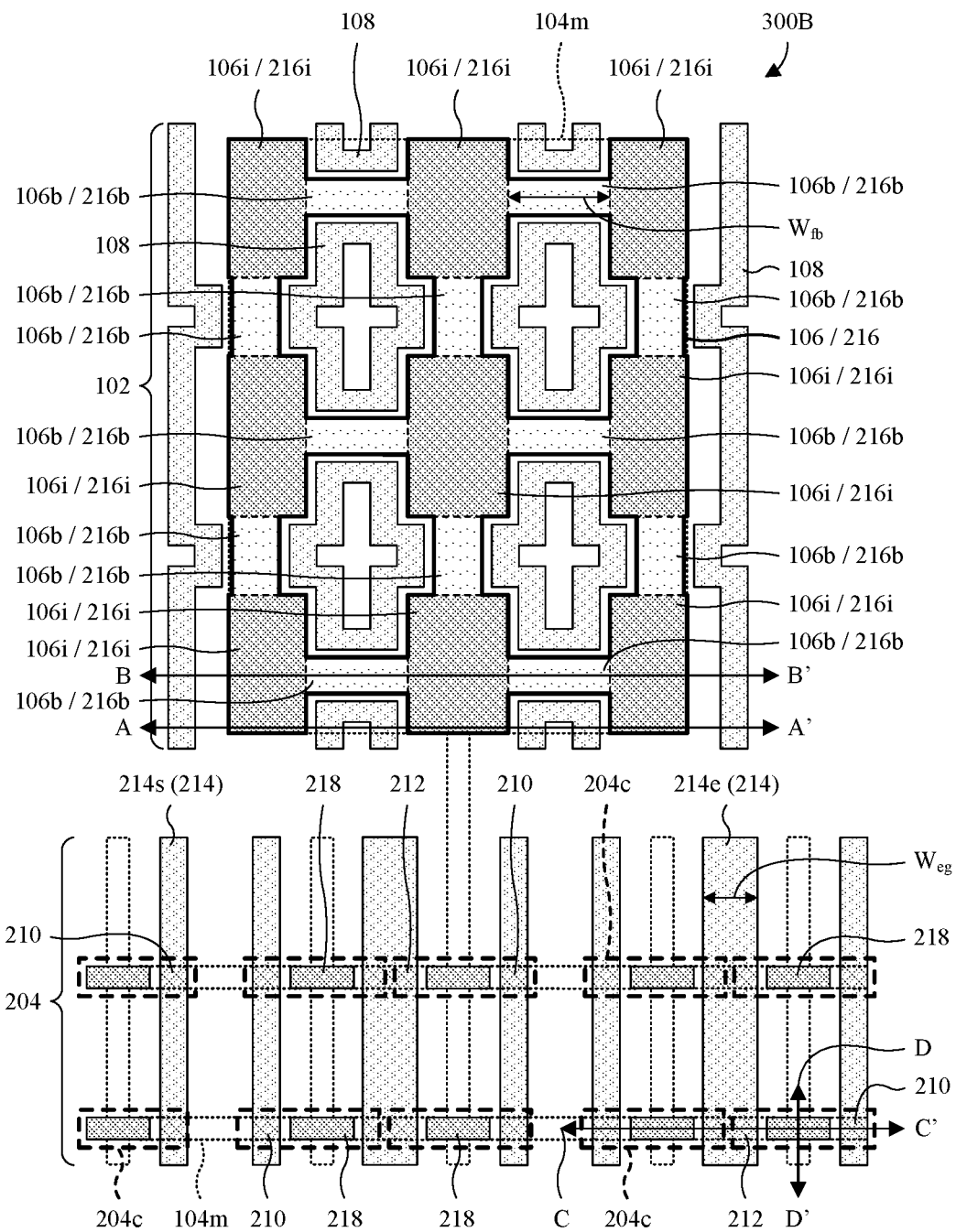

With reference to FIGS. 3A and 3B, various top layout views 300A, 300B of some more detailed embodiments of the IC of FIG. 1B is provided. The top layout views 300A, 300B of FIGS. 3A and 3B are variants respectively of FIGS. 2A and 2B in which the floating gate test device 102 employs the cell-like top layout of FIG. 1B. FIG. 3A illustrates a control gate layout of the IC, and FIG. 3B illustrates floating gate layout of the IC. The floating gate bridges 216b have a floating-gate-bridge width $W_{fb}$ (see FIG. 3B) and the memory erase gate electrodes 212 have an erase-gate width $W_{eg}$. In some embodiments, each of the floating gate bridges 216b individually has the floating-gate-bridge width $W_{fb}$, and/or each of the erase gate electrodes 212 individually has the erase-gate width $W_{eg}$. In some embodiments, the floating-gate-bridge width $W_{fb}$ is greater than or equal to the erase-gate width $W_{eg}$.

Figure 3C:
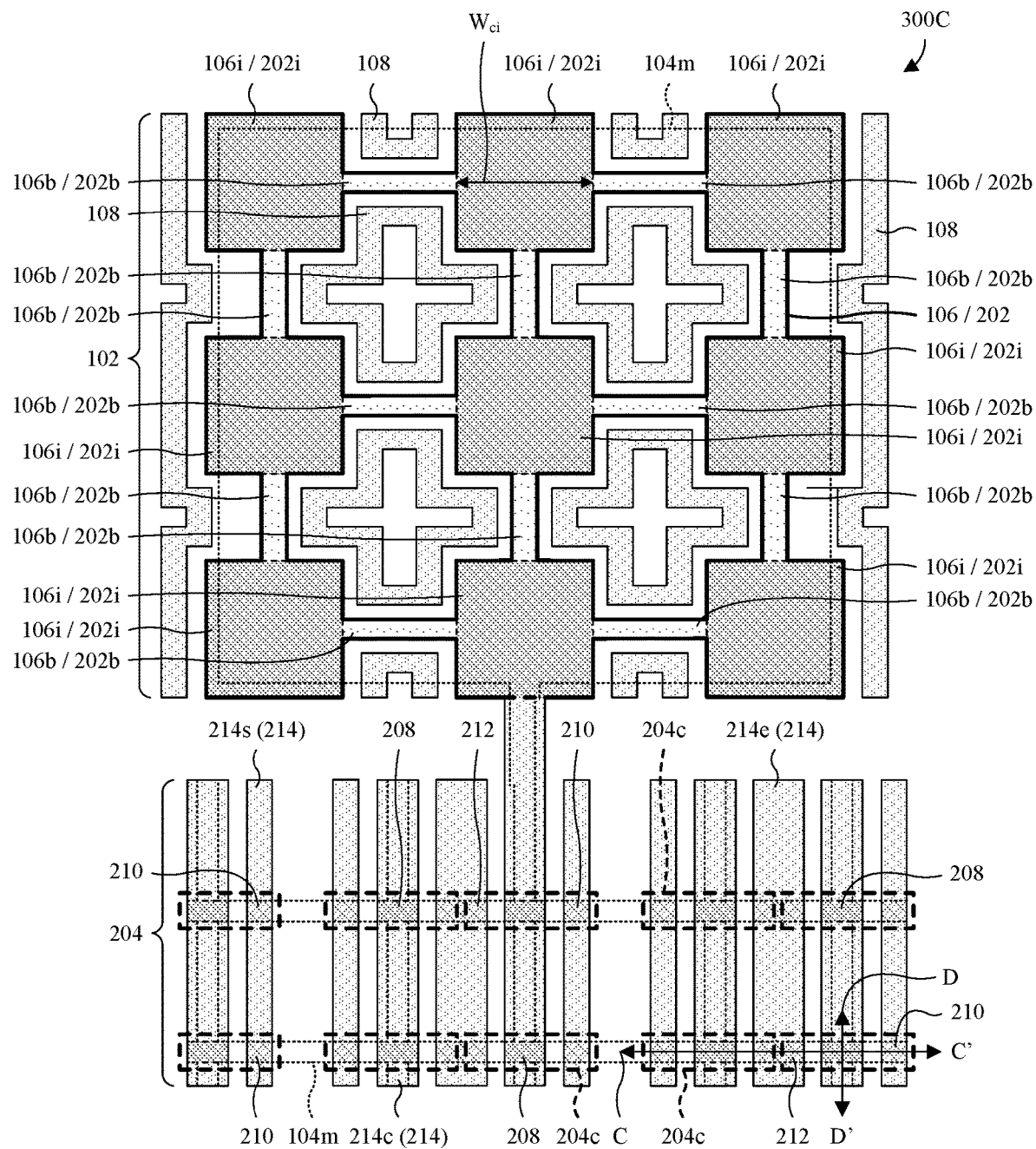
Figure 3D:
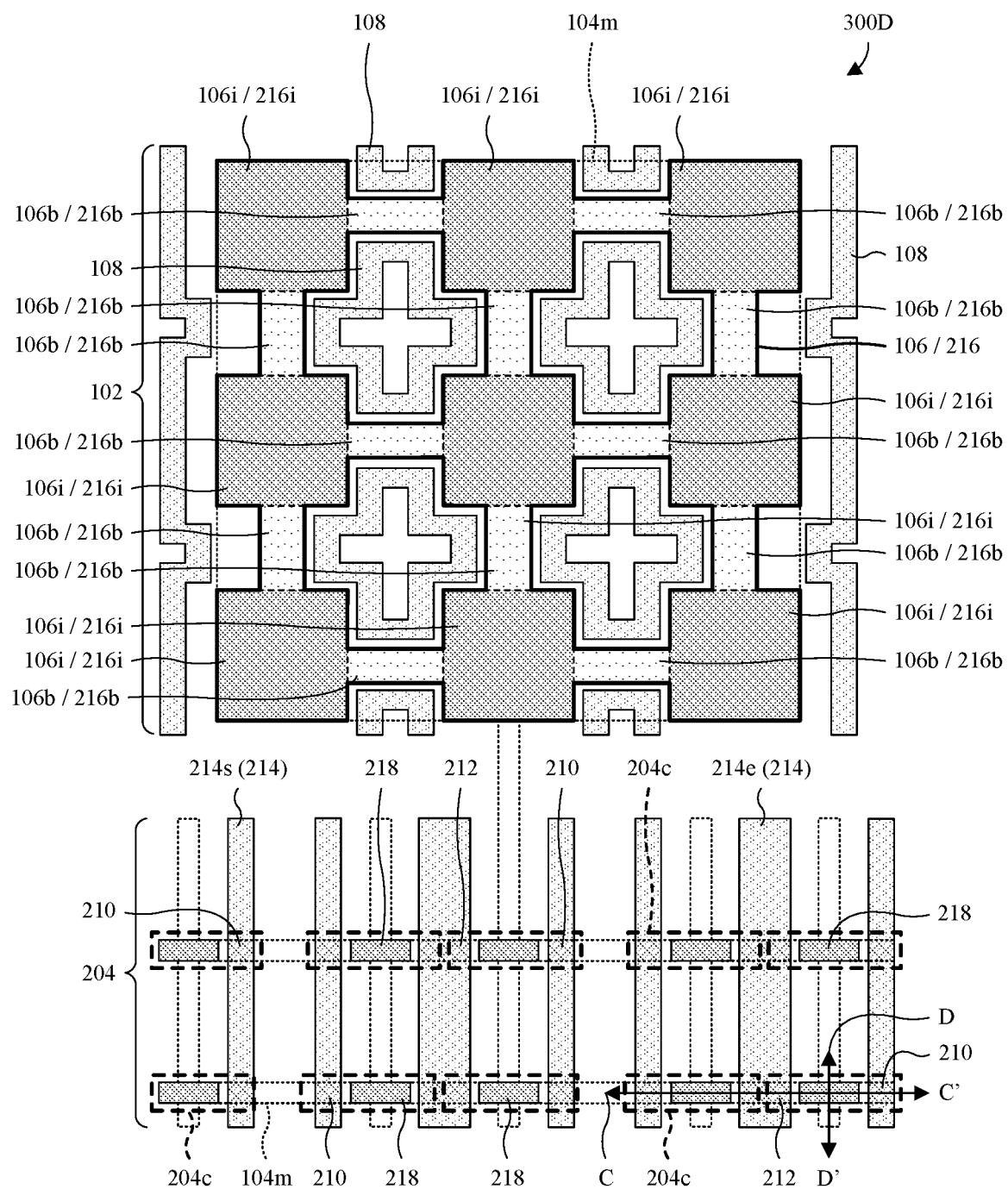

With reference to FIGS. 3C and 3D, top layout views 300C, 300D of some alternative embodiments respectively of the top layout views 300A, 300B of FIGS. 3A and 3B are provided in which the control gate islands 202i and the floating gate islands 216i are square shaped (e.g., all four sides are the same length or approximately the same length). Other shapes and/or sizes are, however, amenable in other embodiments.

Figure 3E:
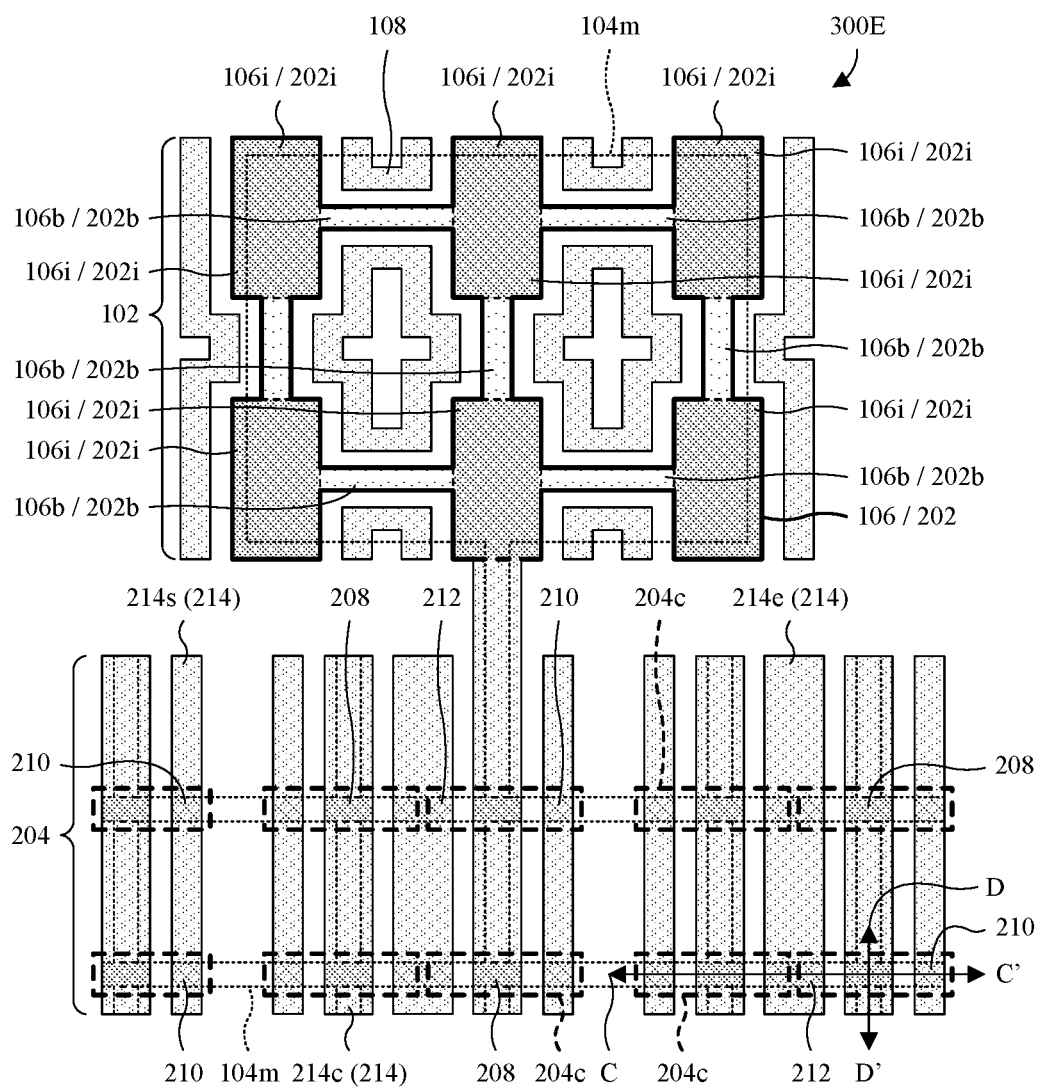
Figure 3F:
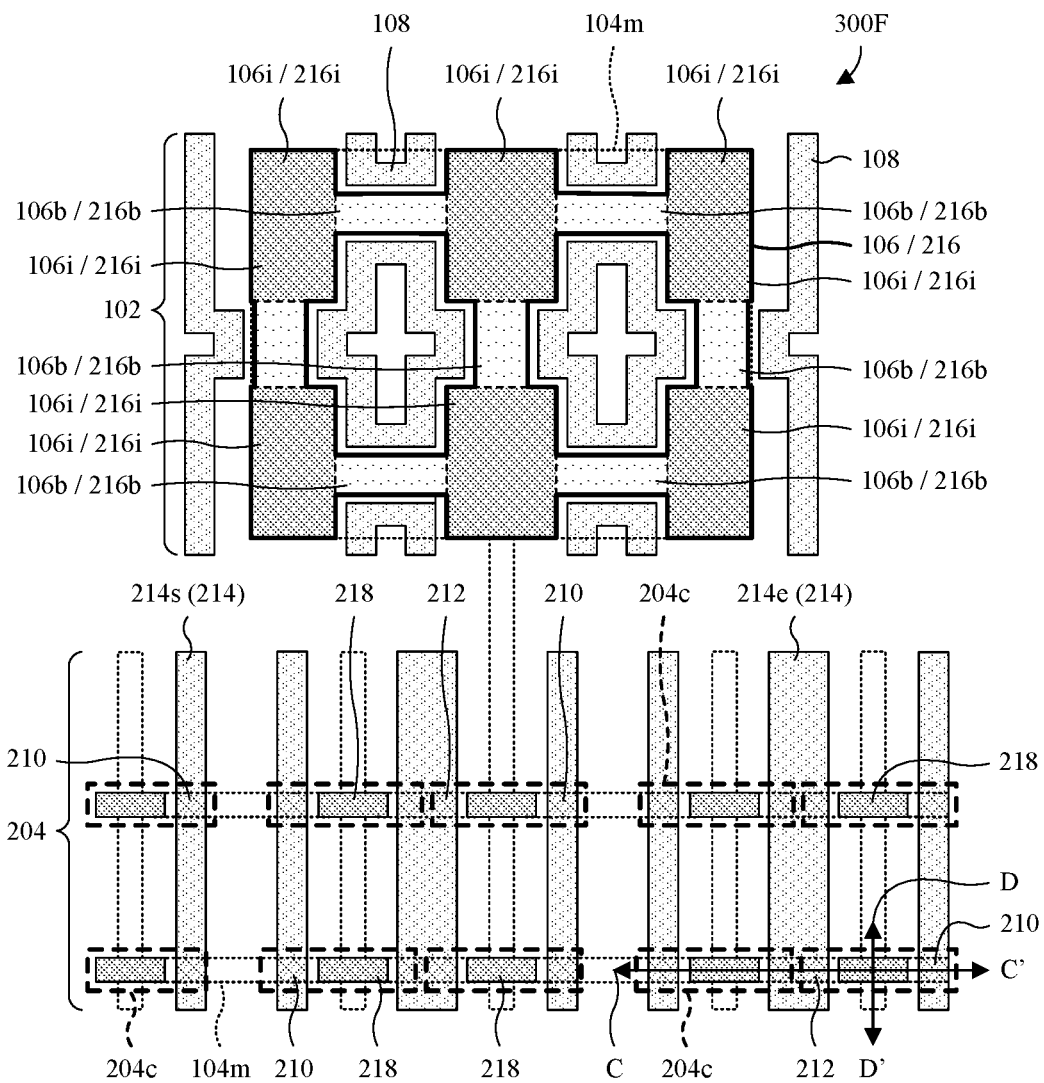

With reference to FIGS. 3E and 3F, top layout views 300E, 300F of some alternative embodiments respectively of the top layout views 300A, 300B of FIGS. 3A and 3B are provided in which there is one less row of islands 106i. In other embodiments, there may be more or less rows of islands 106i and/or more or less columns of islands 106i.

Figure 3G:
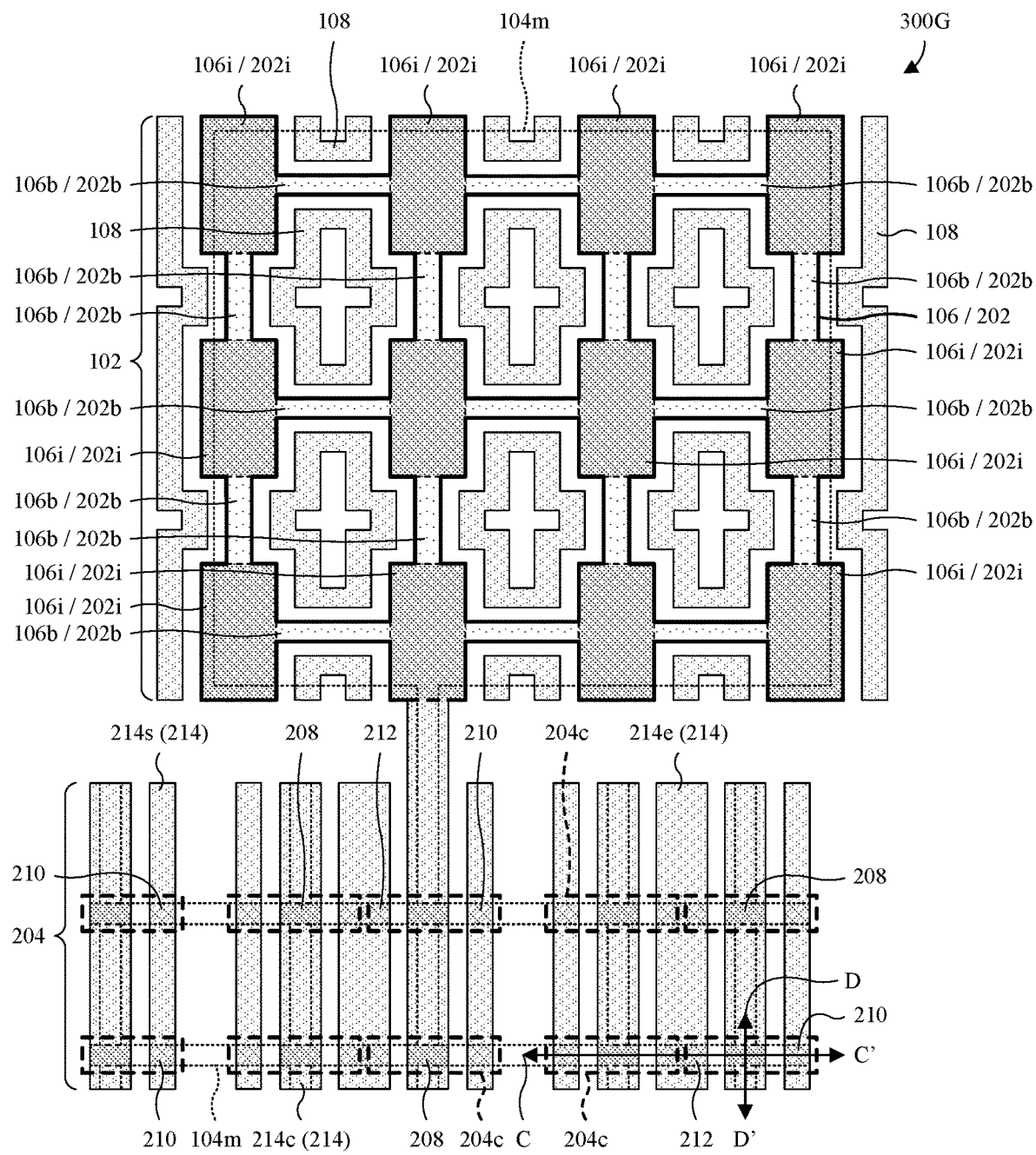
Figure 3H:
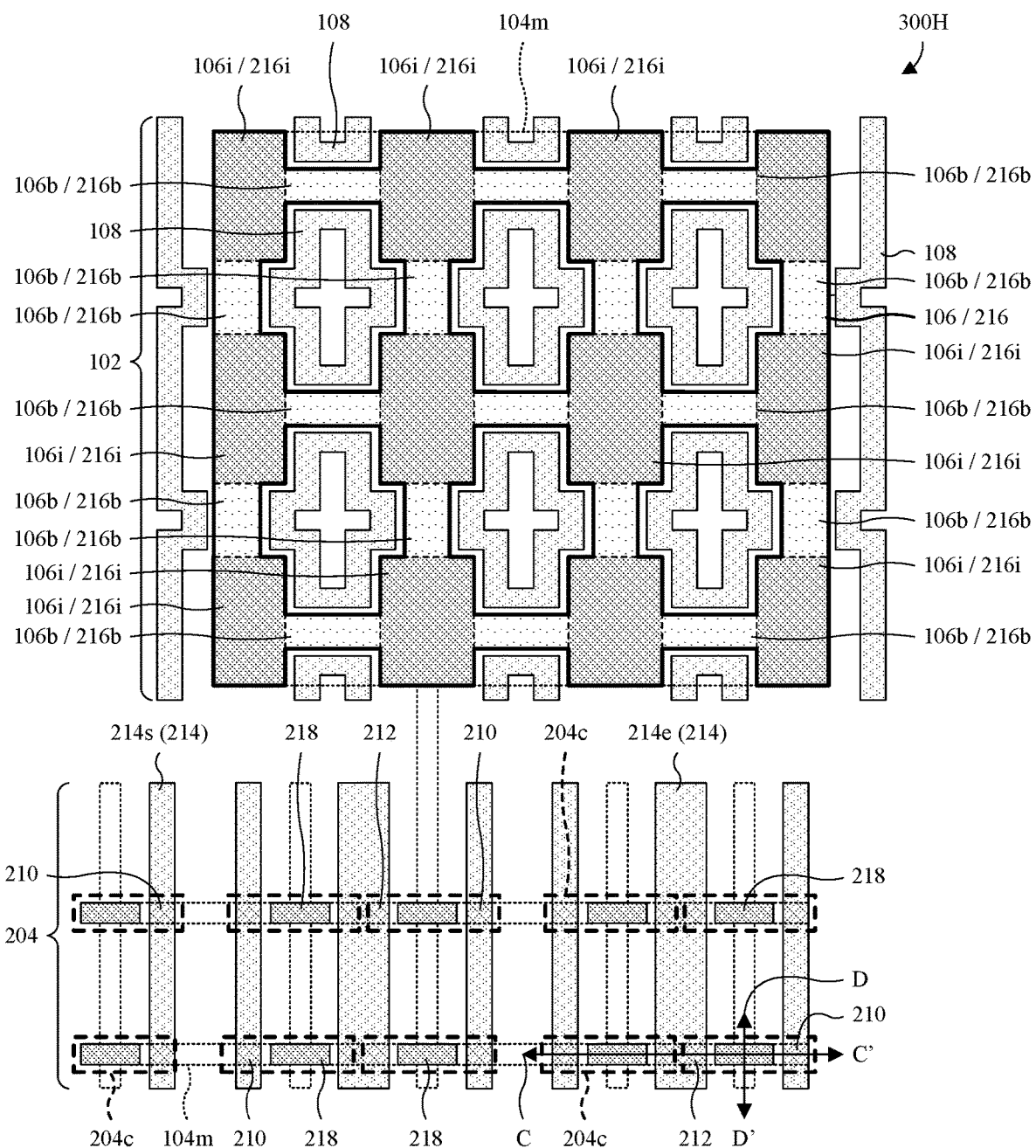

With reference to FIGS. 3G and 3H, top layout views 300G, 300H of some alternative embodiments respectively of the top layout views 300A, 300B of FIGS. 3A and 3B are provided in which an additional island 106i and an additional bridge 106b have been added to a single side of the gate stack 106. In other embodiments, more islands and more bridges may be added to the single side of the gate stack 106 and/or to other sides of the gate stack 106.

Figure 4A:
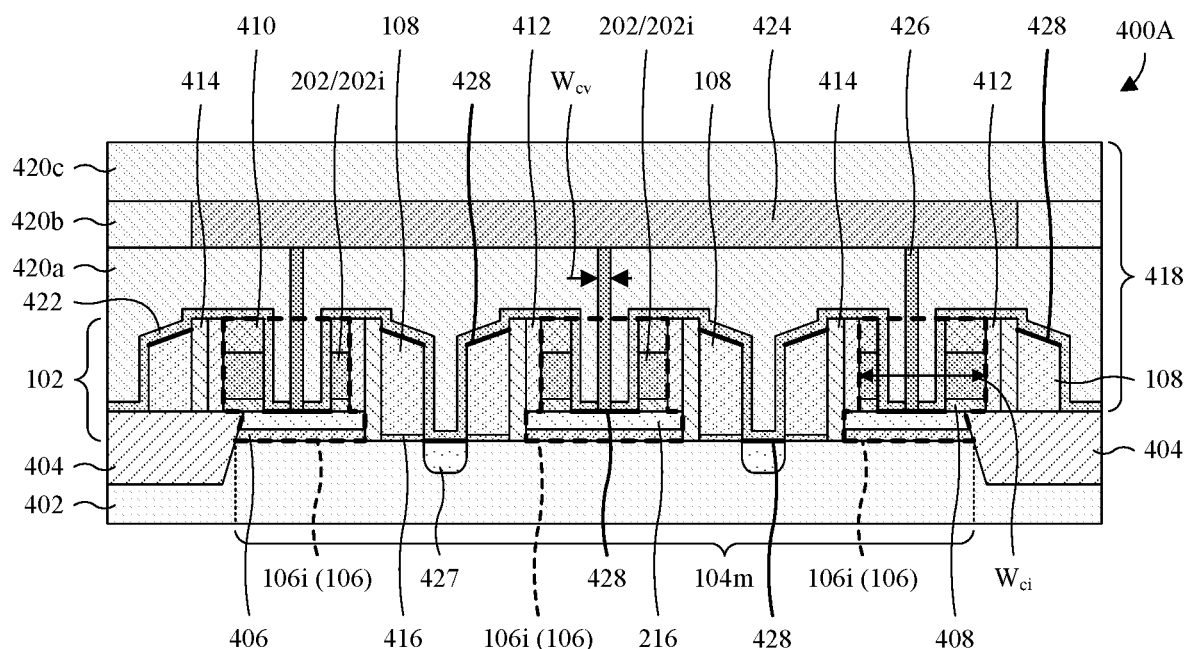
FIGS. 4A-4D illustrate various cross-sectional views of some embodiments of the IC of FIGS. 2A and 2B and/or the IC of FIGS. 3A and 3B.

With reference to FIG. 4A, a cross-sectional view 400A of some embodiments of the IC of FIGS. 2A and 2B and/or the IC of FIGS. 3A and 3B is provided. The cross-sectional view 400A may, for example, be taken along line A-A' in FIGS. 2A and 2B and/or along line A-A' in FIGS. 3A and 3B. Additionally, the cross-sectional view 400A may, for example, be taken along line A-A' in FIG. 1A and/or FIG. 1B.

As illustrated, a semiconductor substrate 402 includes the semiconductor memory region 104m, and an isolation structure 404 extends into a top surface of the semiconductor substrate 402 to demarcate a boundary of the semiconductor memory region 104m. The semiconductor substrate 402 may be or comprise, for example, a bulk silicon substrate, a silicon-on-insulator (SOI) substrate, or some other suitable semiconductor substrate(s). The isolation structure 404 electrically isolates the semiconductor memory region 104m from adjoining regions of the semiconductor substrate and may, for example, include a trench filled with dielectric material. In some embodiments, the isolation structure 404 is a shallow trench isolation (STI) region, a deep trench isolation (DTI) region, or some other suitable isolation structure(s).

The floating gate test device 102 overlies the semiconductor memory region 104m and comprises the gate stack 106. The gate stack 106 has a cell-like top layout and includes the plurality of islands 106i. Examples of the cell-like top layout are shown in, for example, FIGS. 1A and 1B. While the islands 106i are shown as being unconnected, the islands 106i may, for example, be connected out of the cross-sectional view 400A of FIG. 4A. The gate stack 106 is defined by a test-device floating gate dielectric layer 406, the test-device floating gate electrode 216, a test-device control gate dielectric layer 408, the test-device control gate electrode 202, and a test-device control gate hard mask 410 stacked upon one another.

The test-device floating gate electrode 216 overlies the test-device floating gate dielectric layer 406, the test-device control gate dielectric layer 408 overlies the test-device floating gate electrode 216, the test-device control gate electrode 202 overlies the test-device control gate dielectric layer 408, and the test-device control gate hard mask 410 overlies the test-device control gate electrode 202. The test-device floating gate electrode 216 and the test-device control gate electrode 202 may be or comprise, for example, metal, doped polysilicon, or some other suitable conducive material(s). The test-device floating gate dielectric layer 406, the test-device control gate dielectric layer 408, and the test-device control gate hard mask 410 may be or comprise, for example, silicon oxide, silicon nitride, some other suitable dielectric(s), or any combination of the foregoing. Further, the test-device floating gate dielectric layer 406, the test-device floating gate electrode 216, the test-device control gate dielectric layer 408, the test-device control gate electrode 202, and the test-device control gate hard mask 410 have cell-like top layouts. In some embodiments, the test-device floating gate dielectric layer 406 and the test-device floating gate electrode 216 have the same or substantially the same cell-like top layout. Examples of this cell-like top layout are shown in, for example, FIGS. 2B and 3B with respect to the test-device floating gate electrode 216. In some embodiments, the test-device control gate dielectric layer 408, the test-device control gate electrode 202, and the test-device control gate hard mask 410 have the same or substantially the same cell-like top layout. Examples of this cell-like top layout are shown in, for example, FIGS. 2A and 3A with respect to the test-device control gate electrode 202.

While the test-device floating gate dielectric layer 406, the test-device floating gate electrode 216, the test-device control gate dielectric layer 408, the test-device control gate electrode 202, and the test-device control gate hard mask 410 are each shown as having multiple segments corresponding to the islands 106i, the segments may, for example, be connected out of the cross-sectional view 400A of FIG. 4A. Further, for ease of illustration, only one segment has been labeled for each of the test-device floating gate dielectric layer 406, the test-device floating gate electrode 216, the test-device control gate dielectric layer 408, the test-device control gate electrode 202, and the test-device control gate hard mask 410.

A test-device control gate spacer 412 lines sidewalls of the test-device control gate electrode 202, sidewalls of the test-device control gate dielectric layer 408, and sidewalls of the test-device control gate hard mask 410, and comprises a plurality of control gate spacer segments corresponding to the sidewalls. For ease of illustration, only some of the control gate spacer segments are labeled 412. Further, the test-device control gate spacer 412 overlies the test-device floating gate electrode 216 and, in some embodiments, the isolation structure 404. The test-device control gate spacer 412 may be or comprise, for example, silicon oxide, silicon nitride, some other suitable dielectric(s), or any combination of the foregoing.

A test-device floating gate spacer 414 lines sidewalls of the test-device floating gate electrode 216, sidewalls of the test-device floating gate dielectric layer 406, and sidewalls of the test-device control gate spacer 412, and comprises a plurality of floating gate spacer segments corresponding to the sidewalls. For ease of illustration, only some of the floating gate spacers are labeled 414. Further, the test-device floating gate spacer 414 overlies the semiconductor memory region 104m and, in some embodiments, the isolation structure 404. The test-device floating gate spacer 414 may be or comprise, for example, silicon oxide, silicon nitride, some other suitable dielectric(s), or any combination of the foregoing.

A plurality of test-device select gate electrodes 108 border sidewalls of the gate stack 106, and a plurality of test-device select gate dielectric layers 416 space the test-device select gate electrodes 108 from the semiconductor memory region 104m. For ease of illustration, only some of the test-device select gate electrodes 108 are labeled 108, and only one of the test-device select gate dielectric layers 416 is labeled 416. The test-device select gate electrodes 108 may be or comprise, for example, metal, doped polysilicon, or some other suitable conductive material(s). The test-device select gate dielectric layers 416 may be or comprise, for example, silicon oxide, some other suitable dielectric material(s), or any combination of the foregoing.

A BEOL interconnect structure 418 covers the floating gate test device 102 and comprises a plurality of interconnect dielectric layers covering the floating gate test device 102. The interconnect dielectric layers comprise a pre-wire dielectric layer 420a, a first ILD layer 420b overlying the pre-wire dielectric layer 420a, and a second ILD layer 420c overlying the first ILD layer 420b. The pre-wire dielectric layer 420a and the first and second ILD layers 420b, 420c may be or comprise, for example, silicon oxide, silicon nitride, silicon oxynitride, a low κ dielectric, some other suitable dielectric(s), or any combination of the foregoing. As used herein, a low κ dielectric is a dielectric with a dielectric constant κ less than about 3.9, 3, 2, or 1. In some embodiments, a contact etch stop layer 422 covers and conforms to the floating gate test device 102, between the floating gate test device 102 and the pre-wire dielectric layer 420a. The contact etch stop layer 422 may be or comprise, for example, silicon nitride, silicon carbide, some other suitable dielectric(s), or any combination of the foregoing.

The BEOL interconnect structure 418 further comprises a wire 424 and a plurality of contact vias 426. For ease of illustration, only some of the contact vias 426 are labeled 426. The wire 424 covers and contacts the contact vias 426, and further overlies the floating gate test device 102. Further, the wire 424 is recessed into a top of the first ILD layer 420b and is covered by the second ILD layer 420c. The contact vias 426 respectively overlie the islands 106i of the gate stack 106. Further, the contact vias 426 extend from a top surface of the pre-wire dielectric layer 420a, through the pre-wire dielectric layer 420a and the test-device control gate electrode 202, to contact with a top surface of the test-device floating gate electrode 216. Note that the openings in the islands 106i through which the contact vias 426 extend to the test-device floating gate electrode 216 are not shown in FIGS. 2A-2F and 3A-3H for ease of illustration. In some embodiments, the contact vias 426 are electrically insulated from the test-device control gate electrode 202 by dielectric liners (not shown) separating the contact vias 426 from sidewalls of the test-device control gate electrode 202. The wire 424 and the contact vias 426 may be or comprise, for example, copper, aluminum, aluminum copper, tungsten, some other suitable conductor(s), or any combination of the foregoing.

The contact vias 426 have a contact-via width $W_{cv}$ and the control gate islands 202i have a control-gate-island width $W_{ci}$. In some embodiments, each of the contact vias 426 individually has the contact-via width $W_{cv}$, and/or each of the control gate islands 202i individually has the control-gate-island width $W_{ci}$. In some embodiments, the control-gate-island width $W_{ci}$ is three or more times greater than the contact-via width $W_{cv}$. Such embodiments may arise when top layouts of the control gate islands 202i are square shaped, examples of which are shown in FIGS. 2C and 3C. If the control-gate-island width $W_{ci}$ is less than three times greater than the contact-via width $W_{cv}$, the reliability of the floating gate test device 102 is low and bulk manufacturing yields are low.

In some embodiments, a plurality of test-device source/drain regions 427 are in the semiconductor substrate 402, and each of the test-device source/drain regions 427 is formed between two opposing gate electrodes of the test-device select gate electrodes 108. In other embodiments, the test-device source/drain regions 427 are omitted. In some embodiments, the BEOL interconnect structure 418 defines a conductive path (not shown) electrically coupling the test-device source/drain regions 427 to the test-device floating gate electrode 216. The test-device source/drain regions 427 may, for example, be n-type or p-type.

In some embodiments, a plurality of silicide pads 428 are on a top surface of the test-device floating gate electrode 216, a top surface of the test-device source/drain regions 427, top surfaces of the test-device select gate electrodes 108, a top surface of some other structure, or any combination of the foregoing. For ease of illustration, only some of the silicide pads 428 are labeled 428. The silicide pads 428 may be or comprise, for example, nickel silicide or some other suitable silicide(s).

Figure 4B:
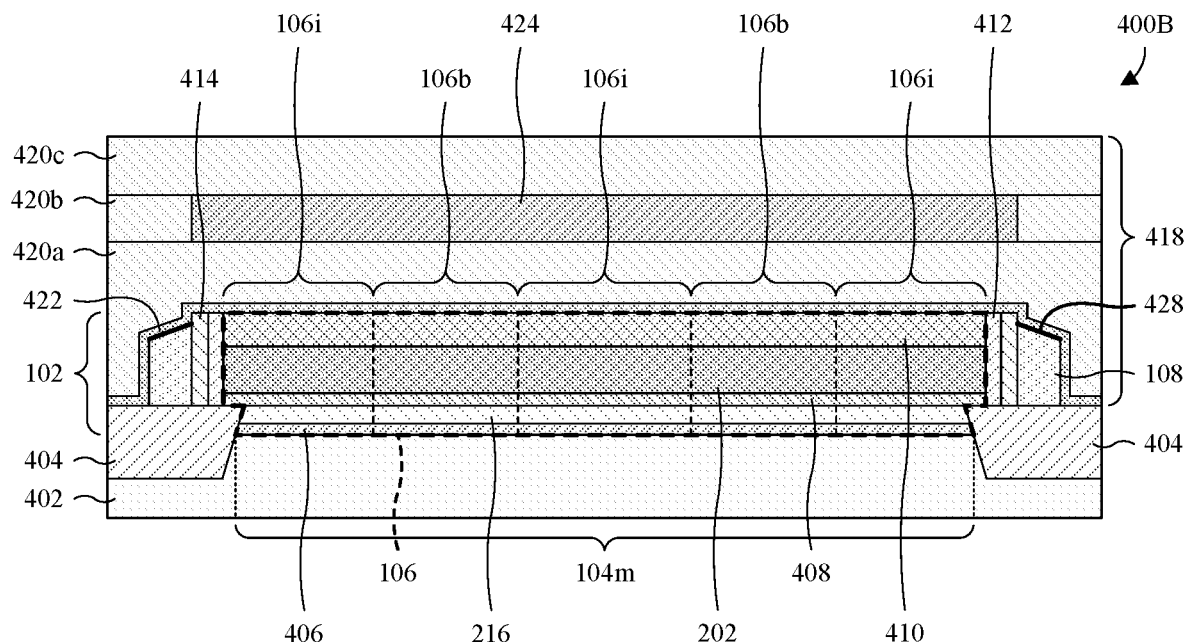

With reference to FIG. 4B, another cross-sectional view 400B of some embodiments of the IC of FIGS. 2A and 2B and/or the IC of FIGS. 3A and 3B is provided. The cross-sectional view 400B of FIG. 4B may, for example, be taken along line B-B' in FIGS. 2A and 2B and/or along line B-B' in FIGS. 3A and 3B. Additionally, the cross-sectional view 400B may, for example, be taken along line B-B' in FIG. 1A and/or FIG. 1B.

As illustrated, the gate stack 106 further comprises the plurality of bridges 106b interconnecting the islands 106i. The bridges 106b comprise a bridge for each pair of neighboring islands, and the bridge extends from direct contact with a first island of the pair to a second island of the pair. While the islands 106i and the bridges 106b have similar layouts in the cross-sectional view 400B, it is to be appreciated that the islands 106i and the bridges 106b have different top layouts. See, for example, FIGS. 1A and 1B.

Figure 4C:
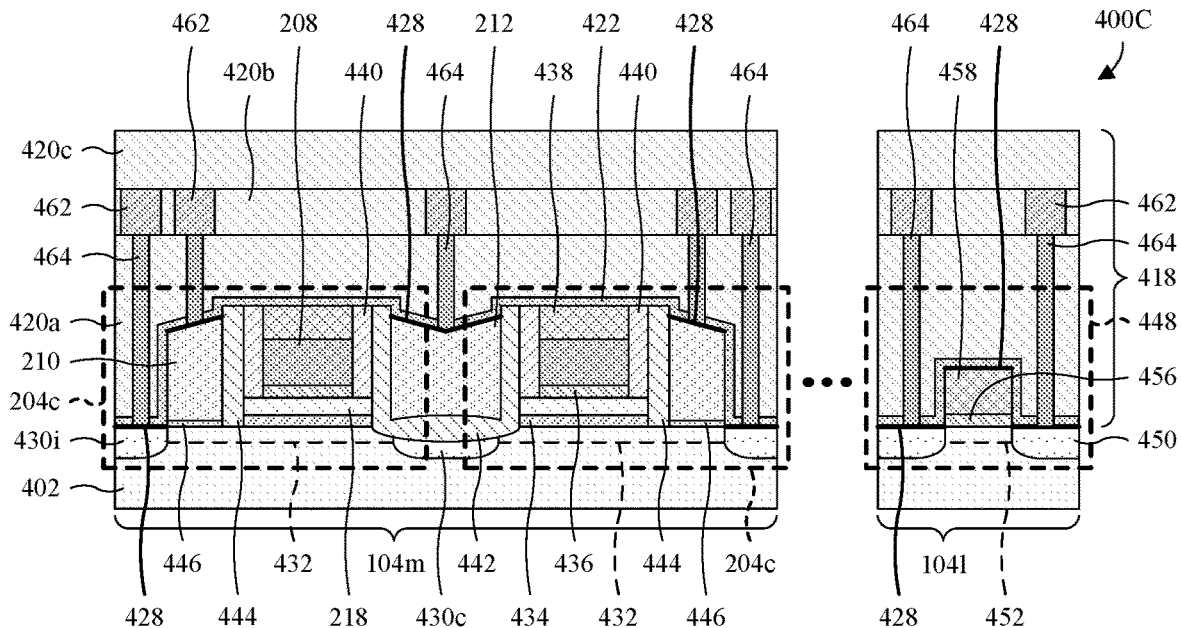

With reference to FIG. 4C, another cross-sectional view 400C of some embodiments of the IC of FIGS. 2A and 2C and/or the IC of FIGS. 3A and 3B is provided. The cross-sectional view 400C of FIG. 4C may, for example, be taken along line C-C' in FIGS. 2A and 2B and/or along line C-C' in FIGS. 3A and 3B.

As illustrated, a pair of memory cells 204c rests on the semiconductor memory region 104m. The memory cells 204c comprise a pair of individual memory source/drain regions 430i and a common memory source/drain region 430c. For ease of illustration, only one of the individual memory source/drain regions 430i is labeled 430i. The individual memory source/drain regions 430i and the common memory source/drain region 430c are in the semiconductor substrate 402, along a top surface of the semiconductor substrate 402. Further, the individual memory source/drain regions 430i are spaced from the common memory source/drain region 430c and are respectively on opposite sides of the common memory source/drain region 430c.

A pair of selectively-conductive memory channels 432 is in the semiconductor substrate 402. The selectively-conductive memory channels 432 extend along the top surface of the semiconductor substrate 402, from the common memory source/drain region 430c respectively to the individual memory source/drain regions 430i. Further, the selectively-conductive memory channels 432 have an opposite doping type as the common memory source/drain region 430c and the individual memory source/drain regions 430*i*. For example, the selectively-conductive memory channels 432 may be p-type, whereas the common memory source/drain region 430*c* and the individual memory source/drain regions 430*i* may be n-type, or vice versa.

A pair of memory floating gate dielectric layers 434, a pair of memory floating gate electrodes 218, a pair of memory control gate dielectric layers 436, a pair of memory control gate electrodes 208, and a pair of memory control gate hard masks 438 are stacked on the selectively-conductive memory channels 432. The memory floating gate dielectric layers 434 respectively overlie the selectively-conductive memory channels 432 and may be or comprise, for example, silicon oxide, some other suitable dielectric(s), or any combination of the foregoing. The memory floating gate electrodes 218 respectively overlie the memory floating gate dielectric layers 434 and may be or comprise, for example, metal, doped polysilicon, or some other suitable conductor(s). The memory control gate dielectric layers 436 respectively overlie the memory floating gate electrodes 218 and may be or comprise, for example, silicon dioxide, silicon nitride, some other suitable dielectric(s), or any combination of the foregoing. The memory control gate electrodes 208 respectively overlie the memory control gate dielectric layers 436 and may be or comprise, for example, memory, doped polysilicon, or some other suitable conductive(s). The memory control gate hard masks 438 respectively overlie the memory control gate electrodes 208 and may be or comprise, for example, silicon nitride, silicon oxide, some other suitable dielectric(s), or any combination of the foregoing.

A memory control gate spacer 440 overlies the memory floating gate electrodes 218, and comprises multiple control gate spacer segments respectively lining sidewalls of the memory control gate electrodes 208, sidewalls of the memory control gate dielectric layers 436, and sidewalls of the memory control gate hard masks 438. For ease of illustration, only some of the control gate spacer segments are labeled 440. The memory control gate spacer 440 may be or comprise, for example, silicon oxide, silicon nitride, some other suitable dielectric(s), or any combination of the foregoing.

A memory erase gate electrode 212 overlies the common memory source/drain region 430*c*, between the memory control gate electrodes 208. Further, the memory erase gate electrode 212 is electrically insulated from the memory floating gate electrodes 218 and the common memory source/drain region 430*c* by a memory erase gate dielectric layer 442. The memory erase gate dielectric layer 442 cups an underside of the memory erase gate electrode 212, such that the memory erase gate dielectric layer 442 lines a bottom surface of the memory erase gate electrode 212 and sidewalls of the memory erase gate electrode 212. The memory erase gate electrode 212 may be or comprise, for example, metal, doped polysilicon, or some other suitable conductive material(s). The memory erase gate dielectric layer 442 may be or comprise, for example, silicon oxide, some other suitable dielectric(s), or any combination of the foregoing.

A pair of memory select gate electrodes 210 is on the selectively-conductive memory channels 432. For ease of illustration, only one of the memory select gate electrodes 210 is labeled 210. The memory select gate electrodes 210 respectively overlie the selectively-conductive memory channels 432, and respectively border the individual memory source/drain regions 430*i*. Further, the memory select gate electrodes 210 are laterally spaced from the common memory source/drain region 430*c* by the memory floating gate electrodes 218, and are laterally spaced from the memory floating gate electrodes 218 by a memory floating gate spacer 444. The memory floating gate spacer 444 comprises multiple floating gate spacer segments respectively lining sidewalls of the memory control gate spacer 440, sidewalls of the memory floating gate electrodes 218, and sidewalls of the memory floating gate dielectric layers 434. Further, the memory select gate electrodes 210 are vertically spaced from the selectively-conductive memory channels 432 by a pair of memory select gate dielectric layers 446. The memory select gate electrodes 210 may be or comprise, for example, metal, doped polysilicon, or some other suitable conductor(s). The memory floating gate spacer 444 may be or comprise, for example, silicon oxide, silicon nitride, some other suitable dielectric(s), or any combination of the foregoing. The memory select gate dielectric layers 446 may be or comprise, for example, silicon oxide, some other suitable dielectric(s), or any combination of the foregoing.

A logic device 448 rests on a semiconductor logic region 104*l* of the semiconductor substrate 402, and may be, for example, a static random-access memory (SRAM) device, a core logic device, an input/output (I/O) device, or some other suitable logic device(s). While the semiconductor logic region 104*l* is shown as being adjacent to the semiconductor memory region 104*m*, this is merely for illustrative purposes. The semiconductor logic region 104*l* may or may not be adjacent to the semiconductor memory region 104*m*. Further, note that the logic device 448 is not shown in the top layout views 200A, 200B of FIGS. 2A and 2B and the top layout views 300A, 300B of FIGS. 3A and 3B for ease of illustration and because the top layout of the logic device 448 is beyond the scope or the present application.

In some embodiments, the logic device 448 comprises a pair of logic source/drain regions 450 and a selectively-conductive logic channel 452. For ease of illustration, only one of the logic source/drain regions 450 is labeled 450. The logic source/drain regions 450 and the selectively-conductive logic channel 452 are in the semiconductor substrate 402, along a top surface of the semiconductor substrate 402. The logic source/drain regions 450 are laterally spaced, and the selectively-conductive logic channel 452 extends from one of the logic source/drain regions 450 to another one of the logic source/drain regions 450. Further, the selectively-conductive logic channel 452 has an opposite doping type as the logic source/drain regions 450. For example, the selectively-conductive logic channels 452 may be p-type, whereas the logic source/drain regions 450 may be n-type, or vice versa.

A logic gate dielectric layer 456 and a logic gate electrode 458 are stacked on the selectively-conductive logic channel 452. The logic gate dielectric layer 456 overlies the selectively-conductive logic channel 452. The logic gate dielectric layers 456 may be or comprise, for example, silicon oxide, a high κ dielectric, some other suitable dielectric(s), or any combination of the foregoing. As used herein, a high κ dielectric is a dielectric with a dielectric constant κ greater than about 3.9, 5, 10, 15, or 20. The logic gate electrode 458 overlies the logic gate dielectric layer 456, and may be or comprise, for example, metal, doped polysilicon, or some other suitable conductor(s).

The BEOL interconnect structure 418 covers the memory cells 204*c* and the logic device 448 and comprises the pre-wire dielectric layer 420*a* and the first and second ILD layers 420*b*, 420*c*. In some embodiments, the contact etch stop layer 422 covers and conforms to the memory cells 204c and the logic device 448 to separate the pre-wire dielectric layer 420a from the memory cells 204c and the logic device 448. Further, the BEOL interconnect structure 418 comprises a plurality of additional wires 462 and a plurality of additional contact vias 464. For ease of illustration, only some of the additional wires 462 are labeled 462, and only some of the additional contact vias 464 are labeled 464.

The additional contact vias 464 extend from a top surface of the pre-wire dielectric layer 420a, through the pre-wire dielectric layer 420a, respectively to the individual memory source/drain regions 430i, the memory select gate electrodes 210, the memory erase gate electrode 212, the logic source/drain regions 450, or any combination of the foregoing. The additional wires 462 overlie the pre-wire dielectric layer 420a and are covered by the second ILD layer 420c. Further, the additional wires 462 are recessed into a top of the first ILD layer 420b, and respectively overlie and contact the additional contact vias 464. In some embodiments, the additional wires 462 directly contact the additional contact vias 464. The additional wires 462 and the additional contact vias 464 may be or comprise, for example, copper, aluminum copper, aluminum, tungsten, some other suitable conductor(s), or any combination of the foregoing.

In some embodiments, the silicide pads 428 are also on top surfaces of the memory select gate electrodes 210, a top surface of the memory erase gate electrode 212, a top surface of the individual memory source/drain regions 430i, top surfaces of the logic source/drain regions 450, a top surface of the logic gate electrode 458, or any combination of the foregoing. For ease of illustration, only some of the silicide pads 428 are labeled 428. In some embodiments, a logic gate hard mask (not shown) overlies the logic gate electrode 458, whereby a top surface of the logic gate electrode 458 is free of silicide.

Figure 4D:
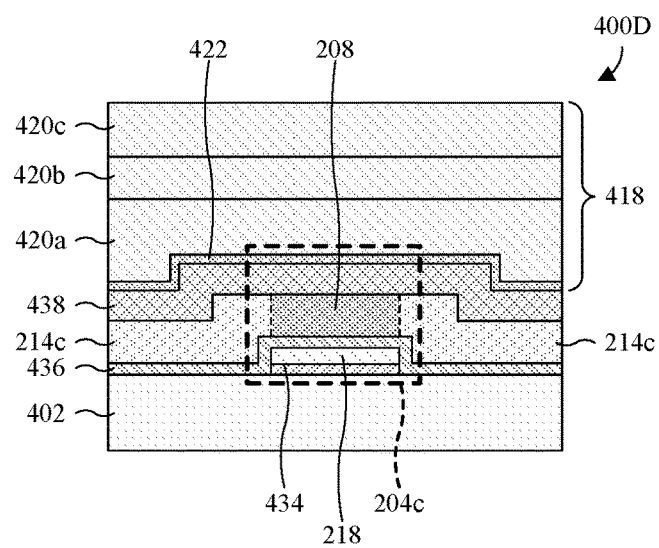

With reference to FIG. 4D, another cross-sectional view 400D of some embodiments of the IC of FIGS. 2A and 2C and/or the IC of FIGS. 3A and 3B is provided. The cross-sectional view 400D of FIG. 4D may, for example, be taken along line D-D' in FIGS. 2A and 2B and/or along line D-D' in FIGS. 3A and 3B.

As illustrated, a control gate inter-device line 214c is integrated and continuous with a memory control gate electrode 208. Further, the control gate inter-device line 214c conforms to a memory floating gate electrode 218 that underlies the memory control gate electrode 208. In some embodiments, the control gate inter-device line 214c and the memory control gate electrode 208 collectively have an inverted U-shaped profile covering and straddling the memory floating gate electrode 218. Note that the hashing is varied along the control gate inter-device lines 214c merely to emphasize the memory control gate electrode 208. The varied hashing should not be construed as limiting the composition of the control gate inter-device line 214c and the memory control gate electrodes 208.

The control gate inter-device line 214c and the memory control gate electrode 208 are electrically insulated from the semiconductor substrate 402 and the memory floating gate electrode 218 by a memory control gate dielectric layer 436. Further, control gate inter-device line 214c and the memory control gate electrode 208 are covered and protected by a memory control gate hard mask 438. The memory control gate dielectric layer 436 and the memory control gate hard mask 438 are laterally elongated in a common direction and may, for example, have a line-shaped top layout or some other suitable top layout(s).

While FIG. 4C illustrates a single pair of neighboring memory cells 204c taken along, for example, line C-C' in FIGS. 2A and 2B and/or along line C-C' in FIGS. 3A and 3B, it is to be appreciated that FIG. 4C may, for example, be representative of each other pair of neighboring memory cells in FIGS. 2A and 2B and/or FIGS. 3A and 3B. Further, while FIG. 4D illustrates a single memory cells 204c taken along, for example, line D-D' in FIGS. 2A and 2B and/or along line D-D' in FIGS. 3A and 3B, it is to be appreciated that FIG. 4D may, for example, be representative of each other memory cell in FIGS. 2A and 2B and/or FIGS. 3A and 3B.

In operation of the IC, each of the memory cells 204c stores a variable amount of charge in a corresponding floating gate electrode of the memory floating gate electrodes 218. When the corresponding floating gate electrode stores a low amount of charge, the corresponding floating gate electrode stores a first data state (e.g., a binary "1"). When the corresponding floating gate electrode stores a high amount of charge, the corresponding floating gate electrode stores a second data state (e.g., a binary "0").

The variable amount of charge screens an electric field produced by a corresponding control gate electrode of the memory control gate electrodes 208 across a corresponding selectively-conductive channel of the selectively-conductive memory channels 432. This changes a threshold voltage of the corresponding control gate electrode between a low value and a high value. Therefore, the variable amount of charge can be read by biasing a corresponding select gate electrode of the memory select gate electrodes 210 with a voltage exceeding a threshold voltage of the corresponding select gate electrode, by further biasing the corresponding control gate electrode with a voltage between the low and high values, and by measuring a resistance of the corresponding selectively-conductive channel. Depending upon whether the corresponding selectively-conductive channel is in a high resistance state or a low resistance state, the memory cell is in the first data state or the second data state.

To change the variable amount of charge, program and erase operations are performed. Carriers (e.g., electrons) are added to the corresponding floating gate electrode during program operations, and carriers are removed from the corresponding floating gate electrode during erase operations. The program and erase operations may, for example, be performed by Fowler-Nordheim tunneling (FNT), hot carrier injection, or by some other suitable process(es) for moving charge into and/or out of the corresponding floating gate electrode. In some embodiments, the program operations are performed by hot carrier injection, and the erase operations are performed by FNT.

During program operations, carriers tunnel through a corresponding floating gate dielectric layer of the memory floating gate dielectric layers 434 to the corresponding floating gate electrode. This wears out the corresponding floating gate dielectric layer over time and causes the memory cell to eventually fail. Therefore, the quality of the corresponding floating gate dielectric layer is important to the lifespan of the memory cell, and testing of the corresponding floating gate dielectric layer is important for quality control.

The floating gate test device 102 (see, e.g., FIGS. 4A and 4B) may, for example, be used to measure the quality of the memory floating gate dielectric layers 434 and, hence, to estimate the lifespan of the memory cells 204c. Namely, the floating gate test device 102 is configured to measure the quality of the test-device floating gate dielectric layer 406 (see, e.g., FIGS. 4A and 4B). Further, as seen hereafter, the test-device floating gate dielectric layer 406 and the memory floating gate dielectric layers 434 are formed together by a common deposition process, whereby the test-device floating gate dielectric layer 406 has the same or substantially the same quality as the memory floating gate dielectric layers 434. Accordingly, by measuring the quality of the test-device floating gate dielectric layer 406 using the floating gate test device 102, the floating gate test device 102 also measures the quality of the memory floating gate dielectric layers 434. This may, in turn, be used to estimate the lifespan the of the memory cells 204c and to ensure that the memory cells 204c meet design specifications.

In some embodiments, the floating gate test device 102 may be used to determine the breakdown voltage of the test-device floating gate dielectric layer 406. For example, a voltage from the test-device floating gate electrode 216 to the semiconductor memory region 104m may be progressively increased until breakdown. Since the breakdown voltage is representative of the quality of the test-device floating gate dielectric layer 406, the breakdown voltage may then be used to estimate the life span of the memory cells 204c.

While FIGS. 4A-4D are described with respect to FIGS. 2A, 2B, 3A, and 3B, it is to be understood that FIGS. 4A-4D are also applicable to FIGS. 2C-2F and FIGS. 3C-3H. As such, the cross-sectional views 400A-400D of FIGS. 4A-4D may be, and/or may be representative of, cross sections for the ICs in FIGS. 2C-2F and FIGS. 3C-3H.

With reference to FIGS. 5A and 5B through FIGS. 27A and 27B, a series of cross-sectional views 500A, 500B through 2700A, 2700B of some embodiments of a method for forming an IC comprising a floating gate test device with a cell-like top layout is provided. Figures with a suffix of "A" are taken along line A-A' in FIG. 1A, 1B, 2A, 2B, 3A, 3B, or any combination of the foregoing, and/or may, for example, correspond to FIG. 4A. Figures with a suffix of "B" are taken along line C-C' in FIG. 2A, 2B, 3A, 3B, or any combination of the foregoing, and/or may, for example, correspond to FIG. 4C.

Figure 5A:
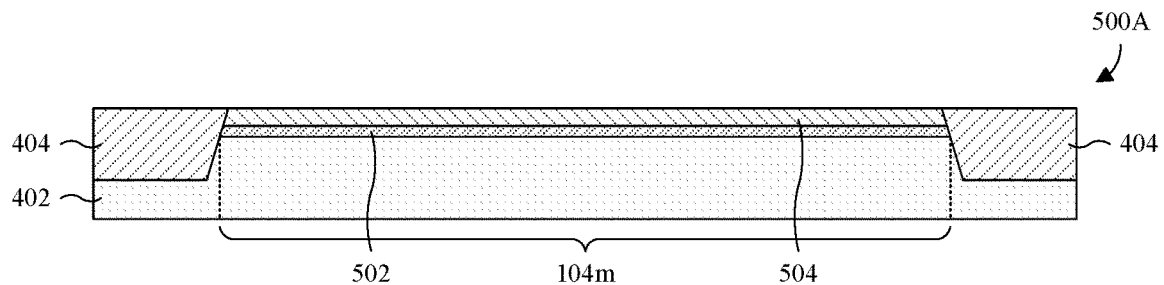
Figure 5B:
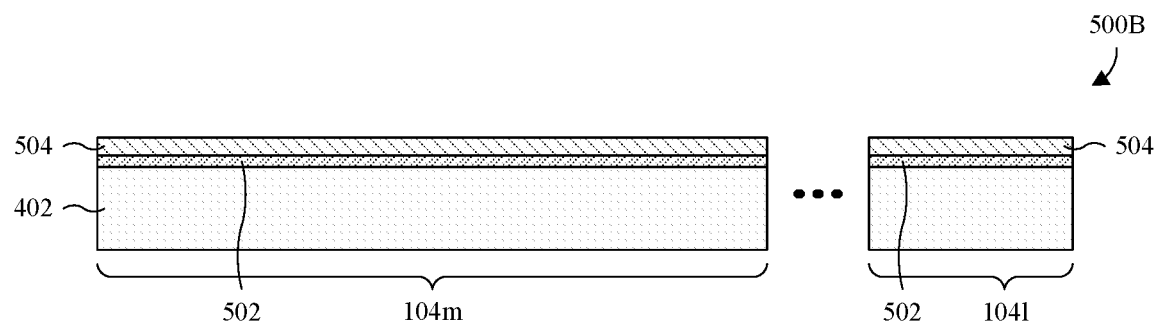

As illustrated by the cross-sectional views 500A, 500B of FIGS. 5A and 5B, an isolation structure 404 is formed in a top surface of a semiconductor substrate 402. The isolation structure 404 separate a semiconductor memory region 104m of the semiconductor substrate 402 and a semiconductor logic region 104l of the semiconductor substrate 402, and further demarcate a boundary of the semiconductor memory region 104m and a boundary the semiconductor logic region 104l. The boundary of the semiconductor memory region 104m may, for example, be as shown in FIG. 2A or 3A. Note that the boundary of the semiconductor logic region 104l is demarcated out of the cross-sectional views 500A, 500B of FIGS. 5A and 5B. The semiconductor substrate 402 may be or comprise, for example, a bulk silicon substrate, a SOI substrate, or some other suitable semiconductor substrate(s). The isolation structure 404 may be or comprise, for example, a STI region, a DTI, or some other suitable isolation structure(s).

In some embodiments, a process for forming the isolation structure 404 comprises depositing a lower pad layer 502 covering the semiconductor substrate, and further depositing an upper pad layer 504 covering the lower pad layer 502. The depositing of the lower and upper pad layers 502, 504 may, for example, be performed by chemical vapor deposition (CVD), physical vapor deposition (PVD), thermal oxidation, some other suitable deposition process(es), or any combination of the foregoing. As used herein, a term (e.g., process) with a suffix of "(es)" may, for example, be singular or plural. The lower pad layer 502 is a different material than the upper pad layer 504 and may be or comprise, for example, silicon oxide or some other suitable dielectric(s). The upper pad layer 504 may be or comprise, for example, silicon nitride or some other suitable dielectric(s). The lower and upper pad layers 502, 504 and the semiconductor substrate 402 are patterned to define a trench with a top layout of the isolation structure 404, and the trench is subsequently filled with a dielectric layer. The patterning may, for example, be performed by a photolithography/etching process or some other suitable patterning process(es). The trench may, for example, be filled by depositing the dielectric layer filling the trench and covering the upper pad layer 504, and subsequently performing a planarization into the dielectric layer until the upper pad layer 504 is reached. The depositing of the dielectric layer may, for example, be performed by CVD, PVD, or some other suitable deposition process(es). The planarization may, for example, be performed by a chemical mechanical polish (CMP) or some other suitable planarization process(es).

As used herein, a photolithography/etching process may comprise, for example, depositing a photoresist layer on a substrate, and subsequently patterning the photoresist layer with a pattern. The depositing may, for example, be performed by spin on coating or some other suitable deposition process(es). The patterning may, for example, be performed by photolithography or some other suitable patterning processes. Further, the photolithography/etching process may comprise, for example, performing an etch into the substrate with the patterned photoresist in place to transfer the pattern to the substrate, and thereafter removing the patterned photoresist layer. The removal may, for example, be performed by plasma ashing or some other suitable removal process(es).

Figure 6A:
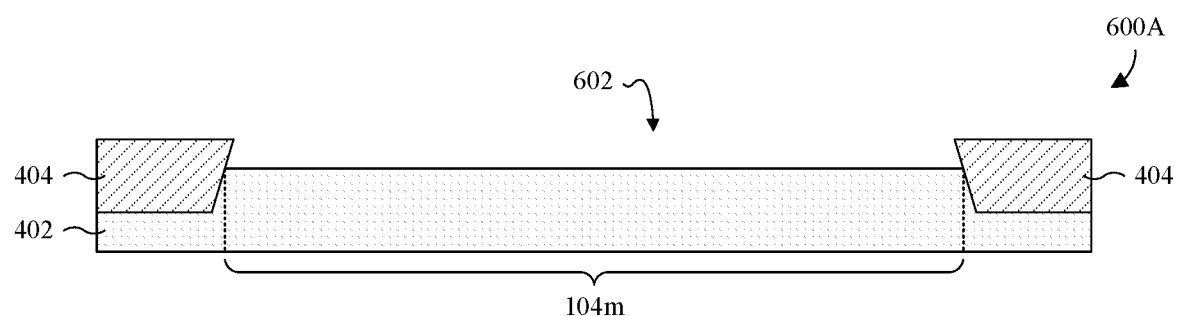
Figure 6B:
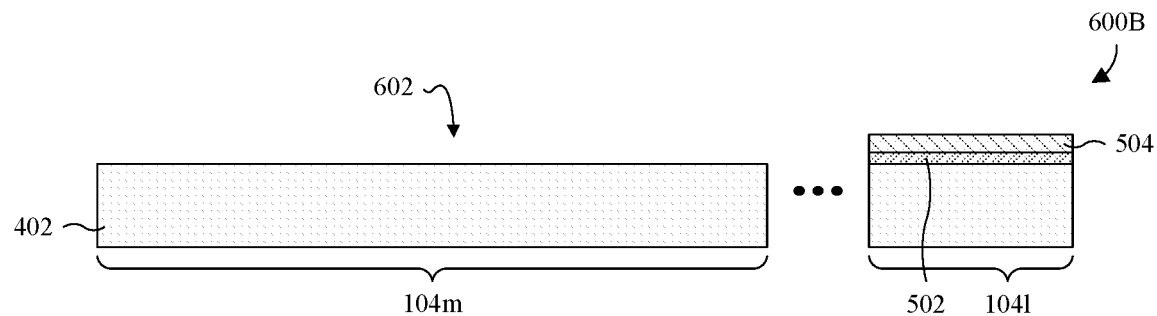

As illustrated by the cross-sectional views 600A, 600B of FIGS. 6A and 6B, the upper pad layer 504 is patterned to remove the upper pad layer 504 from the semiconductor memory region 104m, but not the semiconductor logic region 104l. The patterning forms a pad opening 602 in place of the removed portion of the upper pad layer 504, and may, for example, be performed by a photolithography/etching process or some other suitable patterning process(es).

Also illustrated by the cross-sectional views 600A, 600B of FIGS. 6A and 6B, the lower pad layer 502 is patterned to remove the lower pad layer 502 from the semiconductor memory region 104m, but not the semiconductor logic region 104l. The patterning expands the pad opening 602 to fill the space previously occupied by the removed portion of the lower pad layer 502, and may, for example, be performed by an etching process or some other suitable patterning process(es). The etching process may, for example, comprise a wet etching process or some other suitable etching process(es), and/or may, for example, use a wet etchant comprising hydrofluoric acid (HF) or some other suitable chemical(s). Further, the etching process may, for example, be performed as part of a cleaning process or some other suitable process(es).

Figure 7A:
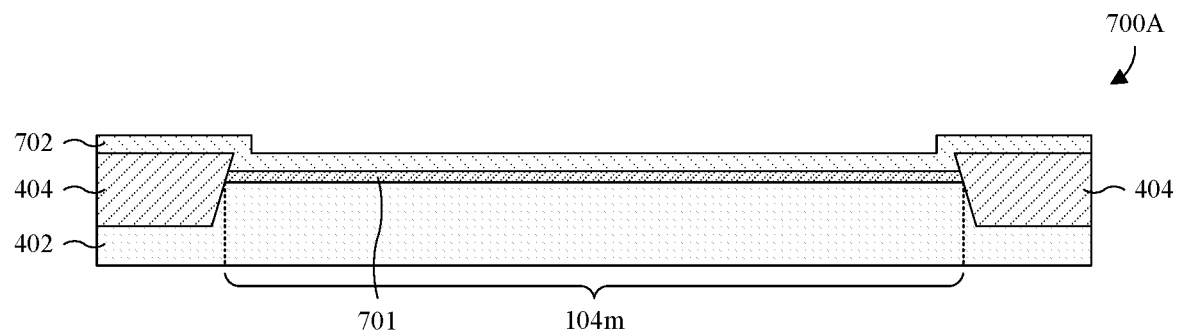
Figure 7B:
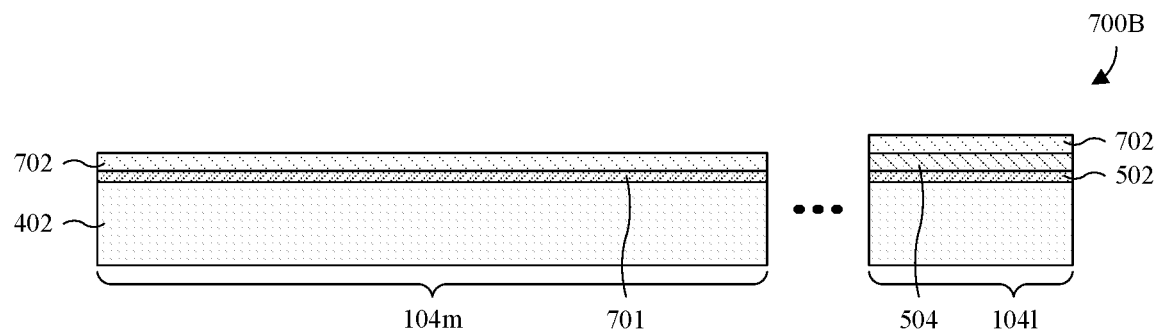

As illustrated by the cross-sectional views 700A, 700B of FIGS. 7A and 7B, a floating gate dielectric layer 701 is formed on the semiconductor memory region 104m, within the pad opening 602. The floating gate dielectric layer 701 may be or comprise, for example, silicon oxide, some other suitable dielectric(s), or any combination of the foregoing. The floating gate dielectric layer 701 may, for example, be formed by thermal oxidation, CVD, PVD, sputtering, some other suitable deposition process(es), or any combination of the foregoing. In some embodiments in which the floating gate dielectric layer 701 is formed by thermal oxidation, the floating gate dielectric layer 701 does not form on, or minimally forms on, the semiconductor logic region 104*l* and the isolation structure 404 since oxide of the thermal oxidation more readily forms on exposed semiconductor material at the semiconductor memory region 104*m* than on exposed material (e.g., silicon nitride) at the logic semiconductor region 102*l* and exposed material (e.g., oxide) at the isolation structure 404.

Also illustrated by the cross-sectional views 700A, 700B of FIGS. 7A and 7B, a floating gate electrode layer 702 is formed covering the isolation structure 404 and lining the pad opening 602 (see FIGS. 6A and 6B). The floating gate electrode layer 702 may, for example, be formed of metal, doped polysilicon, some other suitable conductor(s), or any combination of the foregoing. Further, the floating gate electrode layer 702 may, for example, be formed by CVD, PVD, electroless plating, electroplating, some other suitable deposition process(es), or some other suitable plating process(es).

Figure 8A:
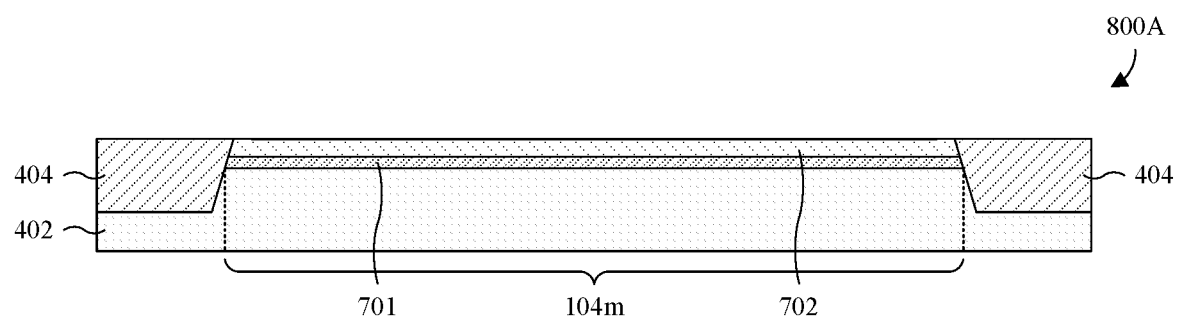
Figure 8B:
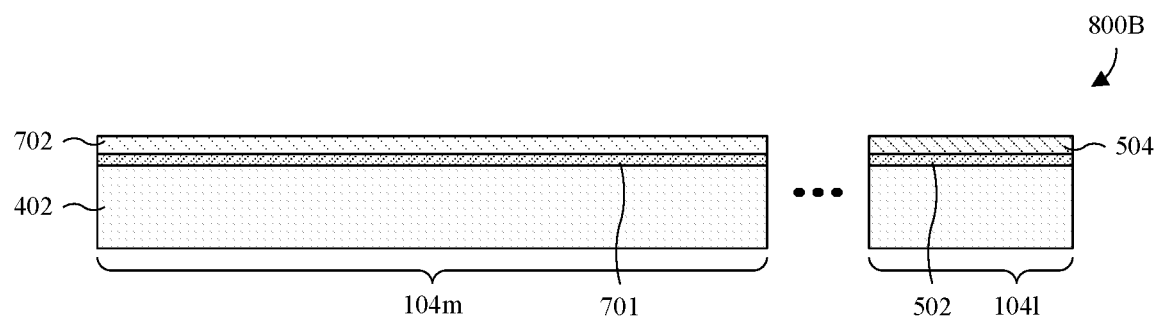

As illustrated by the cross-sectional views 800A, 800B of FIGS. 8A and 8B, a planarization is performed into the floating gate electrode layer 702 until the isolation structure 404 is reached. The planarization removes the floating gate electrode layer 702 from the semiconductor logic region 104*l* and patterns the floating gate electrode layer 702 with the same top layout as the semiconductor memory region 104*m*. Examples of this top layout are shown in, for example, FIGS. 2A, 2B, 3A, and 3B with respect to the semiconductor memory region 104*m*. The planarization may, for example, be performed by a CMP or some other suitable planarization process(es).

Further, although not visible within the cross-sectional views 800A, 800B of FIGS. 8A and 8B, the floating gate electrode layer 702 may, for example, be patterned to separate the floating gate electrode layer 702 into a plurality of discrete segments. See, for example, FIGS. 2B and 3B and note that the test-device and memory floating gate electrodes 216, 218 are separated in a direction parallel to line D-D'. It's this separation that is the subject of the patterning. The discrete segments may include, for example, a test-device segment corresponding to a floating gate test device under manufacture. Further, the discrete segments may include, for example, a plurality of line-shaped segments having a common orientation and corresponding to rows or columns of a memory cell array under manufacture. The patterning may, for example, be performed by a photolithography/etching process or some other suitable patterning process(es).

Figure 9A:
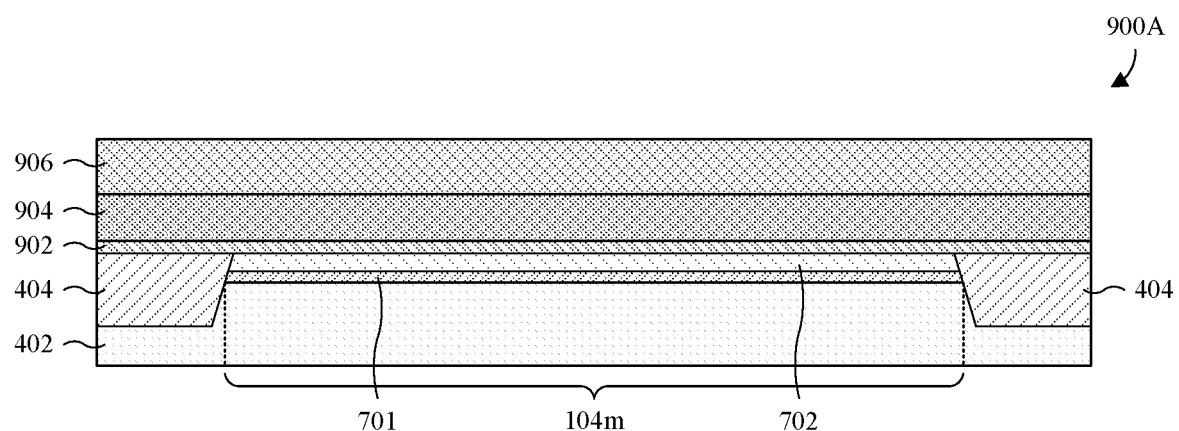
Figure 9B:
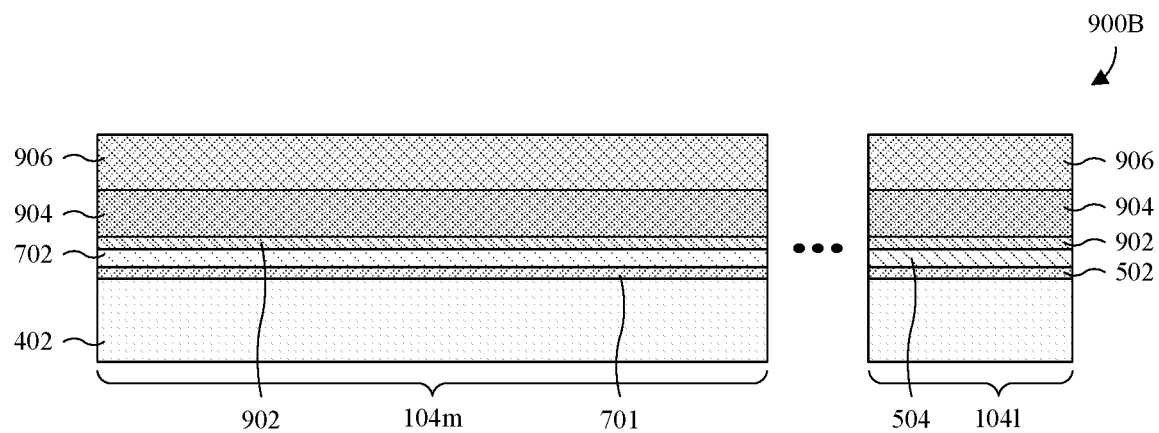

As illustrated by the cross-sectional views 900A, 900B of FIGS. 9A and 9B, a control gate dielectric layer 902, a control gate electrode layer 904, and a control gate hard mask layer 906 are formed stacked on the floating gate electrode layer 702, the upper pad layer 504, and the isolation structure 404. The control gate electrode layer 904 overlies the control gate dielectric layer 902, and the control gate hard mask layer 906 overlies the control gate electrode layer 904. The control gate electrode layer 904 may be or comprise, for example, metal, doped polysilicon, or some other suitable conductor(s), and/or may, for example, be formed by CVD, PVD, electroless plating, electroplating, or some other suitable deposition or plating process(es). The control gate dielectric layer 902 and the control gate hard mask layer 906 may be or comprise, for example, silicon oxide, silicon nitride, some other suitable dielectric(s), or any combination of the foregoing. Further, the control gate dielectric layer 902 and the control gate hard mask layer 906 may, for example, be formed by CVD, PVD, or some other suitable deposition process(es).

Figure 10A:
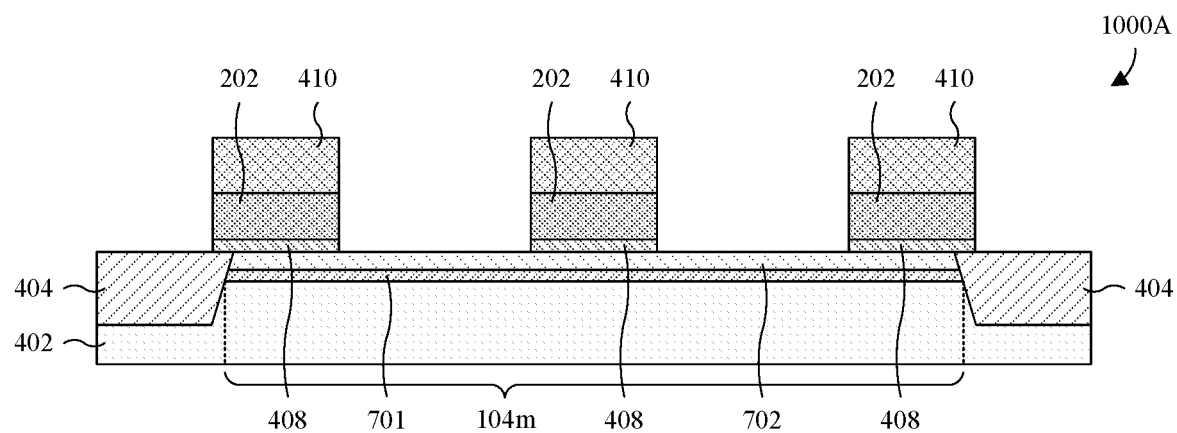
Figure 10B:
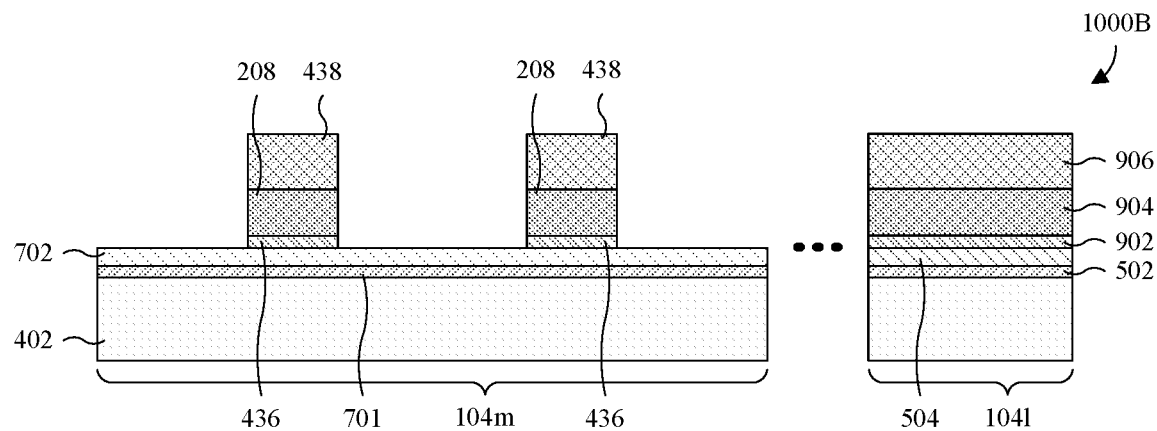

As illustrated by the cross-sectional views 1000A, 1000B of FIGS. 10A and 10B, the control gate dielectric layer 902 (see FIGS. 9A and 9B), the control gate electrode layer 904 (see FIGS. 9A and 9B), and the control gate hard mask layer 906 (see FIGS. 9A and 9B) are patterned on the semiconductor memory region 104*m*, but not the semiconductor logic region 104*l*. The patterning defines a test-device control gate dielectric layer 408, a test-device control gate electrode 202, and a test-device control gate hard mask 410 stacked upon one another. See FIG. 10A. Further, the patterning defines a pair of memory control gate dielectric layers 436, a pair of memory control gate electrodes 208, and a pair of memory control gate hard masks 438 stacked upon one another. See FIG. 10B. The patterning may, for example, be performed by a photolithography/etching process or some other suitable patterning process(es).

The test-device control gate dielectric layer 408 overlies the floating gate electrode layer 702, the test-device control gate electrode 202 overlies the test-device control gate dielectric layer 408, and the test-device control gate hard mask 410 overlies the test-device control gate electrode 202. Further, the test-device control gate dielectric layer 408, the test-device control gate electrode 202, and the test-device control gate hard mask 410 have cell-like top layouts. As discussed above, a cell-like top layout may be or comprise, for example, an array of islands and a plurality of bridges interconnecting the islands. In some embodiments, the test-device control gate dielectric layer 408, the test-device control gate electrode 202, and the test-device control gate hard mask 410 have the same or substantially the same cell-like top layout. Examples of this cell-like top layout are shown in, for example, FIGS. 2A and 3A with respect to the test-device control gate electrode 202. While the test-device control gate dielectric layer 408, the test-device control gate electrode 202, and the test-device control gate hard mask 410 are each shown as having multiple separate segments, the separate segments may, for example, be connected out of the cross-sectional view 1000A of FIG. 10A.

The memory control gate dielectric layers 436 overly the floating gate electrode layer 702 and are laterally spaced. The memory control gate electrodes 208 respectively overlie the memory control gate dielectric layers 436, and the memory control gate hard masks 438 respectively overlie the memory control gate electrodes 208. In some embodiments, the memory control gate dielectric layers 436, the memory control gate electrodes 208, and the memory control gate hard masks 438 have the same or substantially the same memory-cell top layout. Examples of this memory-cell top layout are shown in, for example, FIGS. 2A and 3A with respect to the memory control gate electrodes 208.

Figure 11A:
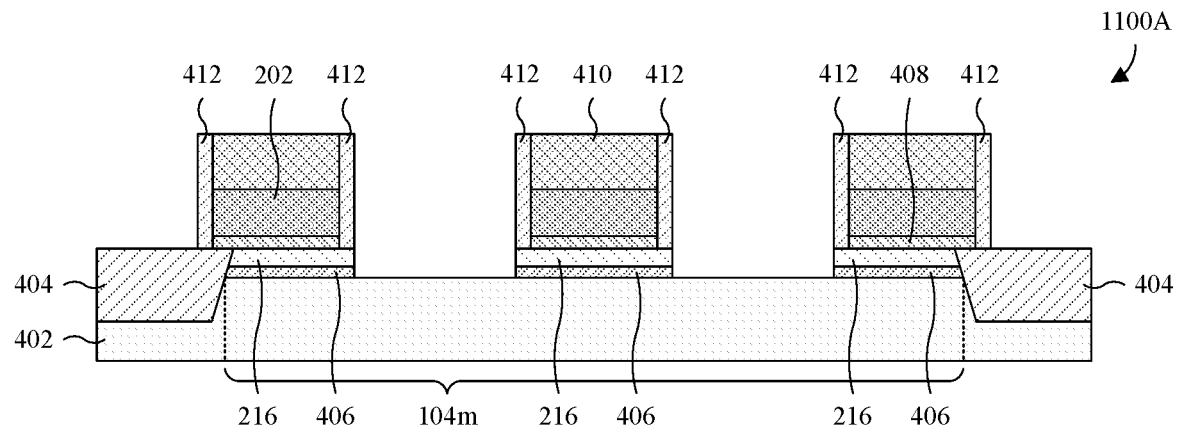
Figure 11B:
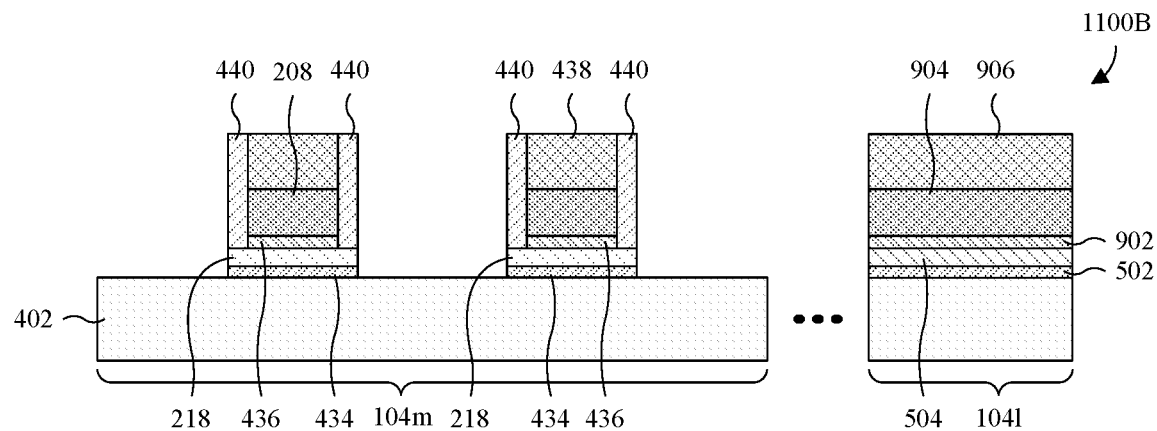

As illustrated by the cross-sectional views 1100A, 1100B of FIGS. 11A and 11B, a test-device control gate spacer 412 (see FIG. 11A) and a memory control gate spacer 440 (see FIG. 11B) are formed. The test-device control gate spacer 412 comprises multiple segments respectively on sidewalls of the test-device control gate dielectric layer 408, sidewalls of the test-device control gate electrode 202, and sidewalls of the test-device control gate hard mask 410. Similarly, the memory control gate spacer 440 comprises multiple segments respectively on sidewalls of the memory control gate dielectric layers 436, sidewalls of the memory control gate electrodes 208, and sidewalls of the memory control gate hard masks 438. The test-device control gate spacer 412 and the memory control gate spacer 440 may be or comprise, for example, silicon oxide, silicon nitride, silicon oxynitride, some other suitable dielectric(s), or any combination of the foregoing.

In some embodiments, a process for forming the test-device control gate spacer 412 and the memory control gate spacer 440 comprises depositing a spacer layer covering and lining the structure of FIGS. 10A and 10B, and subsequently performing an etch back into the spacer layer. The depositing may, for example, be performed conformally, and/or may, for example, be performed by CVD, PVD, or some other suitable deposition process(es). The etch back removes horizontal segments of the spacer layer, without removing vertical segments of the spacer layer, and the remaining vertical segments correspond to the test-device control gate spacer 412 and the memory control gate spacer 440.

Also illustrated by the cross-sectional views 1100A, 1100B of FIGS. 11A and 11B, the floating gate electrode layer 702 (see FIGS. 10A and 10B) and the floating gate dielectric layer 701 (see FIGS. 10A and 10B) are patterned. The patterning defines a test-device floating gate electrode 216 and a test-device floating gate dielectric layer 406 stacked upon one another. See FIG. 11A. Further, the patterning defines a pair of memory floating gate electrodes 218 and a pair of memory floating gate dielectric layers 434 stacked upon one another. See FIG. 11B. The patterning may, for example, be performed by a photolithography/etching process or some other suitable patterning process(es).

The test-device floating gate electrode 216 underlies the test-device control gate dielectric layer 408, and the test-device floating gate dielectric layer 406 underlies the test-device floating gate electrode 216. Further, the test-device floating gate electrode 216 and the test-device floating gate dielectric layer 406 have cell-like top layouts. In some embodiments, the test-device floating gate electrode 216 and the test-device floating gate dielectric layer 406 have the same or substantially the same cell-like top layout. Examples of this cell-like top layout are shown in, for example, FIGS. 2B and 3B with respect to the test-device floating gate electrode 216. While the test-device floating gate electrode 216 and the test-device floating gate dielectric layer 406 are each shown as having multiple separate segments, the separate segments may, for example, be connected out of the cross-sectional view 1100A of FIG. 11A.

The memory floating gate electrodes 218 respectively underlie the memory control gate dielectric layers 436, and the memory floating gate dielectric layers 434 respectively underlie the memory floating gate electrodes 218. In some embodiments, the memory floating gate electrodes 218 and the memory floating gate dielectric layers 434 have the same or substantially the same memory-cell top layout. Examples of this memory-cell top layout are shown in, for example, FIGS. 2B and 3B with respect to the memory floating gate electrodes 218.

Figure 12A:
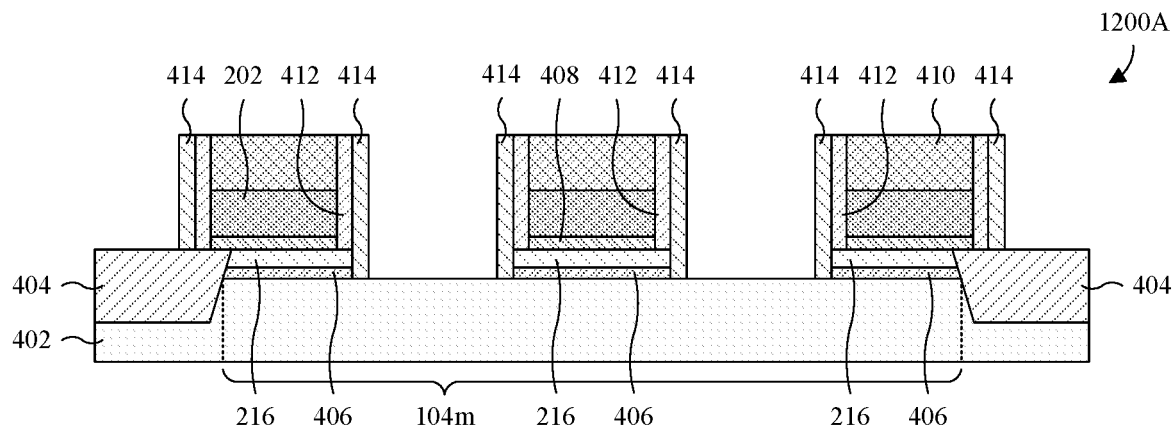
Figure 12B:
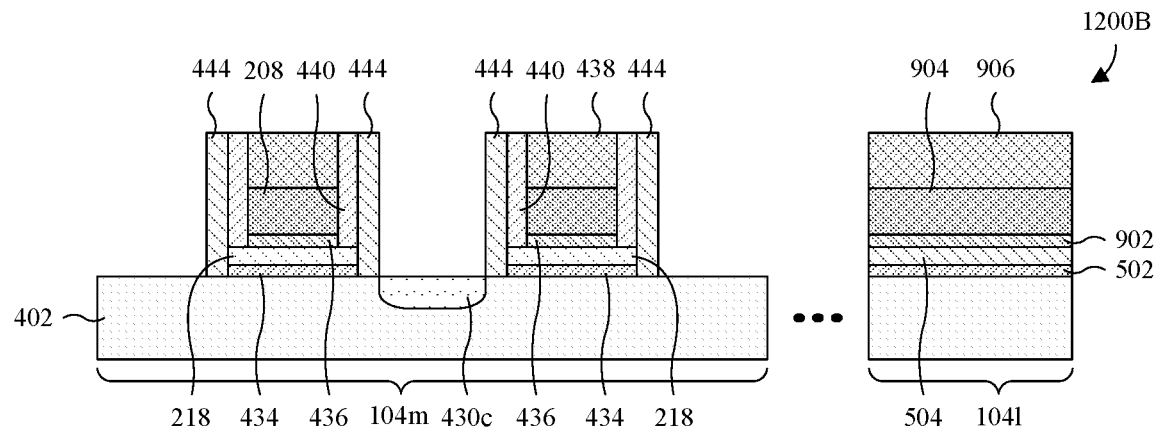

As illustrated by the cross-sectional views 1200A, 1200B of FIGS. 12A and 12B, a test-device floating gate spacer 414 (see FIG. 12A) and a memory floating gate spacer 444 (see FIG. 11B) are formed. The test-device floating gate spacer 414 comprises multiple segments respectively on sidewalls of test-device control gate spacer 412, sidewalls of the test-device floating gate electrode 216, and sidewalls of the test-device floating gate dielectric layer 406. Similarly, the memory control gate spacer 440 comprises multiple segments respectively on sidewalls of the memory control gate spacer 440, sidewalls of the memory floating gate electrodes 218, and sidewalls of the memory floating gate dielectric layers 434. The test-device floating gate spacer 414 and the memory floating gate spacer 444 may be or comprise, for example, silicon oxide, silicon nitride, silicon oxynitride, some other suitable dielectric(s), or any combination of the foregoing.

In some embodiments, a process for forming the test-device floating gate spacer 414 and the memory floating gate spacer 444 comprises depositing a spacer layer covering and lining the structure of FIGS. 11A and 11B, and subsequently performing an etch back into the spacer layer. The depositing may, for example, be performed conformally, and/or may, for example, be performed by CVD, PVD, or some other suitable deposition process. The etch back removes horizontal segments of the spacer layer, without removing vertical segments of the spacer layer, and the remaining vertical segments correspond to the test-device floating gate spacer 414 and the memory floating gate spacer 444.

Also illustrated by the cross-sectional views 1200A, 1200B of FIGS. 12A and 12B, a common memory source/drain region 430c is formed in a top surface of the semiconductor substrate 402, between the memory floating gate electrodes 218. See FIG. 12B. The common memory source/drain region 430c is a doped region of the semiconductor substrate 402 and may, for example, have an opposite doping type as an adjoining region of the semiconductor substrate 402. In some embodiments, a process for forming the common memory source/drain region 430c comprises forming a photoresist layer covering the structure of FIGS. 11A and 11B. The photoresist layer is patterned to define an opening exposing the semiconductor substrate between the memory floating gate electrodes 218 using photolithography. A doping process is then performed with the patterned photoresist layer in place to form the common memory source/drain region 430c through the opening. The doping process may be or comprise, for example, ion implantation or some other suitable doping process(es). The photoresist layer is then removed.

Figure 13A:
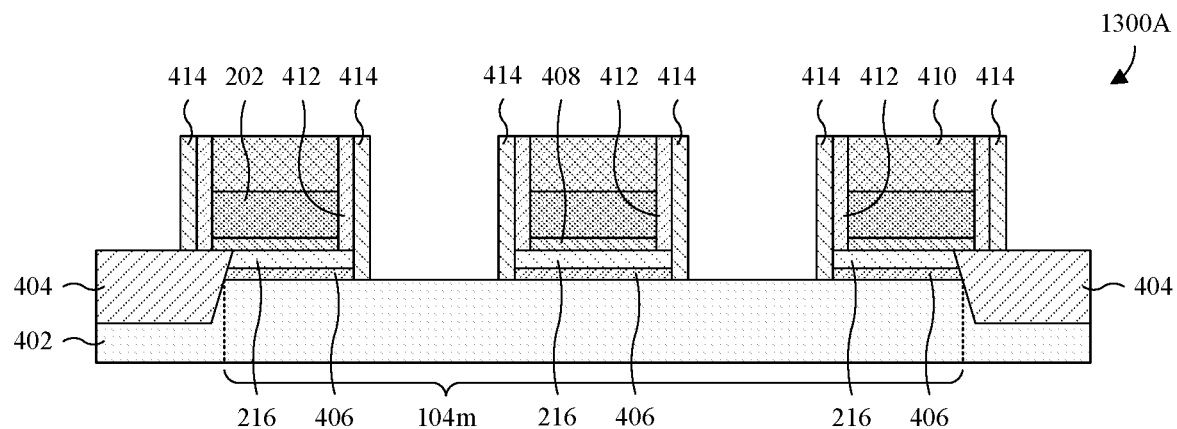
Figure 13B:
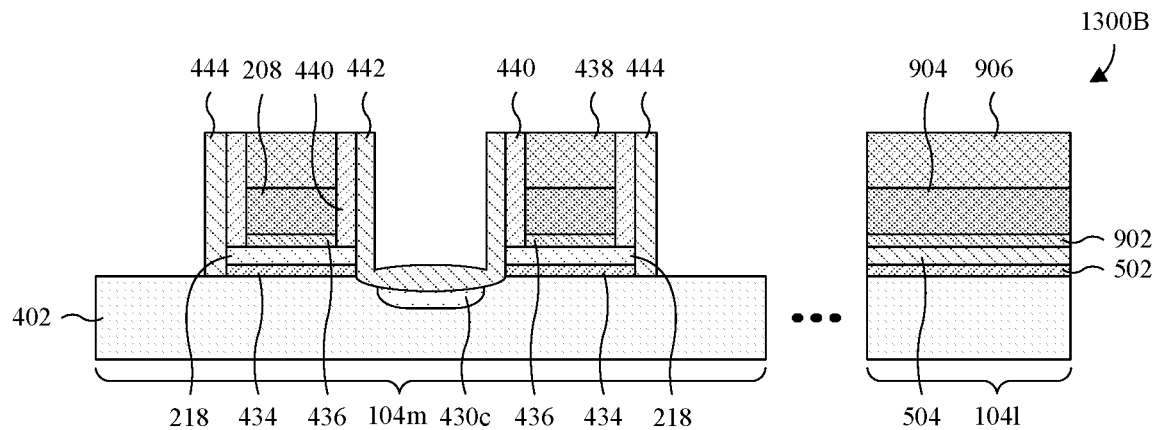

As illustrated by the cross-sectional views 1300A, 1300B of FIGS. 13A and 13B, segments of the memory floating gate spacer 444 that border the common memory source/drain region 430c are removed. The removal may, for example, be performed by a photolithography/etching process or some other suitable etching process(es).

Also illustrated by the cross-sectional views 1300A, 1300B of FIGS. 13A and 13B, a memory erase gate dielectric layer 442 is formed covering the common memory source/drain region 430c. See FIG. 13B. Further, the memory erase gate dielectric layer 442 lines sidewalls of the memory floating gate electrodes 218 that face the common memory source/drain region 430c, sidewalls of the memory floating gate dielectric layers 434 that face the common memory source/drain region 430c, and sidewalls of the memory control gate spacer 440 that face the common memory source/drain region 430c. The memory erase gate dielectric layer 442 may be or comprise, for example, silicon oxide or some other suitable dielectric(s).

In some embodiments, a process for forming the memory erase gate dielectric layer 442 comprises depositing a dielectric layer covering and lining the structure of FIGS. 12A and 12B. The dielectric layer may, for example, be deposited by thermal oxidation, CVD, PVD, or some other suitable deposition process(es). The dielectric layer is then patterned into the memory erase gate dielectric layer 442. The patterning may, for example, be performed by a photolithography/etching process or some other suitable patterning process(es).

Figure 14A:
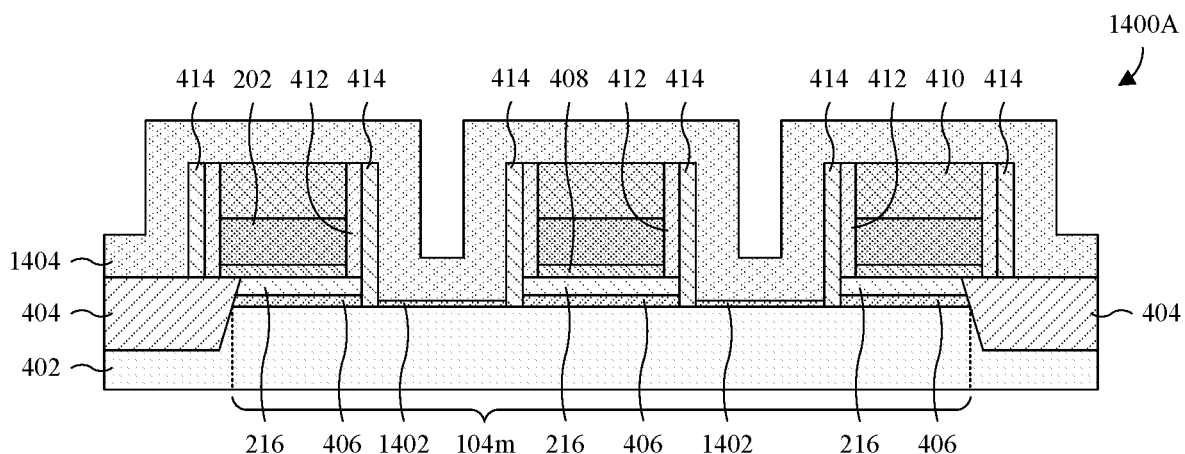
Figure 14B:
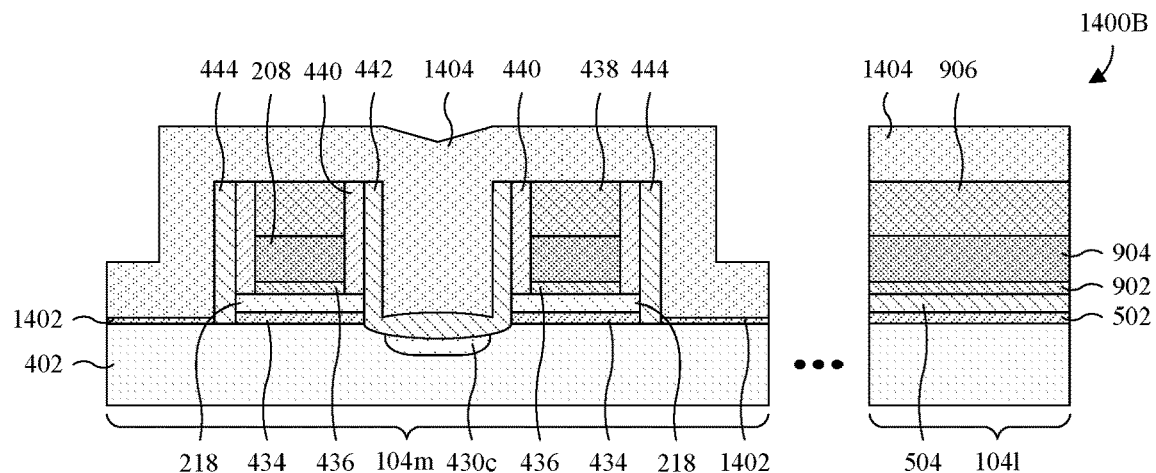

As illustrated by the cross-sectional views 1400A, 1400B of FIGS. 14A and 14B, a select gate dielectric layer 1402 is formed on the semiconductor substrate 402, to the sides of the test-device floating gate electrode 216 and to the sides of the memory floating gate electrodes 218. The select gate dielectric layer 1402 may be or comprise, for example, silicon oxide or some other suitable dielectric(s). Further, the select gate dielectric layer 1402 may be formed by, for example, thermal oxidation or some other suitable deposition process(es). In some embodiments, the select gate dielectric layer 1402 is formed by a deposition process that preferentially forms the select gate dielectric layer 1402 directly on semiconductor material of the semiconductor substrate 402 relative to surrounding dielectric material.

Also illustrated by the cross-sectional views 1400A, 1400B of FIGS. 14A and 14B, a gate electrode layer 1404 is formed covering and lining the structure of FIGS. 13A and 13B over the select gate dielectric layer 1402. The gate electrode layer 1404 may be or comprise, for example, metal, doped polysilicon, or some other suitable conductor(s). The gate electrode layer 1404 may be formed by, for example, CVD, PVD, electroless plating, electroplating, or some other suitable deposition or plating process(es).

Figure 15A:
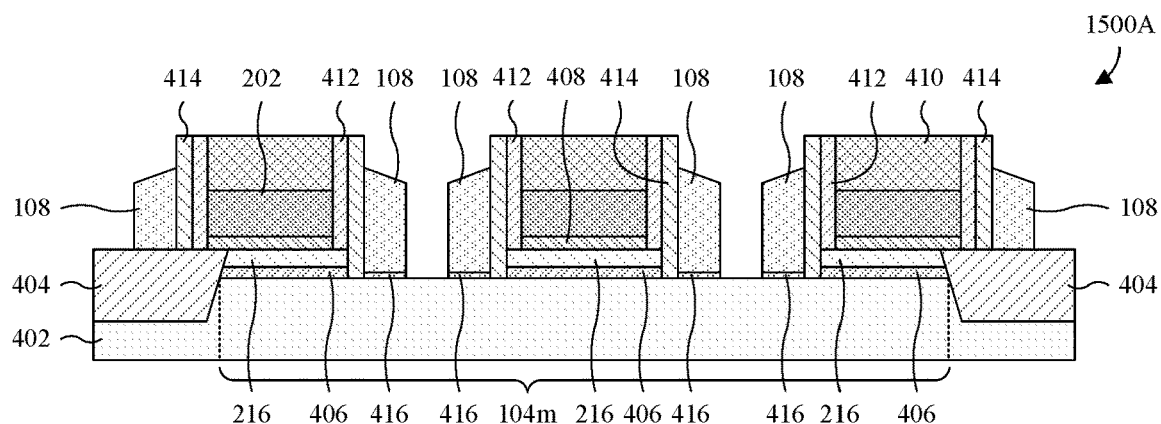
Figure 15B:
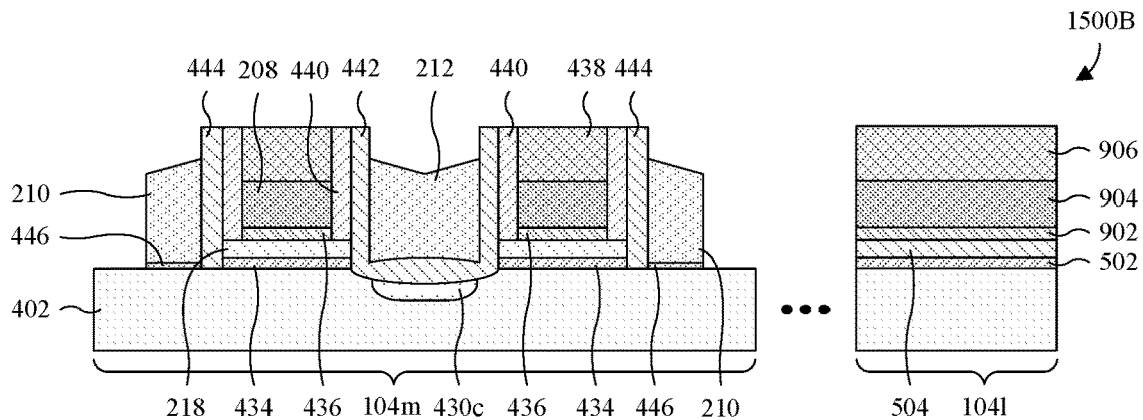

As illustrated by the cross-sectional views 1500A, 1500B of FIGS. 15A and 15B, the select gate dielectric layer 1402 (see FIGS. 14A and 14B) and the gate electrode layer 1404 (see FIGS. 14A and 14B) are patterned to define test-device select gate dielectric layers 416 and test-device select gate electrodes 108. See FIG. 15A. Further, the patterning defines memory select gate dielectric layers 446, memory select gate electrodes 210, and a memory erase gate electrode 212. See FIG. 15B. The test-device select gate electrodes 108 respectively overlie the test-device select gate dielectric layers 416 and border sidewalls of the test-device floating gate spacer 414. The memory select gate electrodes 210 respectively overlie the memory select gate dielectric layers 446 and border sidewalls of the memory floating gate spacer 444. The memory erase gate electrode 212 overlies the common memory source/drain region 430c.

In some embodiments, a process for patterning the select gate dielectric layer 1402 and the gate electrode layer 1404 comprises performing a first etch into the gate electrode layer 1404 to etch back the gate electrode layer 1404, and to remove horizontal segments of the gate electrode layer 1404 without removing vertical segments of the gate electrode layer 1404. The remaining vertical segments correspond to the test-device select gate electrodes 108, the memory select gate electrodes 210, and the memory erase gate electrode 212. Further, a second etch is performed into to the select gate dielectric layer 1402 with the test-device select gate electrodes 108 and the memory select gate electrodes 210 in place to form the test-device select gate dielectric layers 416 and the memory select gate dielectric layers 446. The second etch may, for example, stop on the semiconductor substrate 402, and/or the test-device select gate electrodes 108 and the memory select gate electrodes 210 may serve as a mask for the first etch.

Figure 16A:
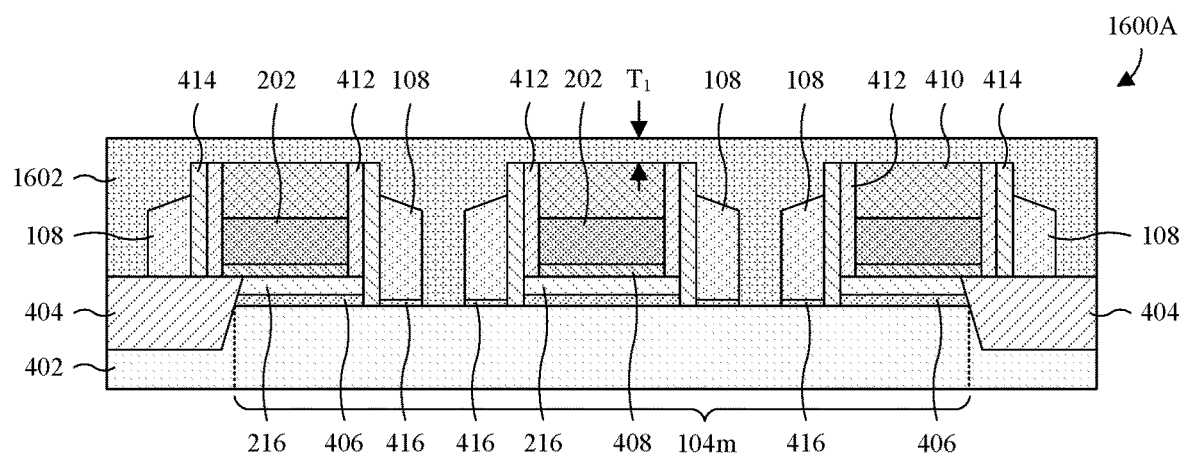
Figure 16B:
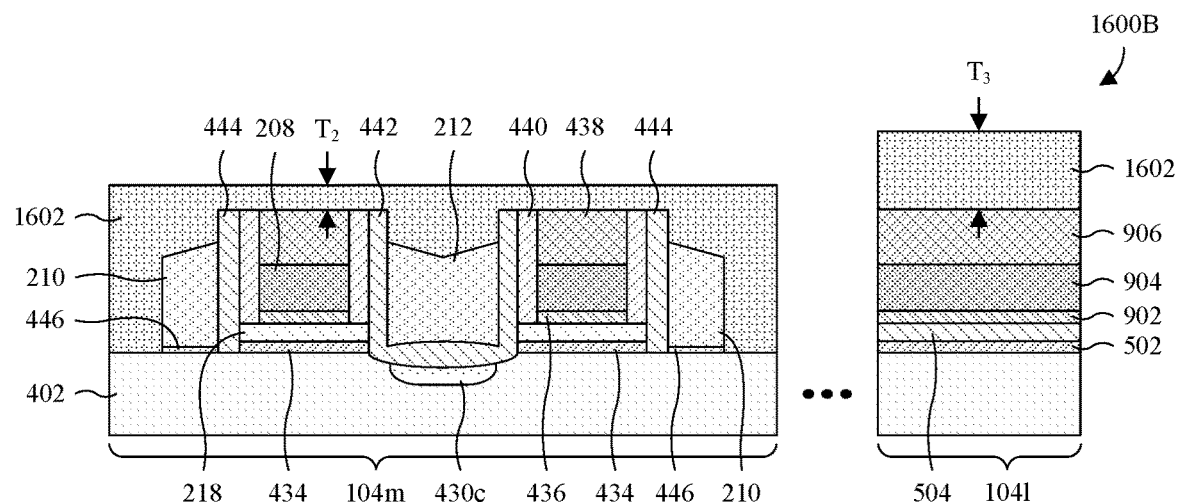

As illustrated by the cross-sectional views 1600A, 1600B of FIGS. 16A and 16B, an etch-back layer 1602 is formed covering the structure of FIGS. 15A and 15B. The etch-back layer 1602 may be, for example, a flowable material, an organic material, an anti-reflective coating (ARC), some other suitable material(s), or any combination of the foregoing. Further, the etch-back layer 1602 may, for example, be formed by spin on coating or some other suitable deposition process(es).

In some embodiments, the etch-back layer 1602 more readily deposits on a large flat area than a small flat area. Because the test-device control gate hard mask 410 has a cell-like top layout, a top of the test-device control gate hard mask 410 defines multiple small flat areas (e.g., corresponding to islands and/or corresponding to bridges) instead of a single large flat area. Examples of the cell-like top layout are shown with respect to the test-device control gate electrode 202 in FIGS. 2A and 3A. Further, the multiple small flat areas may, for example, be similar in size to small flat areas defined by tops of the memory control gate hard masks 438. Therefore, the etch-back layer 1602 evenly or substantially evenly deposits on the test-device control gate hard mask 410 and the memory control gate hard masks 438. Further, a first thickness $T_1$ of the etch-back layer 1602 directly over the test-device control gate hard mask 410 is the same or substantially the same as a second thickness $T_2$ of the etch-back layer 1602 directly over the memory control gate hard masks 438. On the other hand, a top of the control gate hard mask layer 906 defines a large flat area on the semiconductor logic region 104l that is large compared to the multiple small flat areas of the test-device control gate hard mask 410 and the small flat areas of the memory control gate hard masks 438. Accordingly, a third thickness $T_3$ of the etch-back layer 1602 directly over the control gate hard mask layer 906 is substantially greater than the first and second thicknesses $T_1$, $T_2$.

Figure 17A:
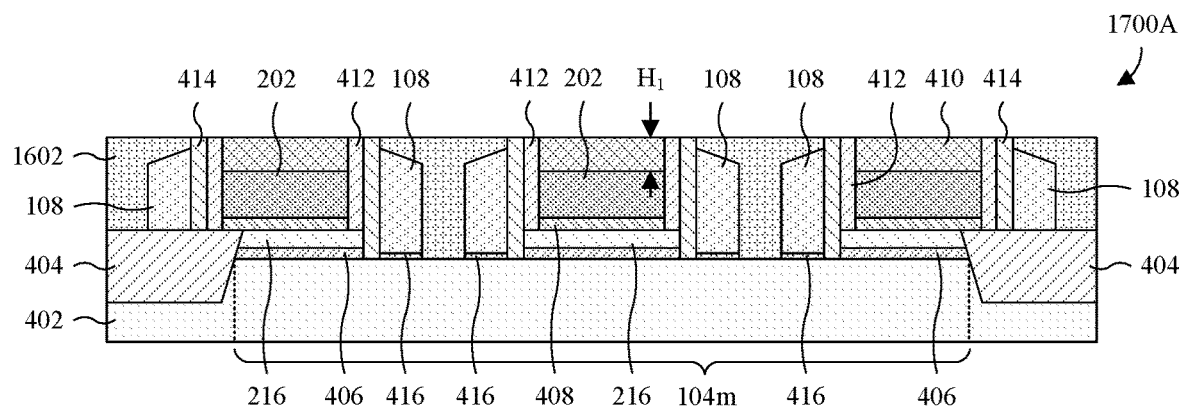
Figure 17B:
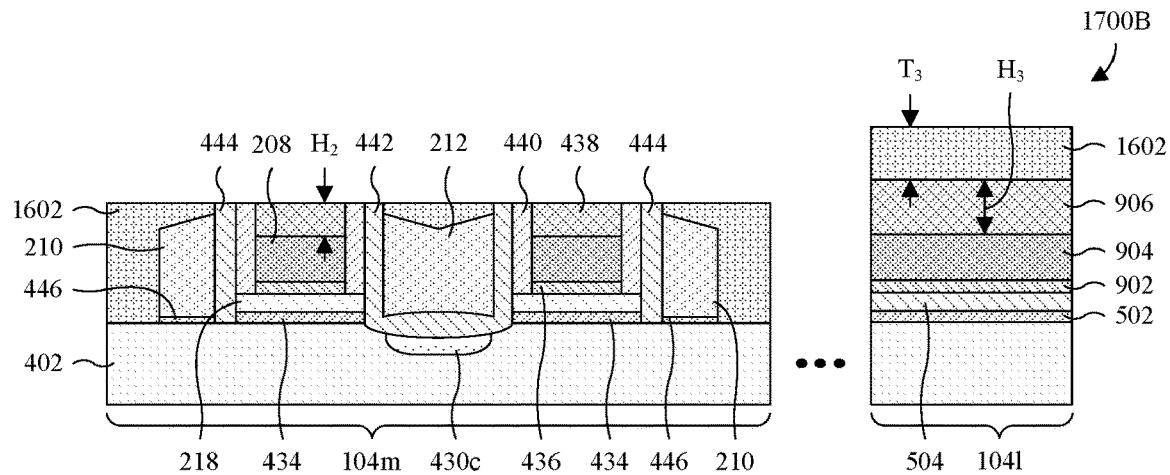

As illustrated by the cross-sectional views 1700A, 1700B of FIGS. 17A and 17B, an etch back is performed into the etch-back layer 1602, the test-device control gate hard mask 410, and the memory control gate hard masks 438. Further, the etch back is performed into the test-device control gate spacer 412, the test-device floating gate spacer 414, the memory control gate spacer 440, the memory floating gate spacer 444, and the memory erase gate dielectric layer 442. The etch back may, for example, be a non-selective etch back or some other suitable etch back(s). A non-selective etch back may be, for example, an etch back that does not preferentially or more quickly remove one material over another. The etch back etches the etch-back layer 1602 until the test-device control gate hard mask 410 and the memory control gate hard masks 438 are reached. Thereafter, the etch back etches the etch-back layer 1602, the test-device control gate hard mask 410, and the memory control gate hard masks 438 in parallel to reduce a first height $H_1$ of the test-device control gate hard mask 410, and to reduce a second height $H_2$ of the memory control gate hard masks 438. In some embodiments, the first and second heights $H_1$, $H_2$ are the same or substantially the same upon completion of the etch back. Because the third thickness $T_3$ of the etch-back layer 1602 exceeds the first and second thickness $T_1$, $T_2$ of the etch-back layer 1602 (see FIGS. 16A and 16B), the etch back may not fully remove the etch-back layer 1602 from the semiconductor logic region 104l before the etch back concludes, whereby the etch back may not reduce a third height $H_3$ of the control gate hard mask layer 906 directly on the semiconductor logic region 104l.

Figure 18A:
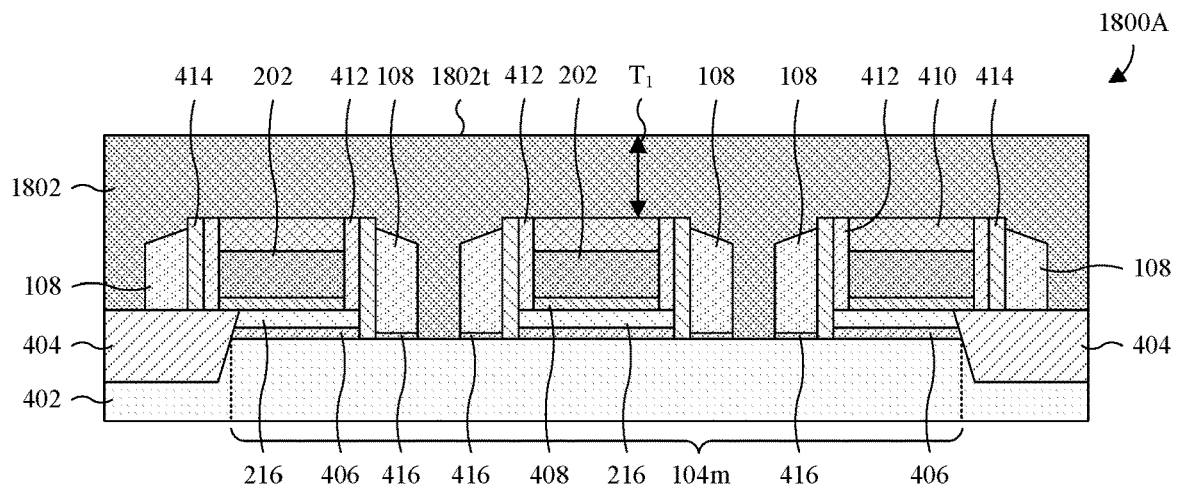
Figure 18B:
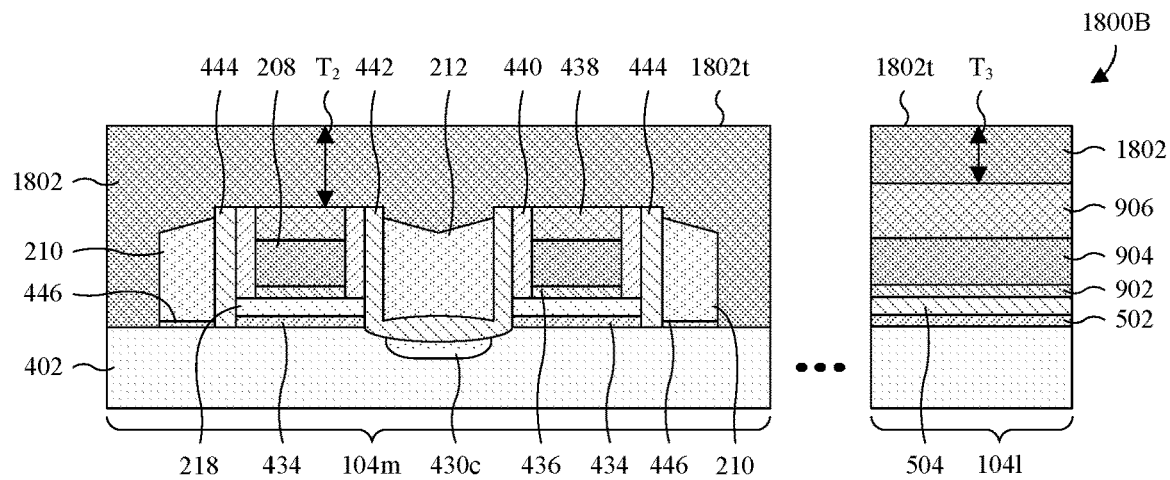

As illustrated by the cross-sectional views 1800A, 1800B of FIGS. 18A and 18B, the etch-back layer 1602 (see FIGS. 17A and 17B) is removed. The removal may, for example, be performed by an etching process or some other suitable removal process(es).

Also illustrated by the cross-sectional views 1800A, 1800B of FIGS. 18A and 18B, a hard mask layer 1802 is formed covering the structure of FIGS. 17A and 17B, less the etch-back layer 1602, and with a top surface 1802t that is planar or substantially planar. In some embodiments, a first thickness $T_1$ of the hard mask layer 1802 directly over the test-device control gate hard mask 410 is the same or substantially the same as a second thickness $T_2$ of the hard mask layer 1802 directly over the memory control gate hard masks 438. Further, in some embodiments, a third thickness $T_3$ of the hard mask layer 1802 directly over the semiconductor logic region 104*l* is substantially less than the first and second thicknesses $T_1$, $T_2$. As should be appreciated, this is caused by the increased thickness of the etch-back layer 1602 on the semiconductor logic region 104*l* during the etch back of FIGS. 17A and 17B. The hard mask layer 1802 may be or comprise, for example, silicon oxide, silicon nitride, polysilicon, or some other suitable hard mask material(s).

In some embodiments, a process for forming the hard mask layer 1802 comprises depositing the hard mask layer 1802, and subsequently performing a planarization into the top surface 1802*t* of the hard mask layer 1802. The depositing may, for example, be performed by CVD, PVD, or some other suitable deposition process(es). The planarization may, for example, be performed by a CMP or some other suitable planarization process(es).

Figure 19A:
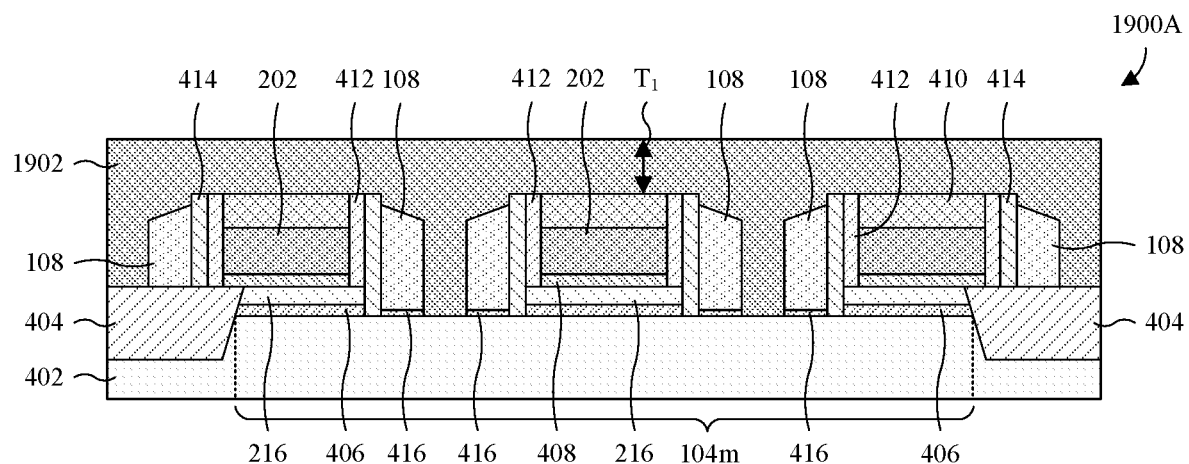
Figure 19B:
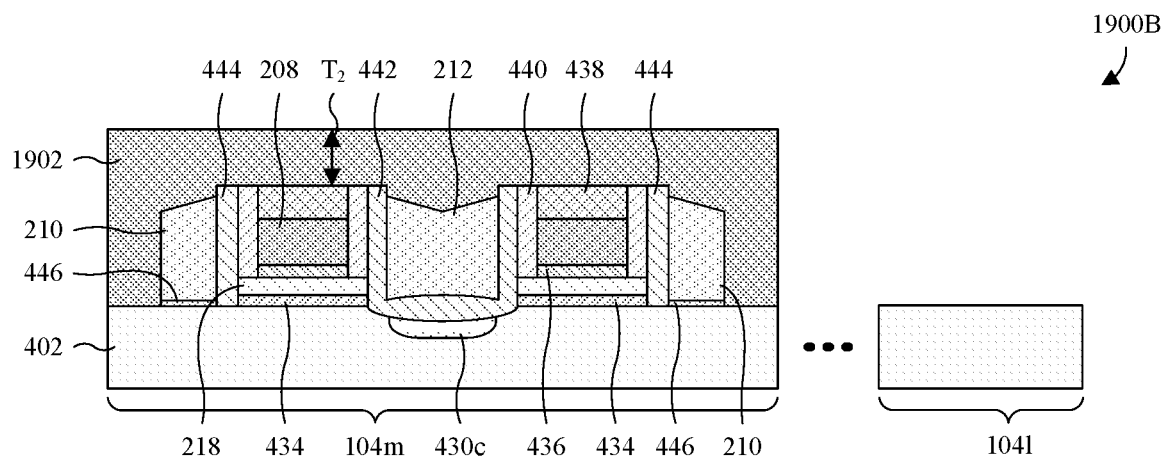

As illustrated by the cross-sectional views 1900A, 1900B of FIGS. 19A and 19B, the hard mask layer 1802 (see FIGS. 18A and 18B) is patterned to remove the hard mask layer 1802 from the semiconductor logic region 104*l*, and to define a memory hard mask 1902 covering the semiconductor memory region 104*m*. The patterning may, for example, be performed by a photolithography/etching process or some other suitable patterning process(es).

Also illustrated by the cross-sectional views 1900A, 1900B of FIGS. 19A and 19B, lower pad layer 502 (see FIGS. 18A and 18B), the upper pad layer 504 (see FIGS. 18A and 18B), the control gate dielectric layer 902 (see FIGS. 18A and 18B), the control gate electrode layer 904 (see FIGS. 18A and 18B), and the control gate hard mask layer 906 (see FIGS. 18A and 18B) are removed from the semiconductor logic region 104*l*. In some embodiments, a process for performing the removal comprises etching the lower pad layer 502, the upper pad layer 504, the control gate dielectric layer 902, the control gate electrode layer 904, and the control gate hard mask layer 906 with the memory hard mask 1902 in place until the semiconductor logic region 104*l* is reached. During the etching, the memory hard mask 1902 serves as a mask and protects the structure on the semiconductor memory region 104*m* from damage. Further, the memory hard mask 1902 is partially etched, such that a first thickness $T_1$ of the memory hard mask 1902 directly over the test-device control gate hard mask 410 and a second thickness $T_2$ of the memory hard mask 1902 directly over the memory control gate hard masks 438 are reduced.

Since the test-device control gate hard mask 410 has a cell-like top layout, the first thickness $T_1$ of the memory hard mask 1902 is large and the same or substantially the same as the second thickness $T_2$ of the memory hard mask 1902. See the above discussion regarding FIGS. 16A and 16B through FIGS. 18A and 18B for an explanation as to why this is. As such, the memory hard mask 1902 is not completely removed from the test-device control gate hard mask 410, and the first thickness $T_1$ is sufficient to protect the test-device control gate hard mask 410, while etching the upper pad layer 504, the control gate dielectric layer 902, the control gate electrode layer 904, and the control gate hard mask layer 906. This may, in turn, prevent electrical shorting between the semiconductor memory region 104*m* and the test-device floating gate electrode 216 during subsequent BEOL processing.

Figure 20A:
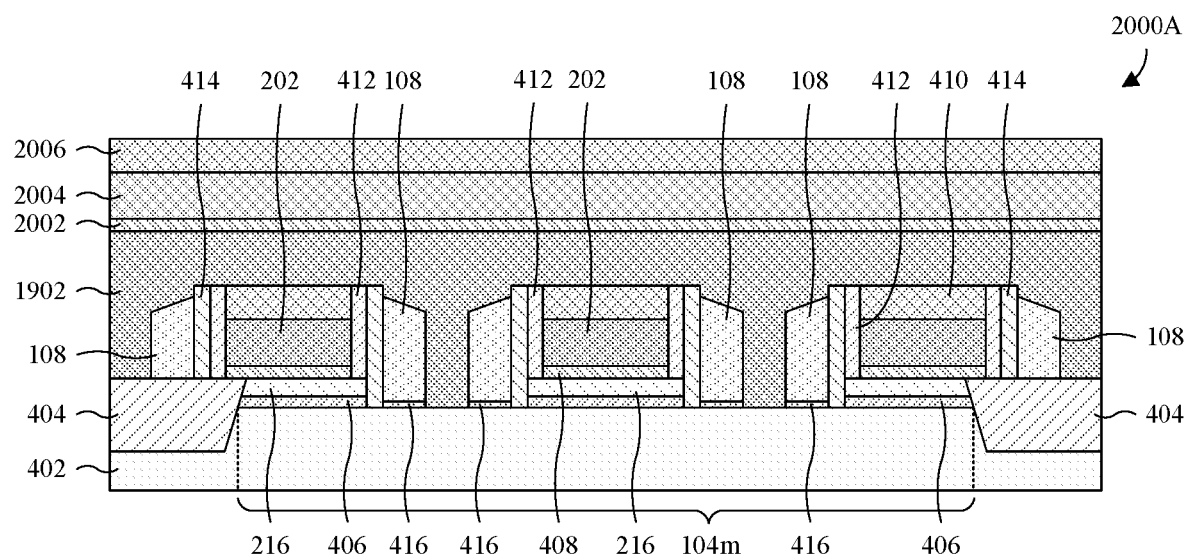
Figure 20B:
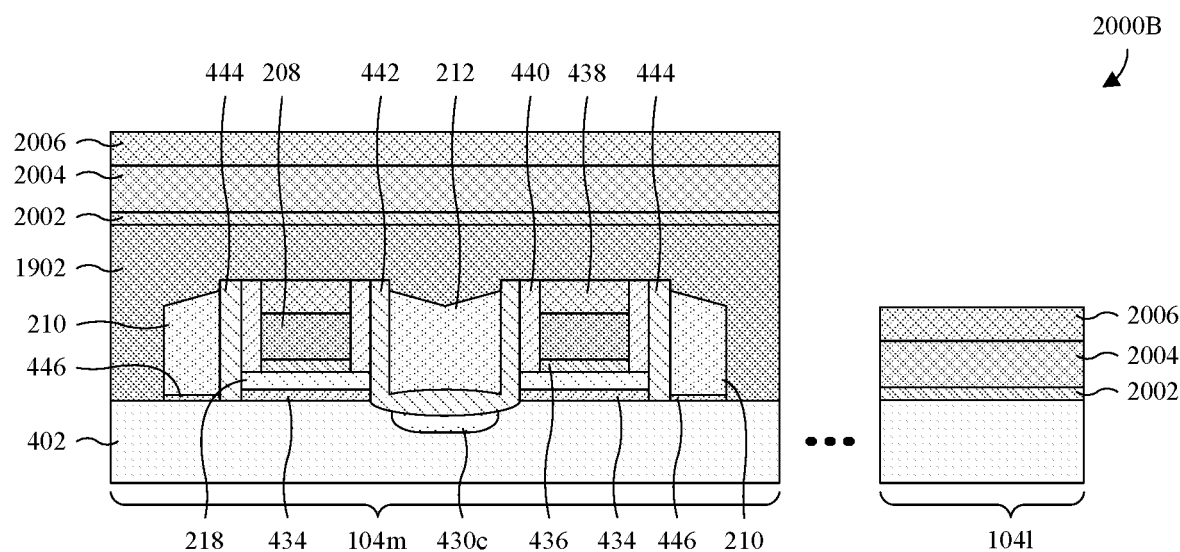

As illustrated by the cross-sectional views 2000A, 2000B of FIGS. 20A and 20B, a logic gate dielectric layer 2002, a logic gate electrode layer 2004, and a logic gate hard mask layer 2006 are formed stacked on the semiconductor memory and logic regions 104*m*, 104*l*. The logic gate dielectric layer 2002 overlies the memory hard mask 1902 and the semiconductor logic region 104*l*, the logic gate electrode layer 2004 overlies the logic gate dielectric layer 2002, and the logic gate hard mask layer 2006 overlies the logic gate electrode layer 2004. The logic gate electrode layer 2004 may be or comprise, for example, metal, doped polysilicon, some other suitable conductor(s), or some other suitable material, and/or may, for example, be formed by CVD, PVD, electroless plating, electroplating, or some other suitable deposition or plating process(es). The logic gate dielectric layer 2002 may be or comprise, for example, silicon oxide, silicon nitride, a high κ dielectric, some other suitable dielectric(s), or any combination of the foregoing. The logic gate hard mask layer 2006 may be or comprise, for example, silicon oxide, silicon nitride, some other suitable dielectric(s), or any combination of the foregoing. Further, the logic gate dielectric layer 2002 and the logic gate hard mask layer 2006 may, for example, be formed by CVD, PVD, or some other suitable deposition process(es).

Figure 21A:
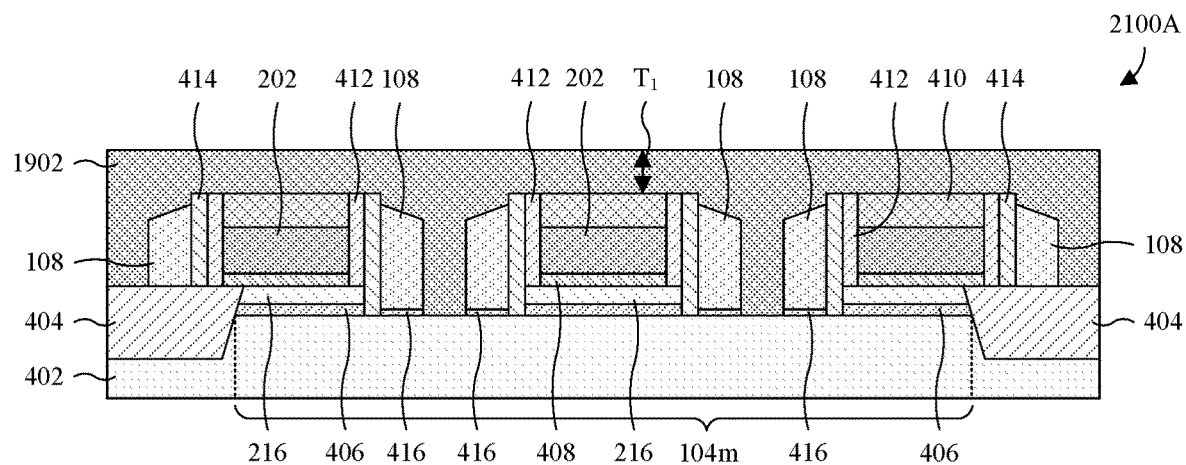
Figure 21B:
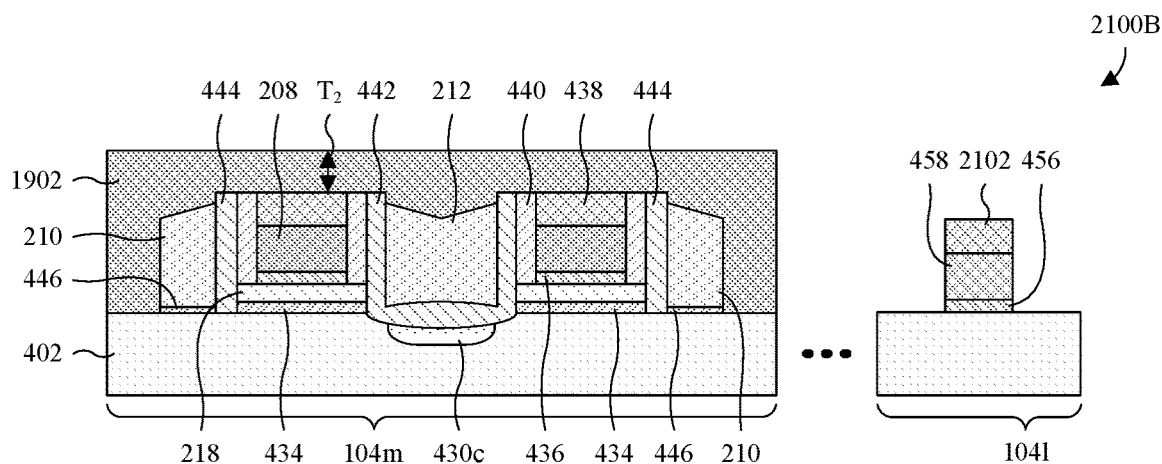

As illustrated by the cross-sectional views 2100A, 2100B of FIGS. 21A and 21B, the logic gate dielectric layer 2002 (see FIGS. 20A and 20B), the logic gate electrode layer 2004 (see FIGS. 20A and 20B), and the logic gate hard mask layer 2006 (see FIGS. 20A and 20B) are patterned. The patterning removes the logic gate dielectric layer 2002, the logic gate electrode layer 2004, and the logic gate hard mask layer 2006 from the semiconductor memory region 104*m*, and defines a logic gate dielectric layer 456, a logic gate electrode 458, and a logic gate hard mask 2102 stacked on the semiconductor logic region 104*l*. The logic gate dielectric layer 456 overlies the semiconductor logic region 104*l*, the logic gate electrode 458 overlies the logic gate dielectric layer 456, and the logic gate hard mask 2102 overlies the logic gate electrode 458. The patterning may, for example, be performed by a photolithography/etching process or some other suitable patterning process(es).

The memory hard mask 1902 protects the structure on the semiconductor memory region 104*m* from damage during the patterning of the logic gate dielectric layer 2002, the logic gate electrode layer 2004, and the logic gate hard mask layer 2006. Further, in some embodiments, the memory hard mask 1902 is partially removed, such that the first thickness $T_1$ of the memory hard mask 1902 directly over the test-device control gate hard mask 410 and the second thickness $T_2$ of the memory hard mask 1902 directly over the memory control gate hard masks 438 are reduced. Since the test-device control gate hard mask 410 has a cell-like top layout, the first thickness $T_1$ of the memory hard mask 1902 is large and the same or substantially the same as the second thickness $T_2$ of the memory hard mask 1902. See the above discussion regarding FIGS. 16A and 16B through FIGS. 18A and 18B for an explanation as to why this is. As such, the memory hard mask 1902 is not completely removed from the test-device control gate hard mask 410, and the first thickness $T_1$ is sufficient to protect the test-device control gate hard mask 410, during the patterning.

Figure 22A:
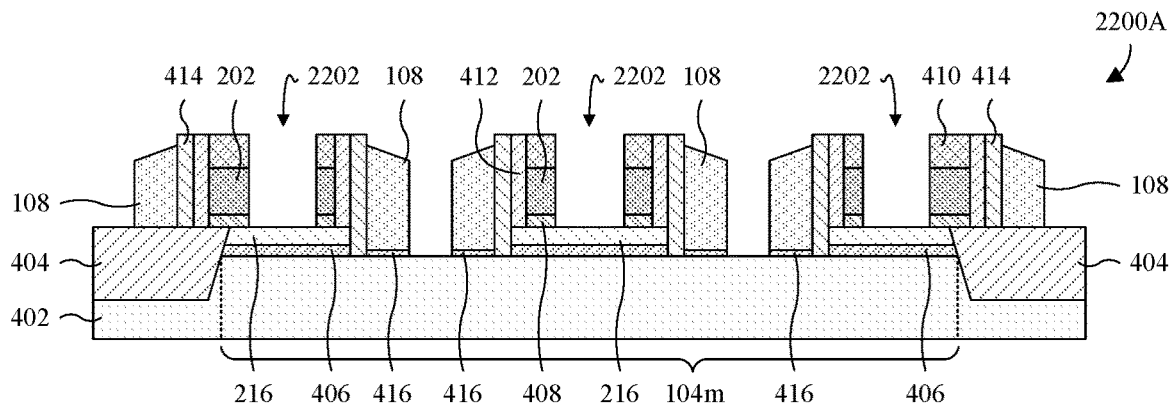
Figure 22B:
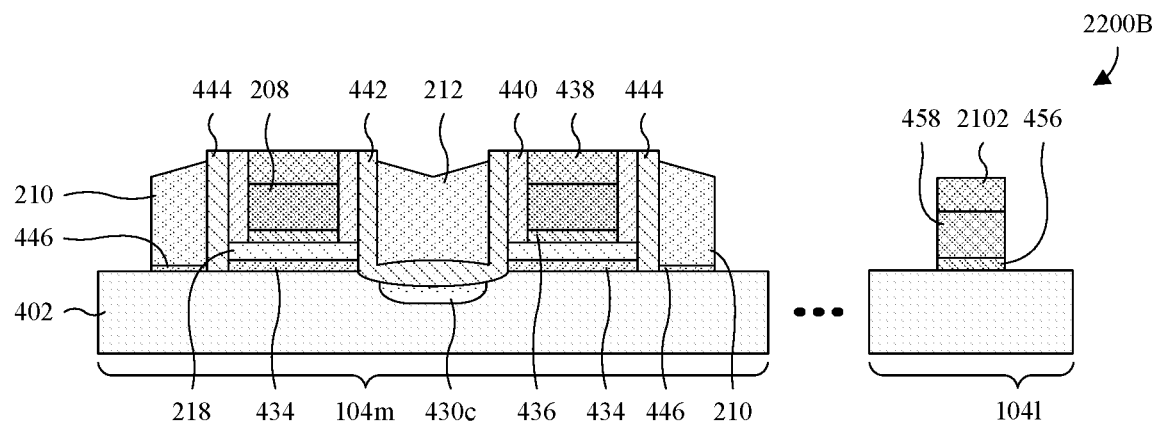

As illustrated by the cross-sectional views 2200A, 2200B of FIGS. 22A and 22B, the memory hard mask 1902 (see FIGS. 21A and 21B) is removed. The removal may be performed by an etching process or some other suitable removal process(es).

Also illustrated by the cross-sectional views 2200A, 2200B of FIGS. 22A and 22B, the test-device control gate hard mask 410, the test-device control gate electrode 202, and the test-device control gate dielectric layer 408 are patterned to define a plurality of contact openings 2202 exposing the test-device floating gate electrode 216. The patterning may, for example, be performed by a photolithography/etching process or some other suitable patterning process(es).

Figure 23A:
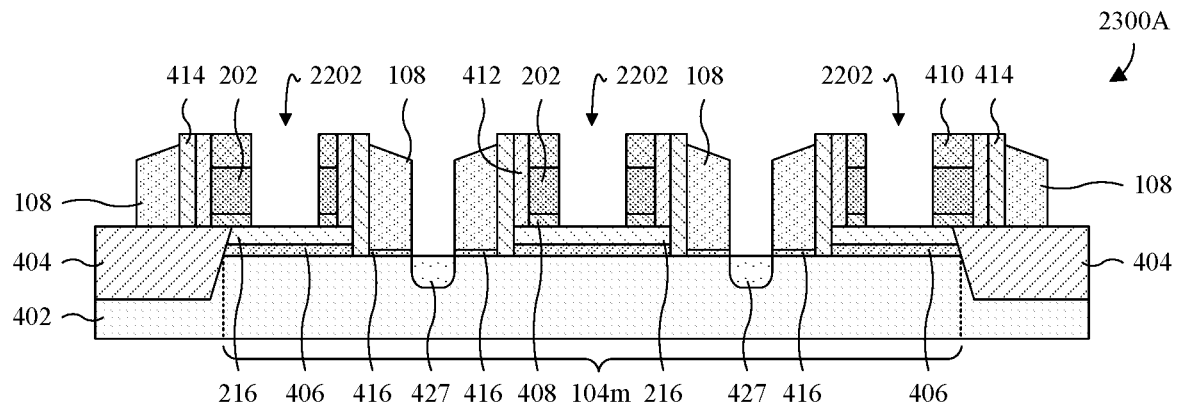
Figure 23B:
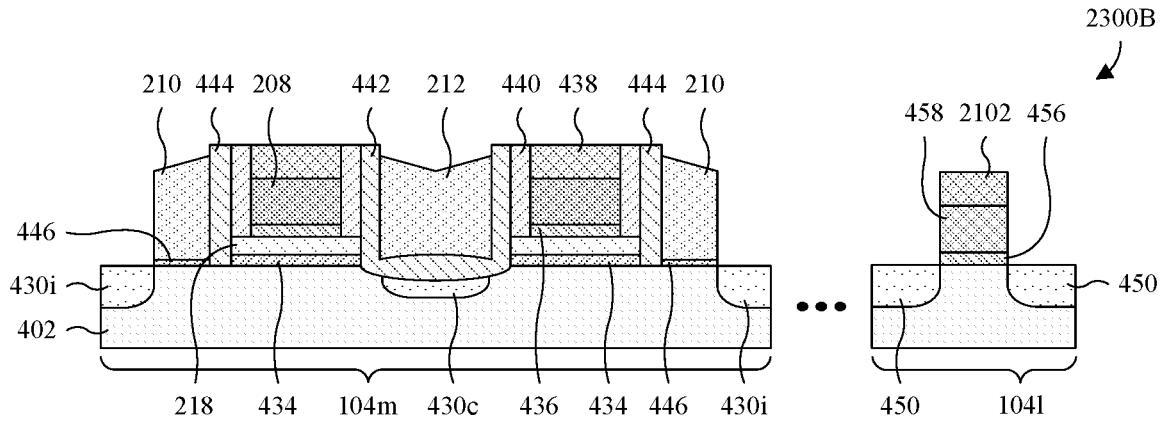

As illustrated by the cross-sectional views 2300A, 2300B of FIGS. 23A and 23B, a pair of individual memory source/drain regions 430i and a pair of logic source/drain regions 450 are formed in a top surface of the semiconductor substrate 402. See FIG. 23B. The individual memory source/drain regions 430i respectively border the memory select gate electrodes 210 and are spaced from the common memory source/drain region 430c respectively by the memory floating gate electrodes 218. Further, the individual memory source/drain regions 430i have the same doping type as the common memory source/drain region 430c. The logic source/drain regions 450 respectively border opposite sidewalls of the logic gate electrode 458 and have a common doping type. In some embodiments, a plurality of test-device source/drain regions 427 are also formed in a top surface of the semiconductor substrate 402. The test-device source/drain regions 427 are each between two opposing gate electrodes of the test-device select gate electrodes 108 and have a common doping type. In other embodiments, the test-device source/drain regions 427 are omitted. The individual memory source/drain regions 430i, the logic source/drain regions 450, and the test-device source/drain regions 427 may, for example, be formed by ion implantation or some other suitable doping process(es).

Figure 24A:
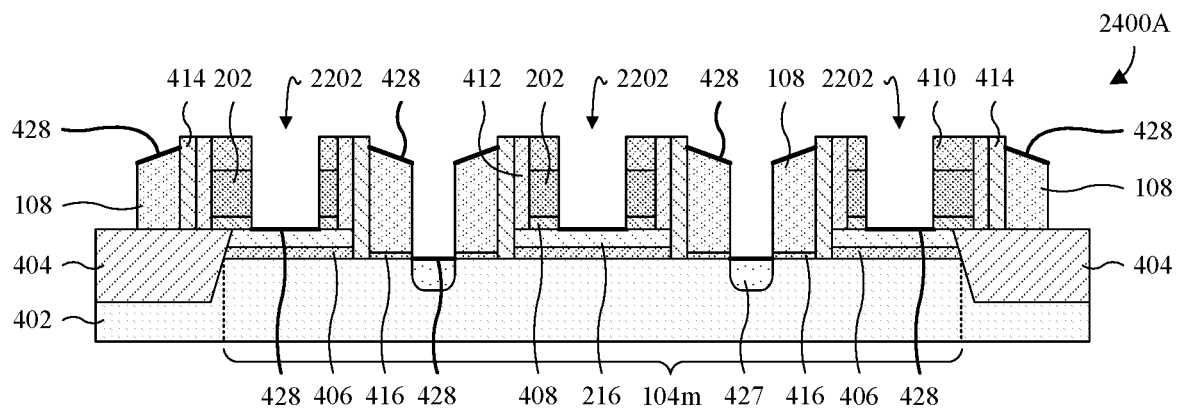
Figure 24B:
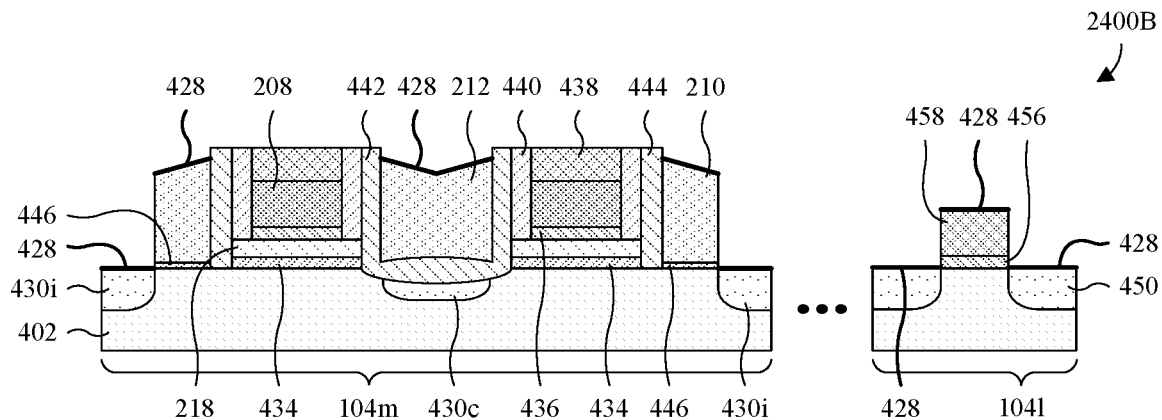

As illustrated by the cross-sectional views 2400A, 2400B of FIGS. 24A and 24B, the logic gate hard mask 2102 (see, e.g., FIG. 23B) is removed from the logic gate electrode 458. Such removal may, for example, be performed by an etching process or some other suitable removal process(es).

Also illustrated by the cross-sectional views 2400A, 2400B of FIGS. 24A and 24B, silicide pads 428 are formed on top surfaces of the test-device select gate electrodes 108, top surfaces of the test-device floating gate electrode 216 exposed through the contact openings 2202, top surfaces of the individual memory source/drain regions 430i, top surfaces of the memory select gate electrodes 210, a top surface of the memory erase gate electrode 212, top surfaces of the logic source/drain regions 450, and a top surface of the logic gate electrode 458. In some embodiments where the test-device source/drain regions 427 are present, the silicide pads 428 are also formed on top surfaces of the test-device source/drain regions 427, between the test-device select gate electrodes 108. For ease of illustration, only some of the silicide pads 428 are labeled 428. The silicide pads 428 may, for example, be nickel silicide or some other suitable silicide(s), and/or may, for example, be formed a salicide process or some other suitable process(es) for forming silicide.

Figure 25A:
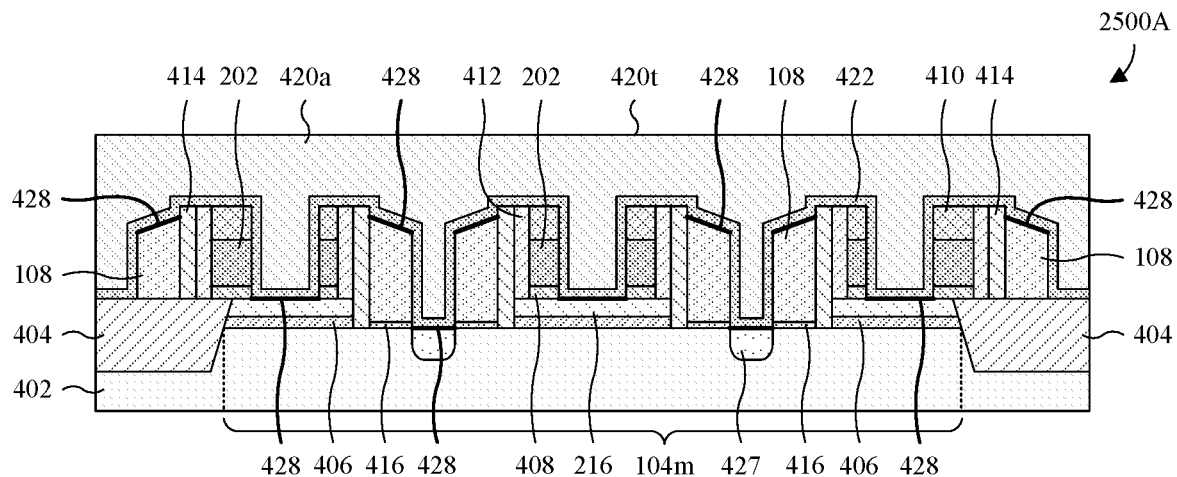
Figure 25B:
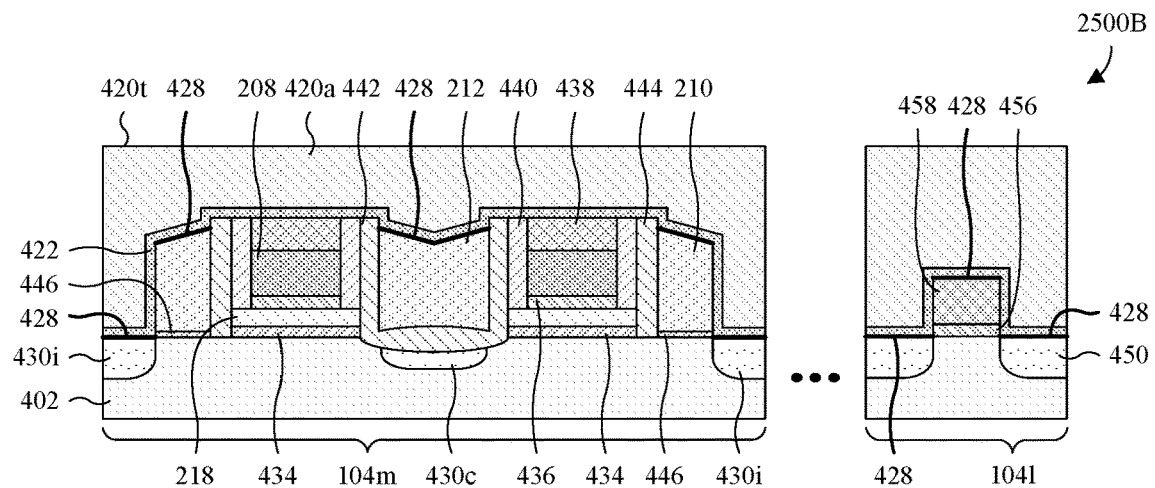

As illustrated by the cross-sectional views 2500A, 2500B of FIGS. 25A and 25B, a contact etch stop layer 422 is formed covering and conforming to the structure of FIGS. 24A and 24B in some embodiments. The contact etch stop layer 422 may, for example, be silicon nitride, silicon oxynitride, silicon carbide, some other suitable dielectric(s), or any combination of the foregoing. Further, the contact etch stop layer 422 may, for example, be formed by conformal deposition, and/or may, for example, be formed by CVD, PVD, some other suitable deposition process(es), or any combination of the foregoing.

Also illustrated by the cross-sectional views 2500A, 2500B of FIGS. 25A and 25B, a pre-wire dielectric layer 420a is formed covering the contact etch stop layer 422 and with a top surface 420t that is planar or substantially planar. The pre-wire dielectric layer 420a may be or comprise, for example, silicon oxide, a low κ dielectric, some other suitable dielectric(s), or any combination of the foregoing. In some embodiments, a process for forming the pre-wire dielectric layer 420a comprises depositing the pre-wire dielectric layer 420a, and subsequently performing a planarization into the top surface 420t of the pre-wire dielectric layer 420a. The depositing may, for example, be performed by CVD, PVD, or some other suitable deposition process(es). The planarization may, for example, be performed by a CMP or some other suitable planarization process(es).

Figure 26A:
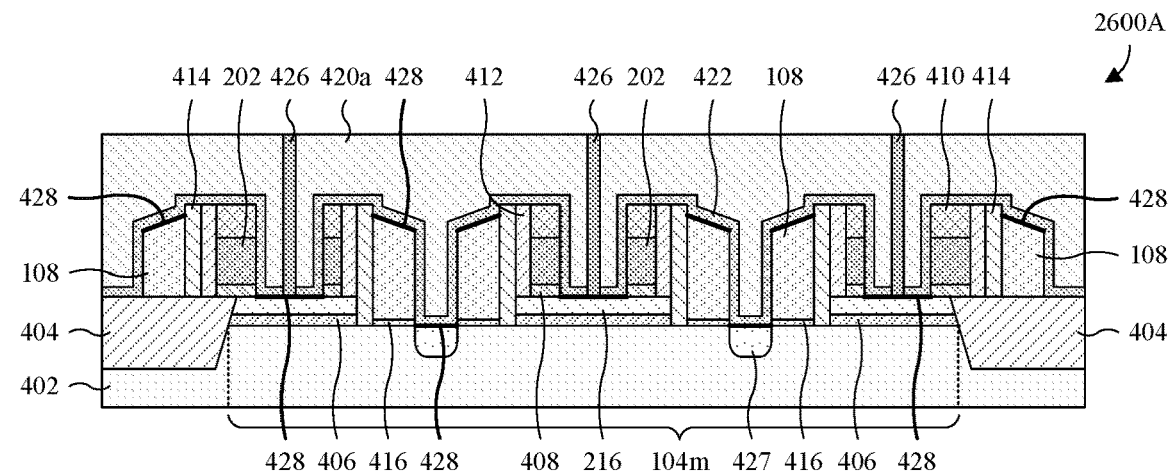
Figure 26B:
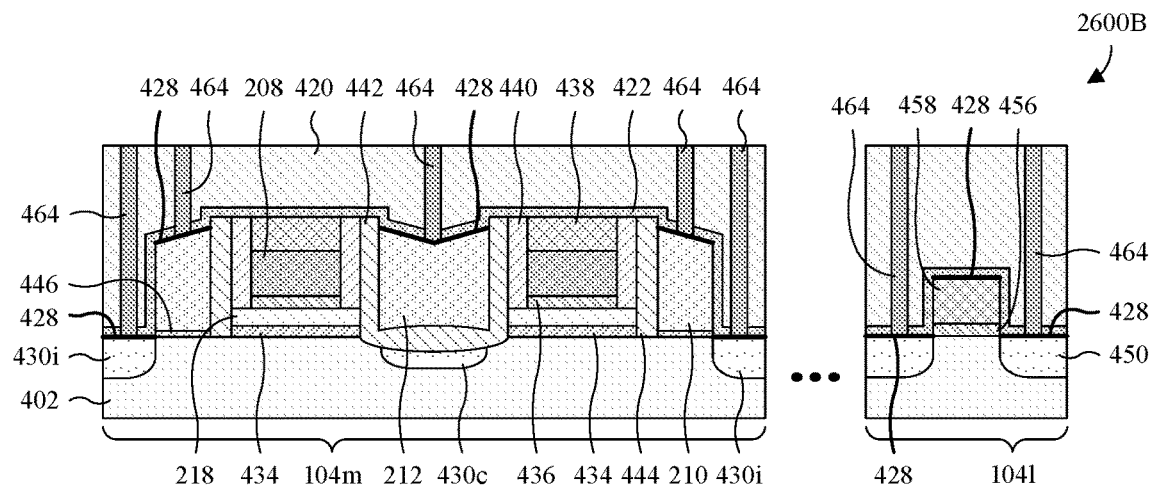

As illustrated by the cross-sectional views 2600A, 2600B of FIGS. 26A and 26B, contact vias 426 are formed extending from a top surface of the pre-wire dielectric layer 420a, through the pre-wire dielectric layer 420a, to contact with the test-device floating gate electrode 216. See FIG. 26A. Further, additional contact vias 464 are formed extending from the top surface of the pre-wire dielectric layer 420a, through the pre-wire dielectric layer 420a, to the individual memory source/drain regions 430i, the memory select gate electrodes 210, the memory erase gate electrode 212, and the logic source/drain regions 450. See FIG. 26B. The contact vias 426 and the additional contact vias 464 may be or comprise, for example, tungsten, aluminum copper, copper, aluminum, or some other suitable conductor(s).

In some embodiments, a process for forming the contact vias 426 and the additional contact vias 464 comprises forming a photoresist layer covering the pre-wire dielectric layer 420a. The photoresist layer is patterned with a layout of the contact vias 426 and the additional contact vias 464, and an etch is performed into the pre-wire dielectric layer 420a with the patterned photoresist layer in place to form contact openings corresponding to the contact vias 426 and the additional contact vias 464. The patterning may, for example, be performed by photolithography or some other suitable patterning process(es). A conductive layer is deposited covering the pre-wire dielectric layer 420a and filling the contact openings, and a planarization is performed into the conductive layer until the pre-wire dielectric layer 420a is reached. The conductive layer may, for example, be deposited by CVD, PVD, electroless plating, electroplating, or some other suitable deposition or plating process(es). The planarization may, for example, be performed by a CMP or some other suitable planarization process(es).

Figure 27A:
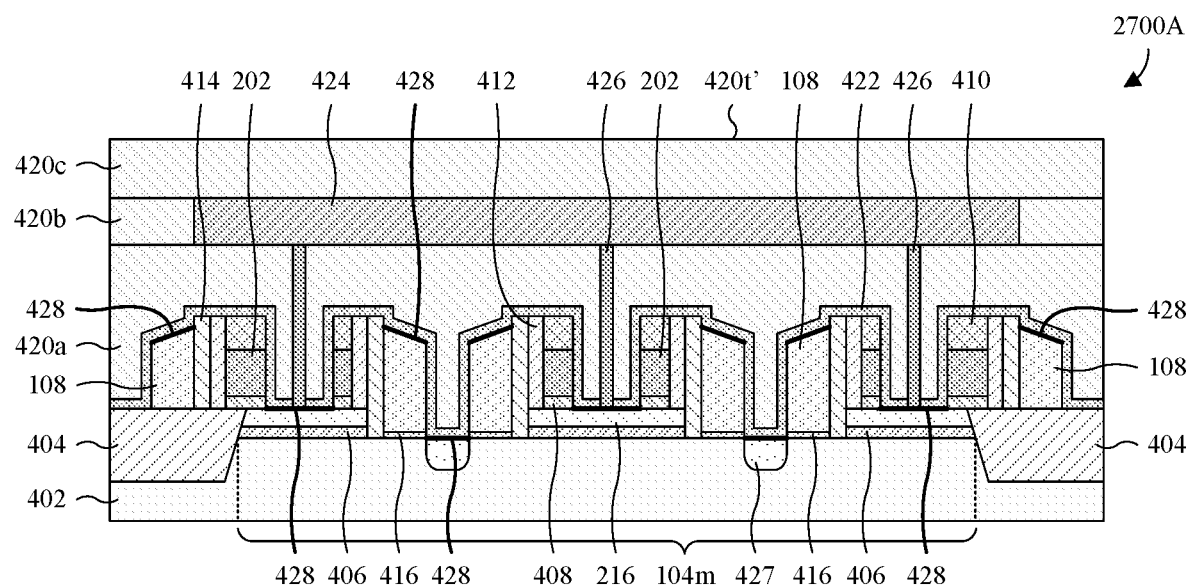
Figure 27B:
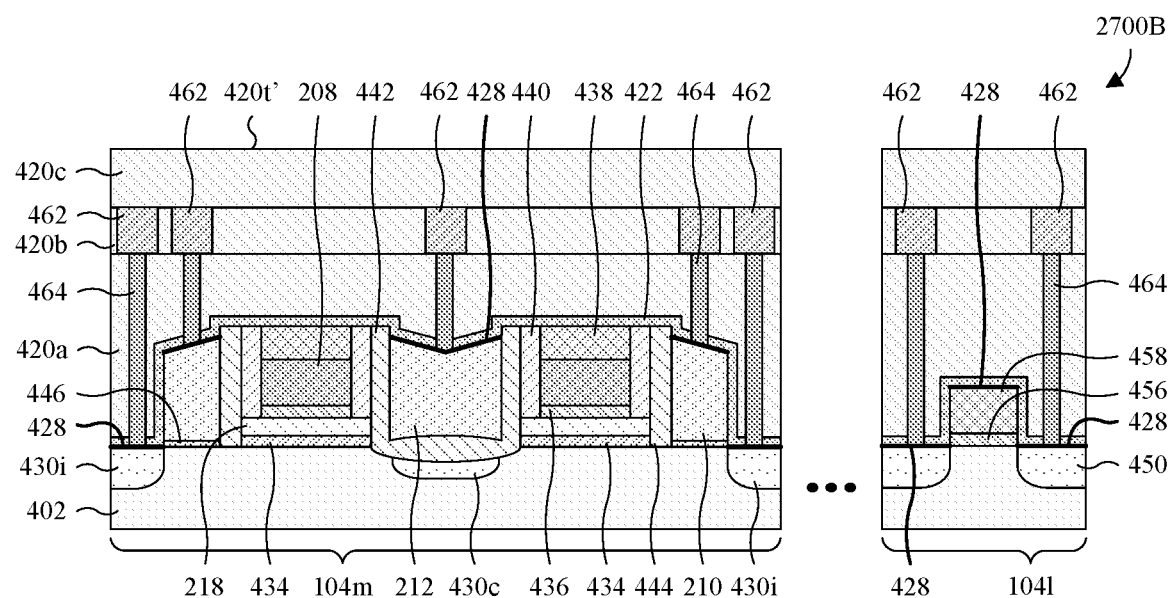

As illustrated by the cross-sectional views 2700A, 2700B of FIGS. 27A and 27B, a wire 424 is formed overlying and contacting the contact vias 426. See FIG. 27A. Further, a plurality of additional wires 462 are respectively formed overlying and contacting the additional contact vias 464. See FIG. 27B. For ease of illustration only some of the additional wires 462 are labeled 462. The wire 424 and the additional wires 462 may be or comprise, for example, aluminum copper, copper, aluminum, or some other suitable conductor(s).

In some embodiments, a process for forming the wire 424 and the additional wires 462 comprises depositing a first ILD layer 420b covering the pre-wire dielectric layer 420a, the contact vias 426, and the additional contact vias 464. The depositing of the first ILD layer 420b may, for example, be performed by CVD, PVD, or some other suitable deposition process(es). The first ILD layer 420b is planarized to flatten a top surface of the first ILD layer 420b, and the first ILD layer 420b is patterned to form a plurality of wire openings with a layout of the wire 424 and the additional wires 462. The patterning may, for example, be performed by a photolithography/etching process or some other suitable patterning process(es). A conductive layer is formed covering the first ILD layer 420b and filling wire openings, and another planarization is performed into the conductive layer to form the wire 424 and the additional wires 462 in the wire openings. The depositing of the conductive layer may, for example, be performed by CVD, PVD, electroless plating, electroplating, or some other suitable deposition or plating process(es). The planarizations of the first ILD layer 420b and the conductive layer may, for example, be performed by a CMP or some other suitable planarization process.

Also illustrated by the cross-sectional views 2700A, 2700B of FIGS. 27A and 27B, a second ILD layer 420c is formed covering the first ILD layer 420b, the wire 424, and the additional wires 462. Further, the second ILD layer 420c is formed with a top surface 420t' that is planar or substantially planar. The second ILD layer 420c may be or comprise, for example, silicon oxide, a low κ dielectric, some other suitable dielectric(s), or any combination of the foregoing. In some embodiments, a process for forming the second ILD layer 420c comprises depositing the second ILD layer 420c, and subsequently performing a planarization into the top surface 420t' of the second ILD layer 420c. The depositing may, for example, be performed by CVD, PVD, or some other suitable deposition process(es). The planarization may, for example, be performed by a CMP or some other suitable planarization process(es).

Figure 28:
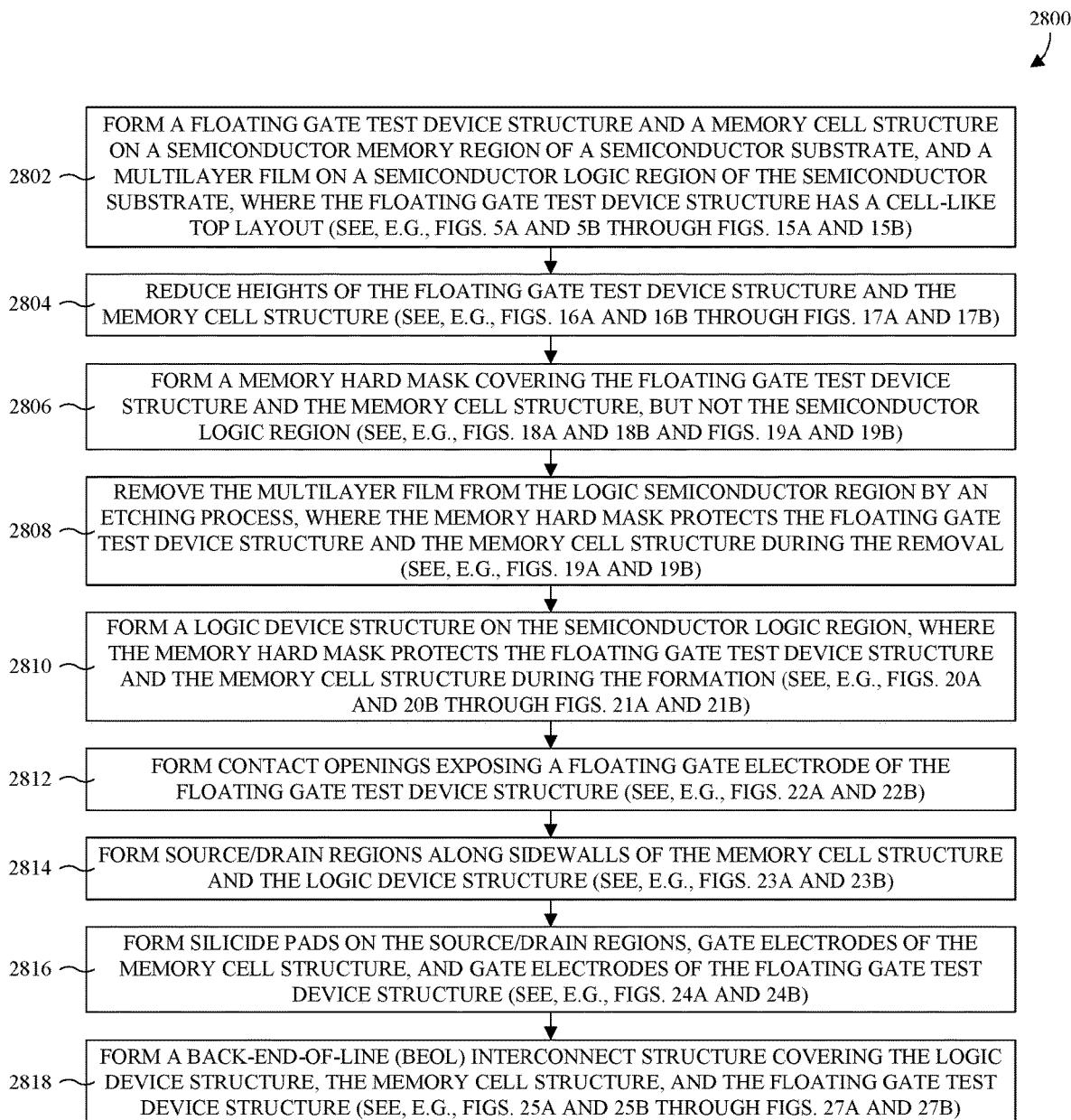
FIG. 28 illustrates a flowchart of some embodiments of the method of FIGS. 5A and 5B through FIGS. 27A and 27B.

With reference to FIG. 28, a flowchart 2800 of some embodiments of the method of FIGS. 5A and 5B through FIGS. 27A and 27B is provided. The method may, for example, be employed to form the ICs of any one of FIGS. 1A, 1B, 2A, 2B, 3A, 3B, and 4A-4D.

At 2802, a floating gate test device structure and a memory cell structure are formed on a semiconductor memory region of a semiconductor substrate. The floating gate test device structure has a cell-like top layout, examples of which are shown in FIGS. 2A, 2B, 3A, and 3B. Further, a multilayer film is formed on a semiconductor logic region of the semiconductor substrate. See, for example, FIGS. 5A and 5B through FIGS. 15A and 15B.

At 2804, heights of the floating gate test device structure and the memory cell structure are reduced. See, for example, FIGS. 16A and 16B through FIGS. 17A and 17B.

At 2806, a memory hard mask is formed covering the floating gate test device structure and the memory cell structure, but not a semiconductor logic region. See, for example, FIGS. 18A and 18B and FIGS. 19A and 19B.

At 2808, the multilayer film is removed from the semiconductor logic region by an etching process, and the memory hard mask protects the floating gate test device structure and the memory cell structure during the removal. See, for example, FIGS. 19A and 19B.

At 2810, a logic device structure is formed on the semiconductor logic region, and the memory hard mask protects the floating gate test device structure and the memory cell structure during the formation. See, for example, FIGS. 20A and 20B through FIGS. 21A and 21B.

At 2812, contact openings are formed exposing a floating gate electrode of the floating gate test device structure. See, for example, FIGS. 22A and 22B.

At 2814, source/drain regions are formed along sidewalls of the memory cell structure and the logic device structure. See, for example, FIGS. 23A and 23B.

At 2816, silicide pads are formed on the source/drain regions, gate electrodes of the memory cell structure, and gate electrodes of the floating gate test device structure. See, for example, FIGS. 24A and 24B.

At 2818, a BEOL interconnect structure is formed covering the logic device structure, the memory cell structure, and the floating gate test device structure. See, for example, FIGS. 25A and 25B through FIGS. 27A and 27B.

While the flowchart 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 29A and 29B through FIGS. 41A and 41B, a series of cross-sectional views 2900A, 2900B through 4100A, 4100B of some alternative embodiments of the method of FIGS. 5A and 5B through FIGS. 27A and 27B is provided in which the method has a gate replacement process. Figures with a suffix of "A" are taken along line A-A' in FIG. 1A, 1B, 2A, 2B, 3A, 3B, or any combination of the foregoing. Figures with a suffix of "B" are taken along line C-C' in FIG. 2A, 2B, 3A, 3B, or any combination of the foregoing.

Figure 29A:
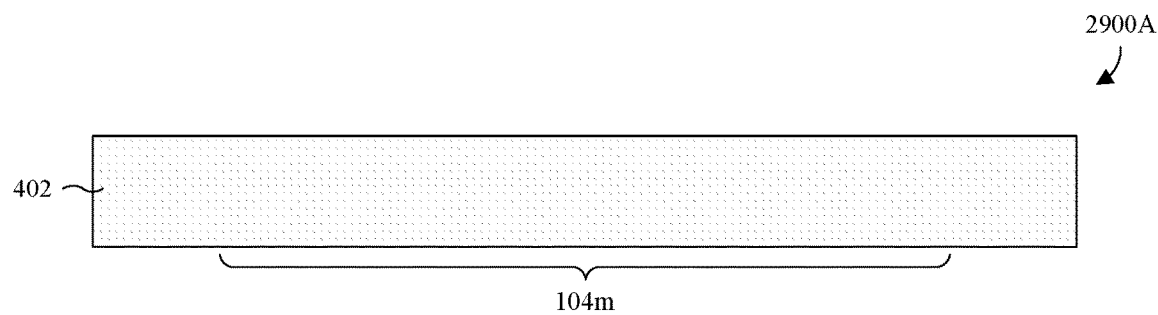
Figure 29B:
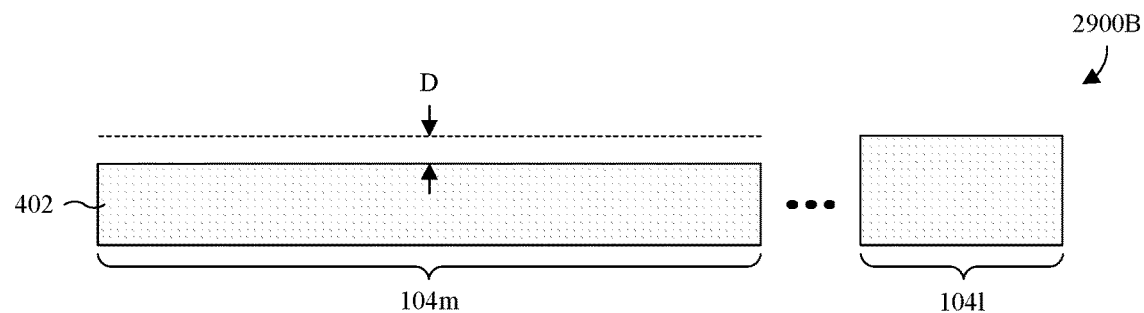

As illustrated by the cross-sectional views 2900A, 2900B of FIGS. 29A and 29B, a top surface portion of the semiconductor substrate 402 at the semiconductor memory region 104m is recessed below a top surface portion of the semiconductor substrate 402 at the semiconductor logic region 104l by a distance D. In some embodiments, a process for performing the recessing comprises forming a mask covering the semiconductor logic region 104l, but not the semiconductor memory region 104m, and subsequently performing oxidation with the mask in place. The oxidation consumes the top surface portion of the semiconductor substrate 402 at the semiconductor memory region 104m, thereby recessing the top surface portion of the semiconductor substrate 402 at the semiconductor memory region 104m. The mask and oxide formed by the oxidation are then removed by an etching process or some other suitable removal process(es). The mask may be or comprise, for example, silicon nitride or some other material(s) suitable for protecting the semiconductor logic region 104l from oxidation.

Figure 30A:
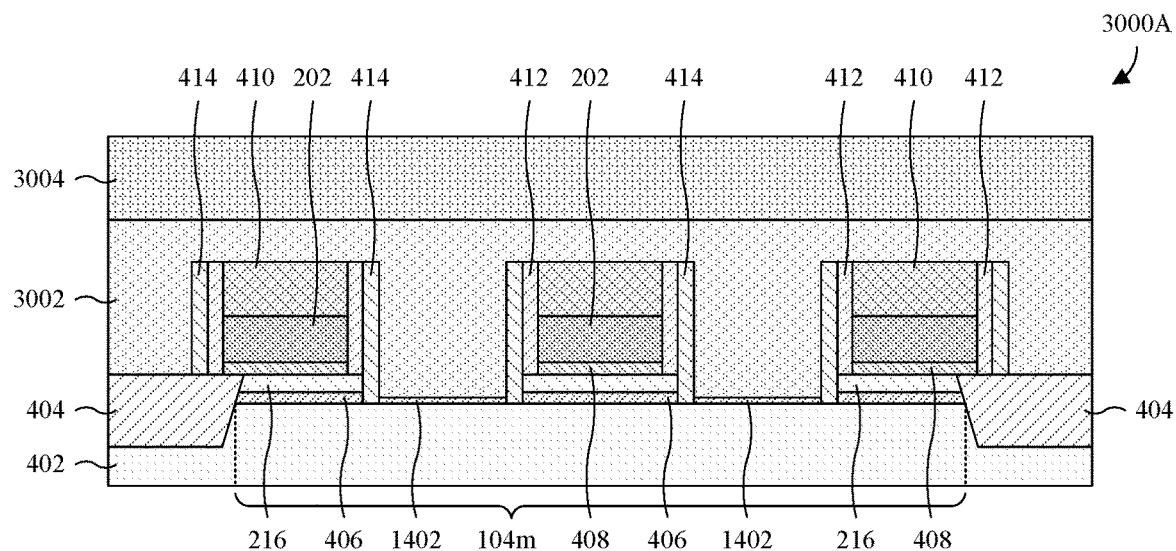
Figure 30B:
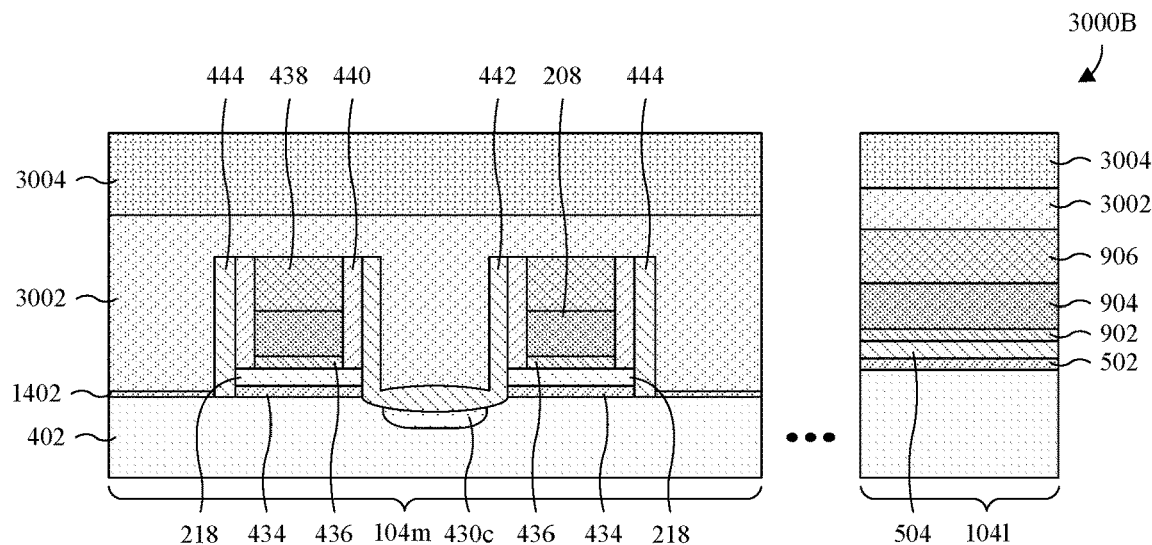

As illustrated by the cross-sectional views 3000A, 3000B of FIGS. 30A and 30B, the acts at FIGS. 5A and 5B through FIGS. 13A and 13B are performed. By performing these acts, the following features are formed on the semiconductor substrate 402. The test-device floating gate dielectric layer 406, the test-device floating gate electrode 216, the test-device control gate dielectric layer 408, the test-device control gate electrode 202, and the test-device control gate hard mask 410 are formed stacked on the semiconductor memory region 104m. See FIG. 30A. The memory floating gate dielectric layers 434, the memory floating gate electrodes 218, the memory control gate dielectric layers 436, the memory control gate electrodes 208, and the memory control gate hard masks 438 are formed stacked on the semiconductor memory region 104m. See FIG. 30B. The isolation structure 404, the common memory source/drain region 430c, the test-device control gate spacer 412, the test-device floating gate spacer 414, the memory control gate spacer 440, the memory erase gate dielectric layer 442, and the memory floating gate spacer 444 are formed on the semiconductor memory region 104m. The lower pad layer 502, the upper pad layer 504, the control gate dielectric layer 902, the control gate electrode layer 904, and the control gate hard mask layer 906 are formed on the semiconductor logic region 104l.

Also illustrated by the cross-sectional views 3000A, 3000B of FIGS. 30A and 30B, the select gate dielectric layer 1402 is formed on the semiconductor substrate 402, to the sides of the test-device floating gate electrode 216 and to the sides of the memory floating gate electrodes 218. The select gate dielectric layer 1402 may be or comprise, for example, silicon oxide or some other suitable dielectric(s). Further, the select gate dielectric layer 1402 may be formed by, for example, thermal oxidation or some other suitable deposition process(es).

Also illustrated by the cross-sectional views 3000A, 3000B of FIGS. 30A and 30B, a gate electrode layer 3002 and an etch-back layer 3004 are formed stacked over the select gate dielectric layer 1402, the test-device control gate hard mask 410, the memory control gate hard masks 438, and the control gate hard mask layer 906. The gate electrode layer 1404 may be or comprise, for example, metal, doped polysilicon, or some other suitable conductor(s). The etch-back layer 3004 may be, for example, a flowable material, an organic material, an ARC, some other suitable material(s), or any combination of the foregoing.

In some embodiments, a process for forming the gate electrode layer 3002 comprising depositing the gate electrode layer 3002 and subsequently performing a planarization into a top surface of the gate electrode layer 3002. The gate electrode layer 1404 may be deposited by, for example, CVD, PVD, electroless plating, electroplating, or some other suitable deposition or plating process(es). The gate electrode layer 1404 may, for example, be planarized by a CMP or some other suitable planarization process. In some embodiments, a process for forming the etch-back layer 3004 comprises depositing the etch-back layer 3004 by, for example, spin on coating or some other suitable deposition process(es).

Figure 31A:
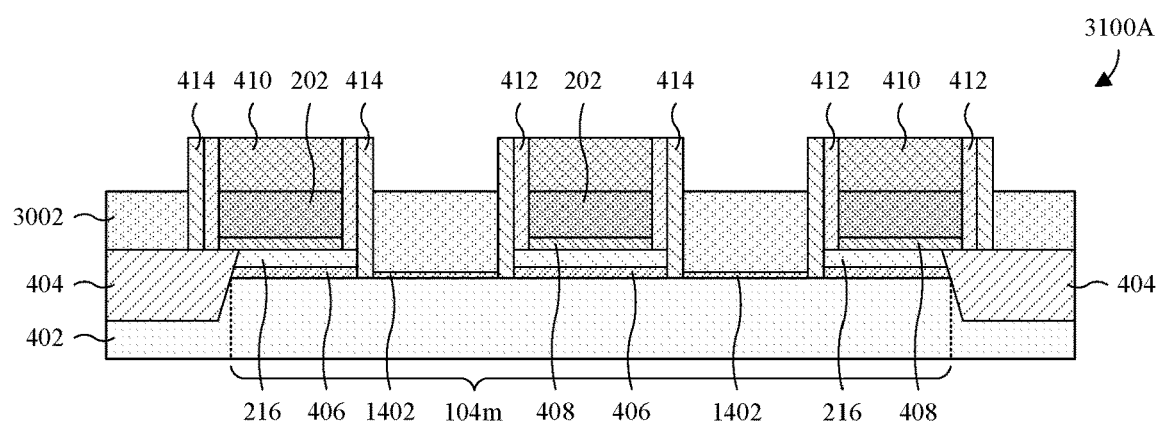
Figure 31B:
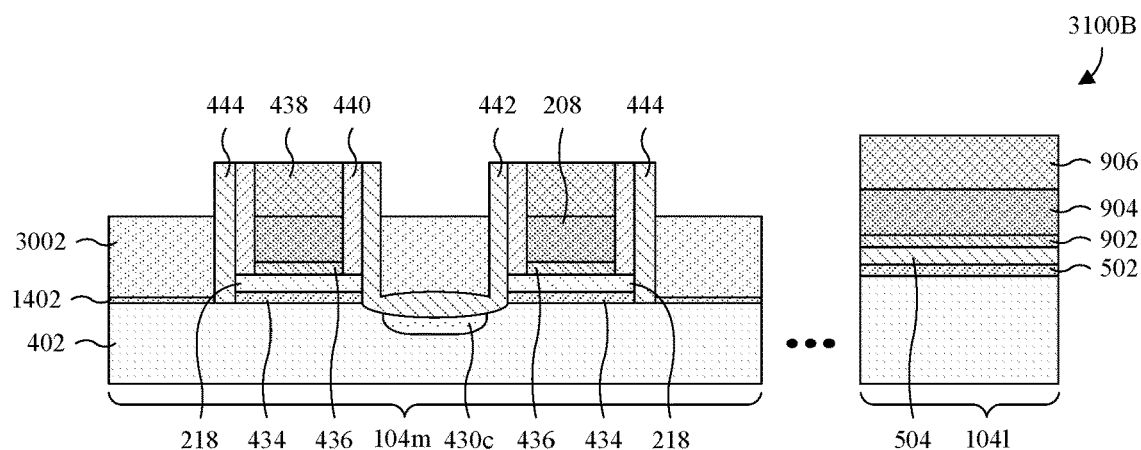

As illustrated by the cross-sectional views 3100A, 3100B of FIGS. 31A and 31B, an etch back is performed into the etch-back layer 3004 and the gate electrode layer 3002. The etch back etches the etch-back layer 3004 until the gate electrode layer 3002 is reached. Thereafter, the etch back etches the etch-back layer 3004 and the gate electrode layer 3002 in parallel until the etch-back layer 3004 is removed. Thereafter, the etch back continues until a top surface of the gate electrode layer 3002 is below a top surface of the test-device control gate hard mask 410 and/or top surfaces of the memory control gate hard masks 438. In some embodiments, the etch back continues until the top surface of the gate electrode layer 3002 is about even with a top surface of the test-device control gate electrode 202 and/or top surface of the memory control gate electrodes 208.

Figure 32A:
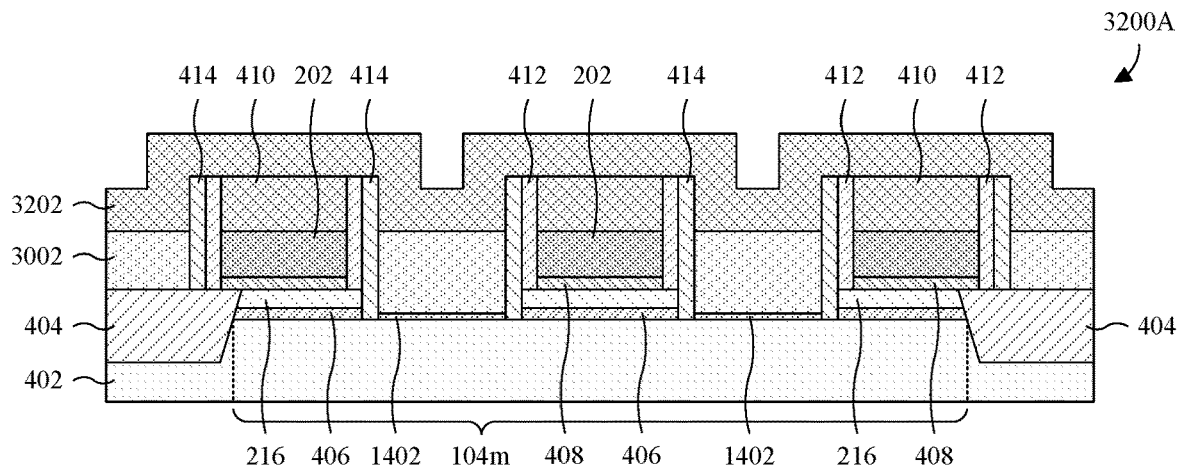
Figure 32B:
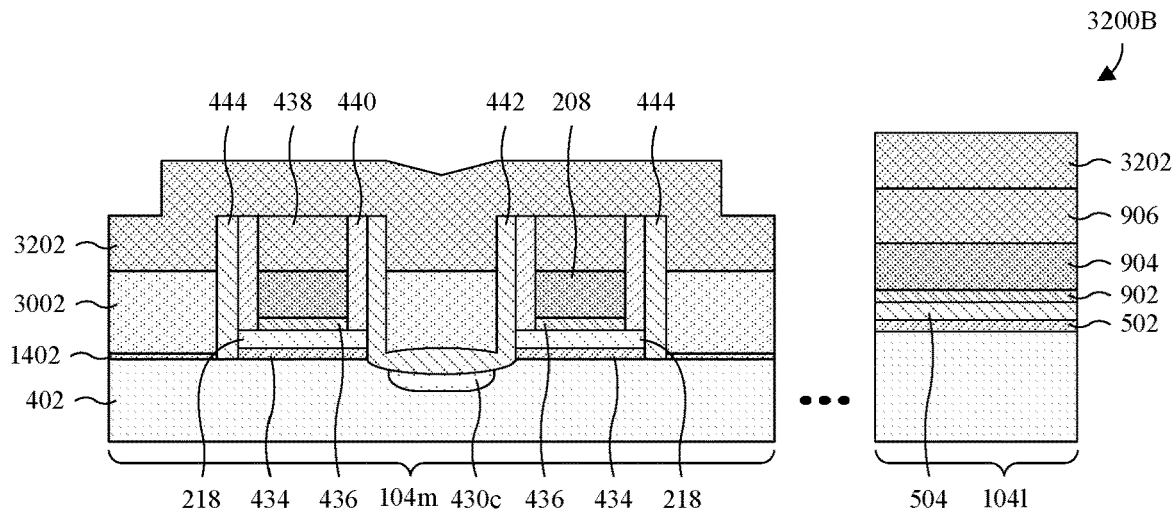

As illustrated by the cross-sectional views 3200A, 3200B of FIGS. 32A and 32B, a select gate hard mask layer 3202 is formed covering and lining the structure of FIGS. 31A and 31B over the gate electrode layer 3002. The select gate hard mask layer 3202 may be or comprise, for example, silicon nitride, silicon oxynitride, silicon oxide, some other suitable dielectric(s), or any combination of the foregoing. The select gate hard mask layer 3202 may be formed by, for example, CVD, PVD, electroless plating, electroplating, or some other suitable deposition or plating process(es).

Figure 33A:
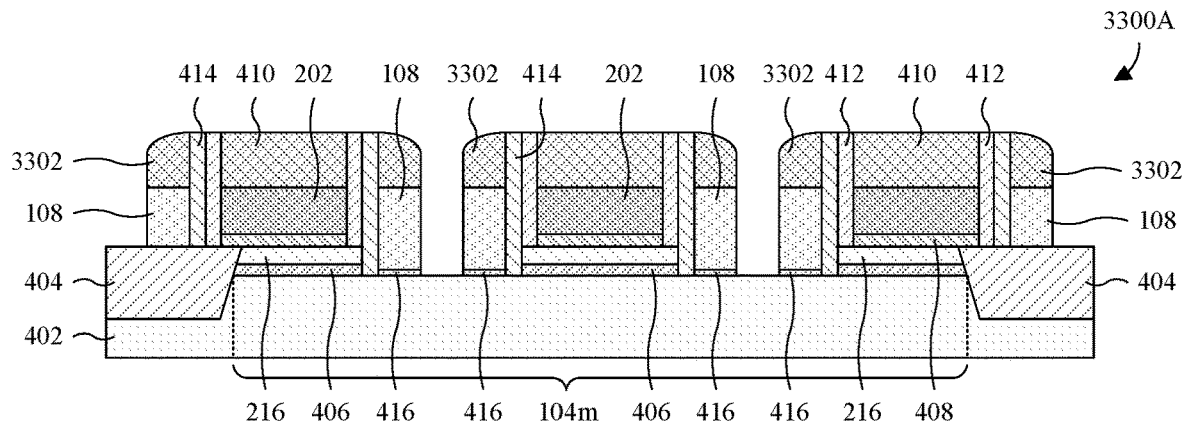
Figure 33B:
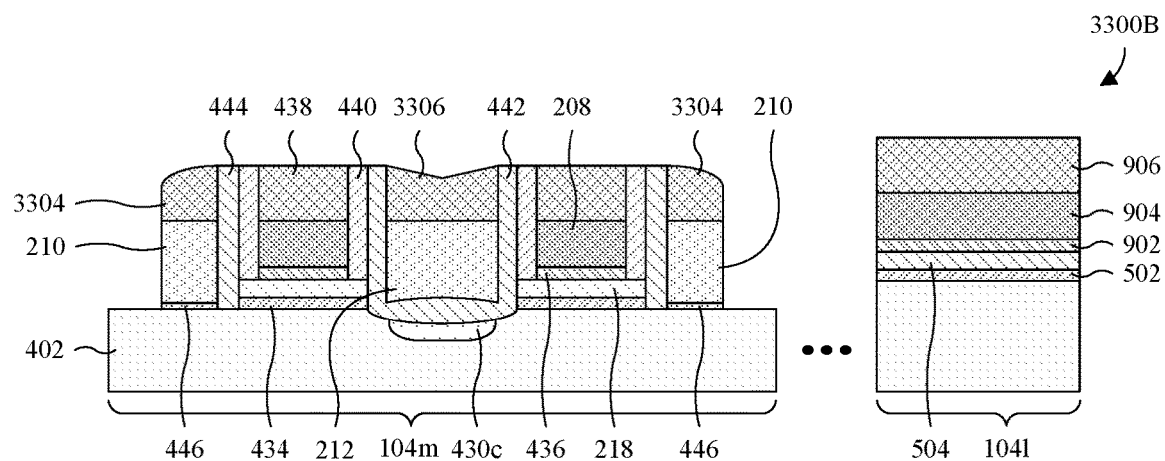

As illustrated by the cross-sectional views 3300A, 3300B of FIGS. 33A and 33B, the select gate dielectric layer 1402 (see FIGS. 32A and 32B), the gate electrode layer 3002 (see FIGS. 32A and 32B), and the select gate hard mask layer 3202 (see FIGS. 32A and 32B) are patterned to define test-device select gate dielectric layers 416, test-device select gate electrodes 108, and test-device select gate hard masks 3302. See FIG. 15A. The patterning further defines memory select gate dielectric layers 446, memory select gate electrodes 210, memory select gate hard masks 3304, a memory erase gate electrode 212, and a memory erase gate hard mask 3306. See FIG. 15B. The patterning may, for example, be performed by a photolithography/etching process or some other suitable patterning process(es).

The test-device select gate electrodes 108 respectively overlie the test-device select gate dielectric layers 416 and border the test-device floating gate spacer 414. Further, the test-device select gate hard masks 3302 respectively overlie the test-device select gate electrodes 108. The memory select gate electrodes 210 respectively overlie the memory select gate dielectric layers 446 and border the memory floating gate spacer 444. Further, the memory select gate hard masks 3304 respectively overlie the memory select gate electrodes 210. The memory erase gate electrode 212 overlies the common memory source/drain region 430c, and the memory erase gate hard mask 3306 overlies the memory erase gate electrode 212.

Figure 34A:
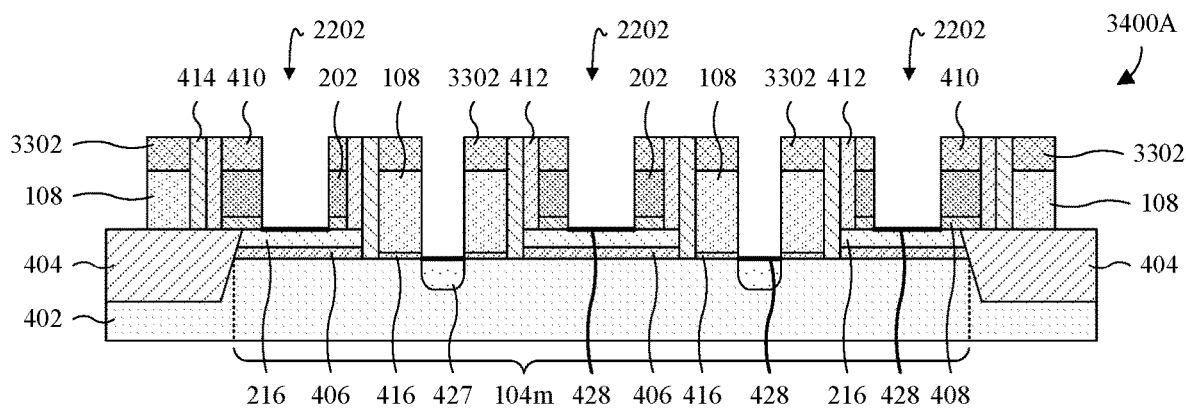
Figure 34B:
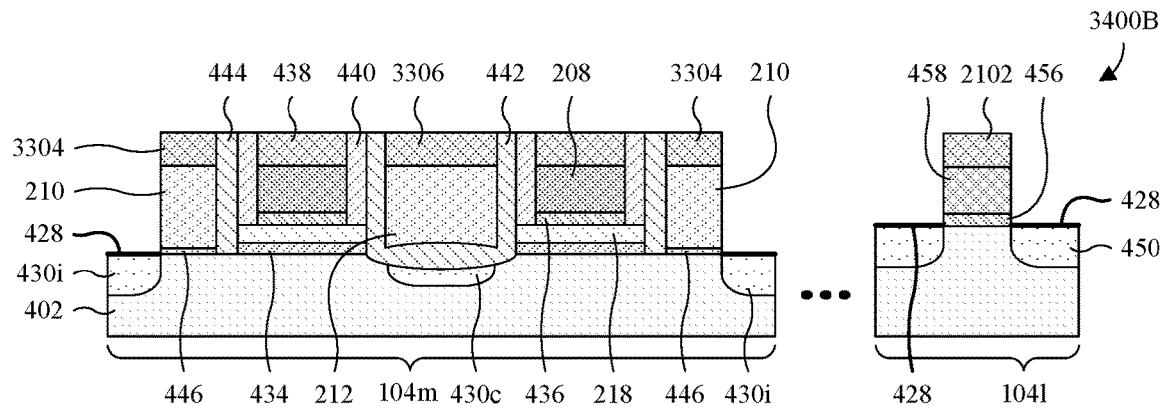

As illustrated by the cross-sectional views 3400A, 3400B of FIGS. 34A and 34B, the acts at FIGS. 16A and 16B through FIGS. 24A and 24B are performed. By performing the acts at FIGS. 16A and 16B through FIGS. 24A and 24B, top surfaces of the various hard masks (e.g., the test-device select gate hard masks 3302) are flattened. Further, by performing the acts at FIGS. 16A and 16B through FIGS. 24A and 24B, the following features are formed. Contact openings 2202 are formed in the test-device control gate hard mask 410, the test-device control gate electrode 202, and the test-device control gate dielectric layer 408. The logic gate dielectric layer 456, the logic gate electrode 458, and the logic gate hard mask 2102 are formed stacked on the semiconductor logic region 104l. The individual memory source/drain regions 430i, the logic source/drain regions 450, and the silicide pads 428 are formed. In some embodiments, the test-device source/drain regions 427 are formed. In other embodiments, the test-device source/drain regions 427 are omitted.

Figure 35A:
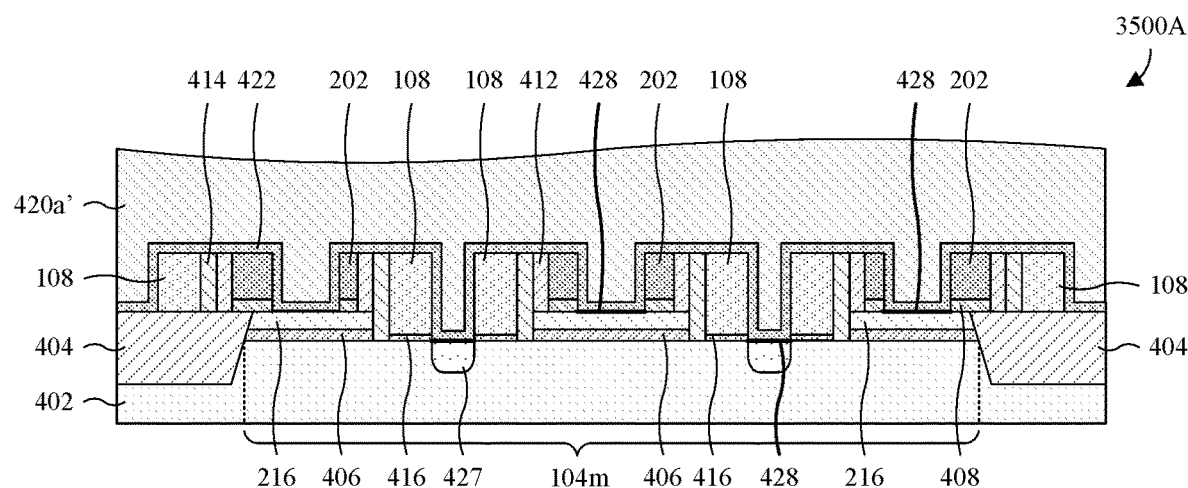
Figure 35B:
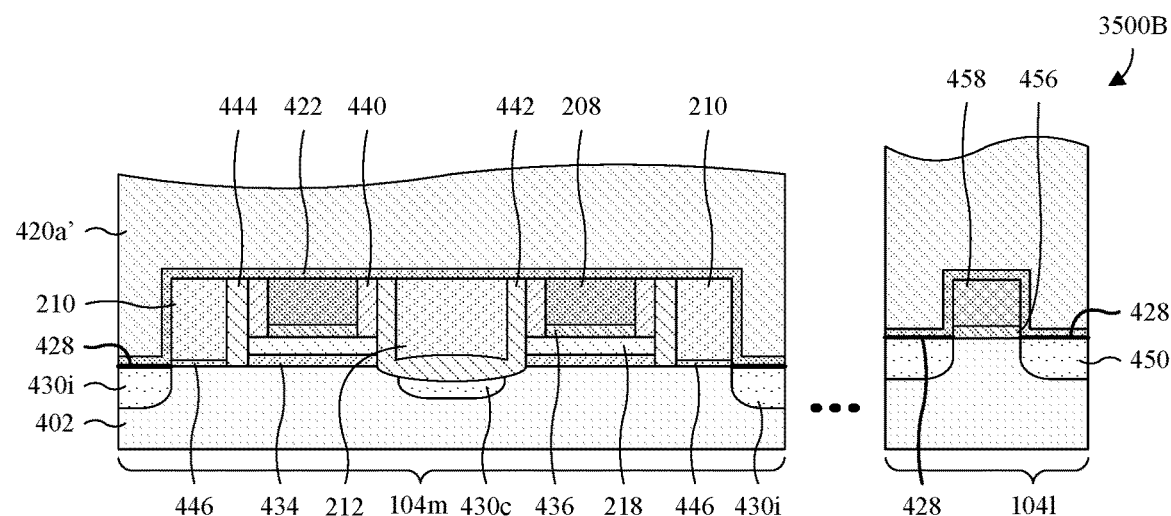

As illustrated by the cross-sectional views 3500A, 3500B of FIGS. 35A and 35B, the various hard masks are removed. The various hard masks include, for example, the logic gate hard mask 2102, the test-device control gate hard mask 410, and the test-device select gate hard masks 3302. See, e.g., FIGS. 34A and 34B. In some embodiments, a process for performing the removal comprise forming an etch-back layer covering and conforming to the structure of FIGS. 34A and 34B. The etch-back layer may be, for example, a flowable material, an organic material, an ARC, some other suitable material(s), or any combination of the foregoing. An etch back is performed into the etch-back layer and the various hard masks. The etch back etches the etch-back layer until the various hard masks are reached. Thereafter, the etch back etches the etch-back layer and the various hard masks in parallel until the various hard masks are removed. With the various hard masks removed, the etch back layer is removed. Removal of the etch back layer may, for example, be performed by an etching process or some other suitable removal process(es).

Also illustrated by the cross-sectional views 3500A, 3500B of FIGS. 35A and 35B, the contact etch stop layer 422 is formed covering and conforming to the structure of FIGS. 34A and 34B, less the various hard masks. The contact etch stop layer 422 may, for example, be silicon nitride, silicon oxynitride, silicon carbide, some other suitable dielectric(s), or any combination of the foregoing. Further, the contact etch stop layer 422 may, for example, be formed by conformal deposition, and/or may, for example, be formed by CVD, PVD, some other suitable deposition process(es), or any combination of the foregoing.

Also illustrated by the cross-sectional views 3500A, 3500B of FIGS. 35A and 35B, a first pre-wire dielectric layer 420a' is formed covering the contact etch stop layer 422. The first pre-wire dielectric layer 420a' may be or comprise, for example, silicon oxide, a low κ dielectric, some other suitable dielectric(s), or any combination of the foregoing. The first pre-wire dielectric layer 420a' may, for example, be formed by depositing the first pre-wire dielectric layer 420a' by CVD, PVD, or some other suitable deposition process(es).

Figure 36A:
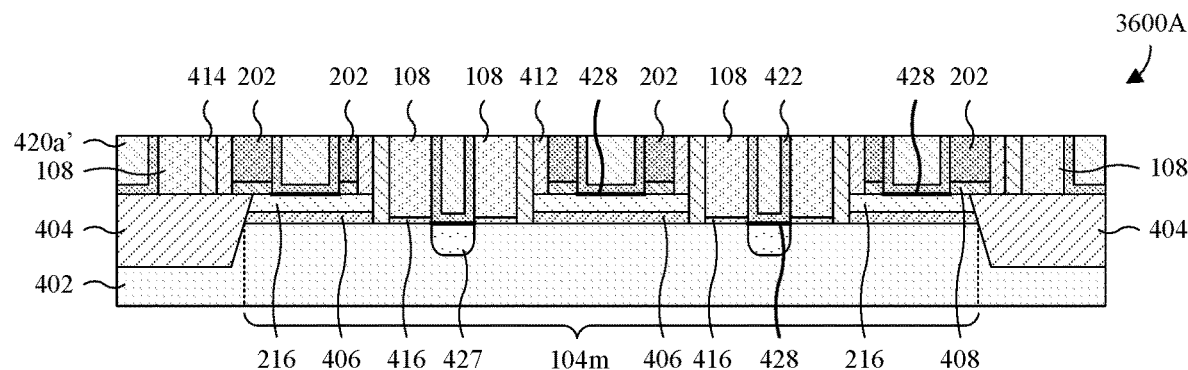
Figure 36B:
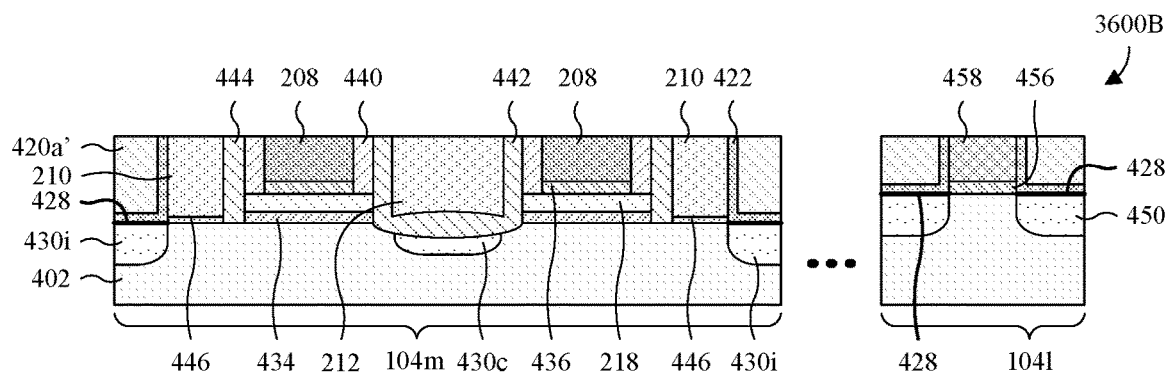

As illustrated by the cross-sectional views 3600A, 3600B of FIGS. 36A and 36B, a planarization is performed into the first pre-wire dielectric layer 420a' and the contact etch stop layer 422 to expose the various gate electrodes. The various gate electrodes include, for example, the test-device control gate electrode 202, the memory select gate electrodes 210, and the logic gate electrode 258. The planarization may, for example, be performed by a CMP and/or some other suitable planarization process.

Figure 37A:
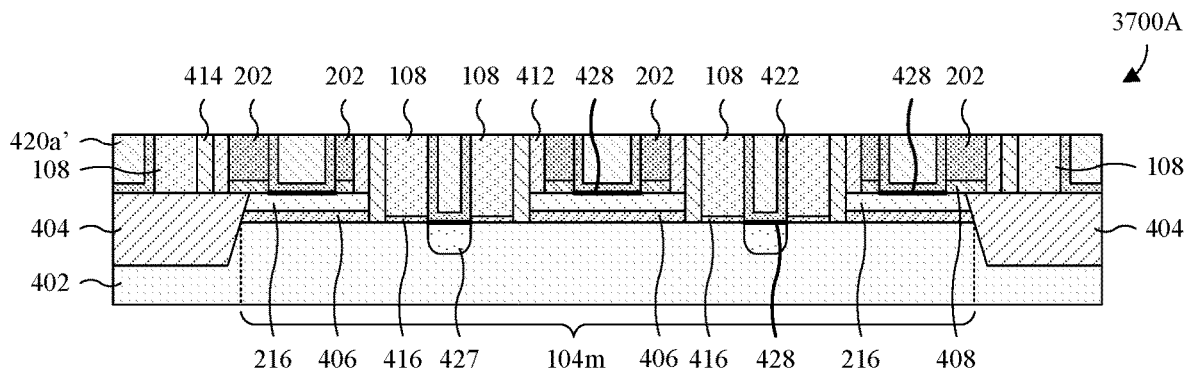
Figure 37B:
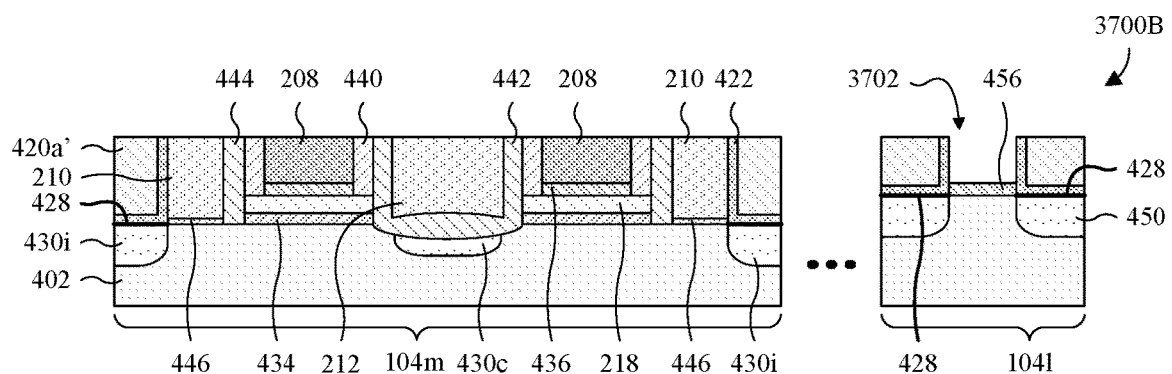

As illustrated by the cross-sectional views 3700A, 3700B of FIGS. 37A and 37B, the logic gate electrode 458 (see FIG. 36B) is removed, thereby defining a logic gate opening 3702 in place of the logic gate electrode 458. The removal may, for example, be performed by a photolithography/etching process or some other removal process.

Figure 38A:
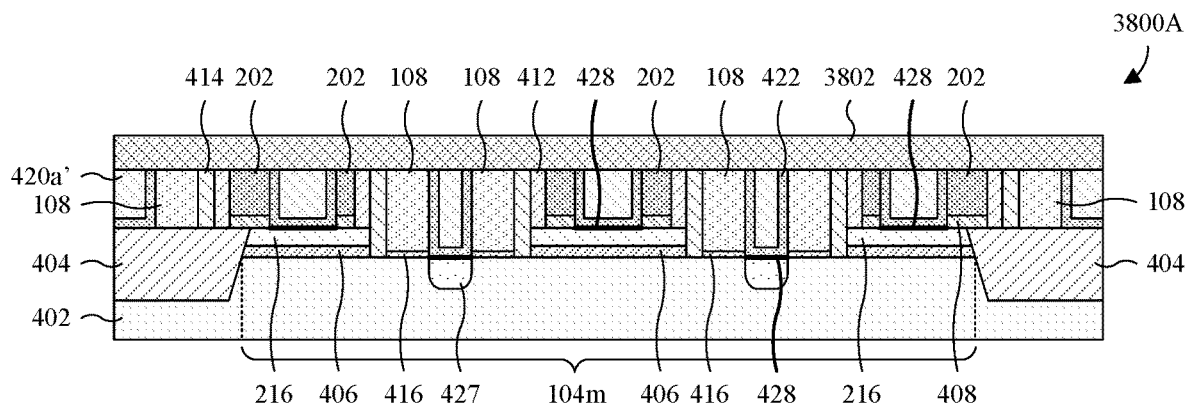
Figure 38B:
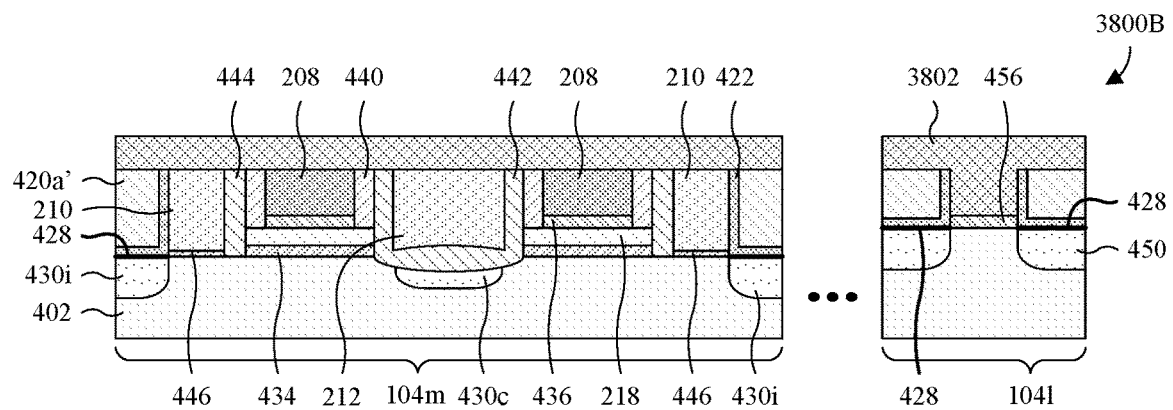

As illustrated by the cross-sectional views 3800A, 3800B of FIGS. 38A and 38B, a gate replacement layer 3802 is formed covering the structure of FIGS. 37A and 37B and filling the logic gate opening 3702 (see FIG. 37B). The gate replacement layer 3802 may, for example, be or comprise metal or some other suitable conductive material, and may, for example, be formed by CVD, PVD, electroless plating, electroplating, some other suitable deposition or plating process(es), or any combination of the foregoing.

Figure 39A:
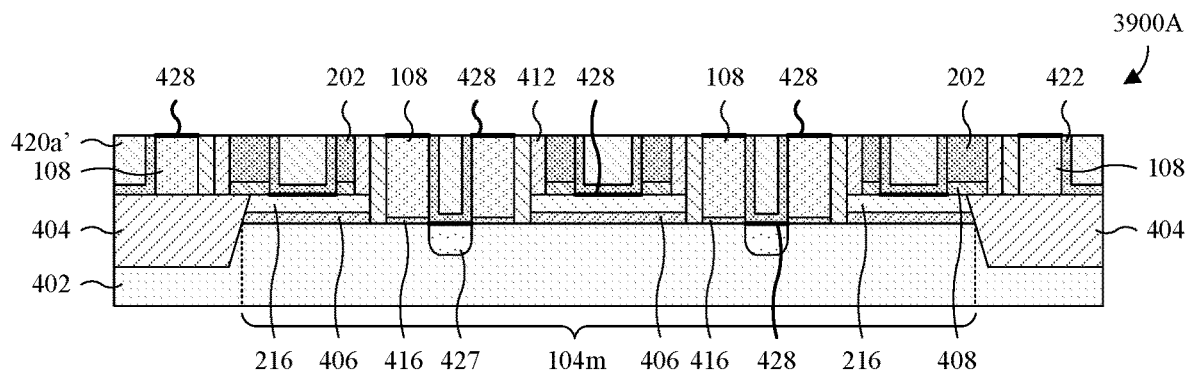
Figure 39B:
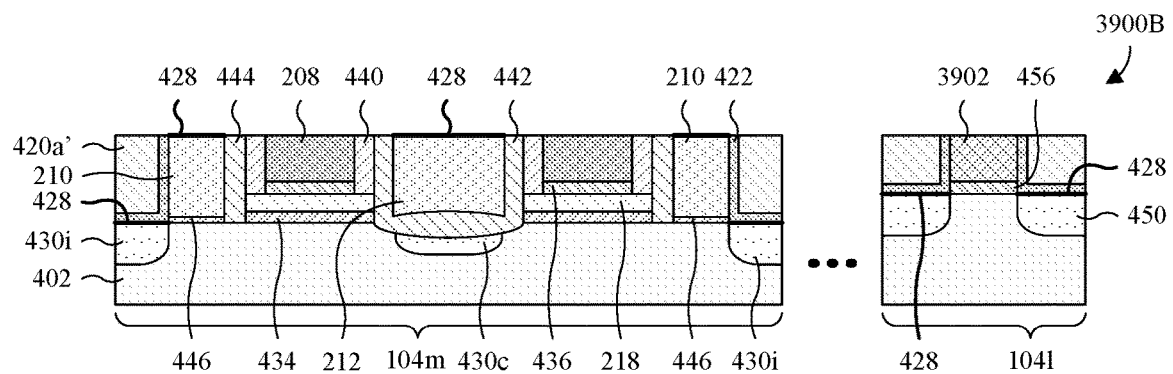

As illustrated by the cross-sectional views 3900A, 3900B of FIGS. 39A and 39B, a planarization is performed into a top of the gate replacement layer 3802 (see FIGS. 38A and 38B) until about even with a top surface of the first pre-wire dielectric layer 420a', thereby forming a replacement logic gate electrode 3902 on the semiconductor logic region 104l. The planarization may, for example, be performed by a CMP and/or some other suitable planarization process.

Also illustrated by the cross-sectional views 3900A, 3900B of FIGS. 39A and 39B, more of the silicide pads 428 are formed on top surfaces of the various gate electrodes. In some embodiments, the various gate electrodes include the test-device select gate electrodes 108, the memory select and erase gate electrodes 210, 212, the replacement logic gate electrode 3902, or any combination of the foregoing. In some embodiments, the silicide pads 428 are not formed on a top surface of the replacement logic gate electrode 3902. In some embodiments, the silicide pads 428 are formed on top surfaces of the memory control gate electrodes 208 and/or a top surface of the test-device control gate electrode 202. The silicide pads 428 may, for example, be nickel silicide or some other suitable silicide(s), and/or may, for example, be formed a salicide process or some other suitable process(es) for forming silicide.

Figure 40A:
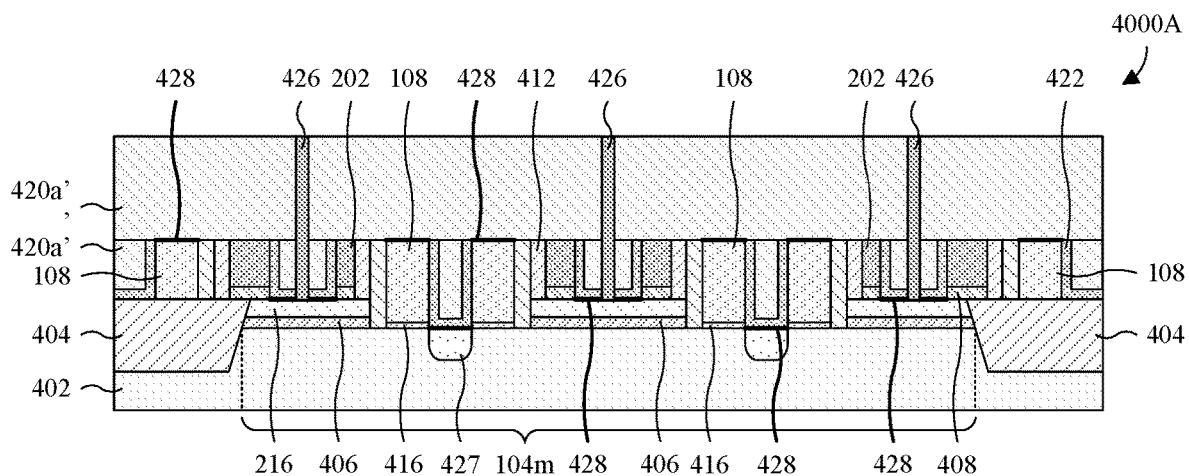
Figure 40B:
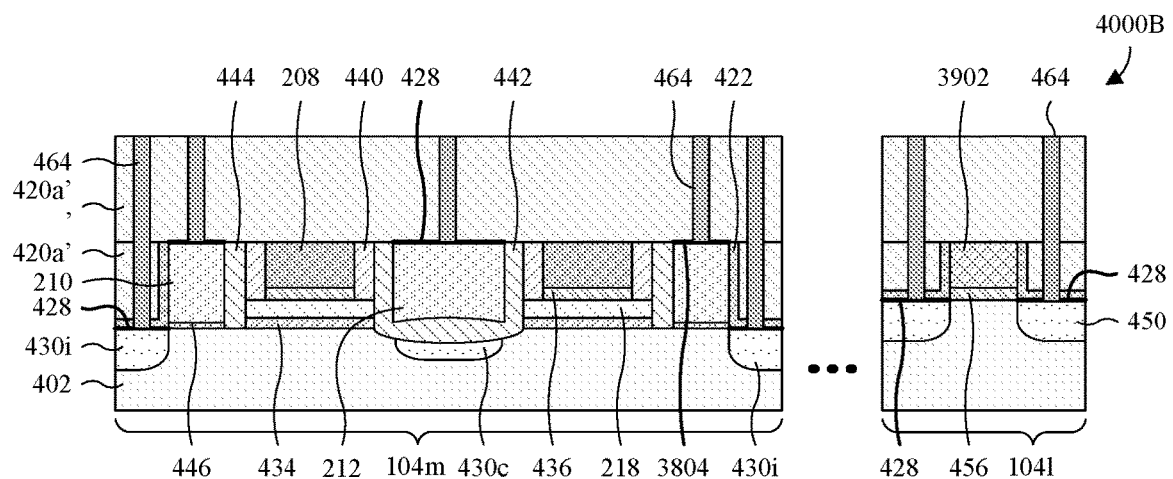

As illustrated by the cross-sectional views 4000A, 4000B of FIGS. 40A and 40B, a second pre-wire dielectric layer 420a" is formed covering the first pre-wire dielectric layer 420a' with a top surface that is planar or substantially planar. The second pre-wire dielectric layer 420a" may be or comprise, for example, silicon oxide, a low κ dielectric, some other suitable dielectric(s), or any combination of the foregoing. In some embodiments, a process for forming the second pre-wire dielectric layer 420a" comprises depositing the second pre-wire dielectric layer 420a", and subsequently performing a planarization into the top surface of the second pre-wire dielectric layer 420a". The depositing may, for example, be performed by CVD, PVD, or some other suitable deposition process(es). The planarization may, for example, be performed by a CMP or some other suitable planarization process(es).

Also illustrated by the cross-sectional views 4000A, 4000B of FIGS. 40A and 40B, the contact vias 426 are formed extending from a top surface of the second pre-wire dielectric layer 420a", through the first and second pre-wire dielectric layers 420a', 420a", to contact with the test-device floating gate electrode 216. Further, the additional contact vias 464 are formed extending from the top surface of the second pre-wire dielectric layer 420a", through the first and second pre-wire dielectric layers 420a', 420a", to contact with the individual memory source/drain regions 430i, the memory select gate electrodes 210, the memory erase gate electrode 212, the logic source/drain regions 450, or any combination of the foregoing. The contact vias 426 and the additional contact vias 464 may be or comprise, for example, tungsten, aluminum copper, copper, aluminum, or some other suitable conductor(s), and/or may, for example, be formed as described with regard to FIGS. 26A and 26B.

Figure 41A:
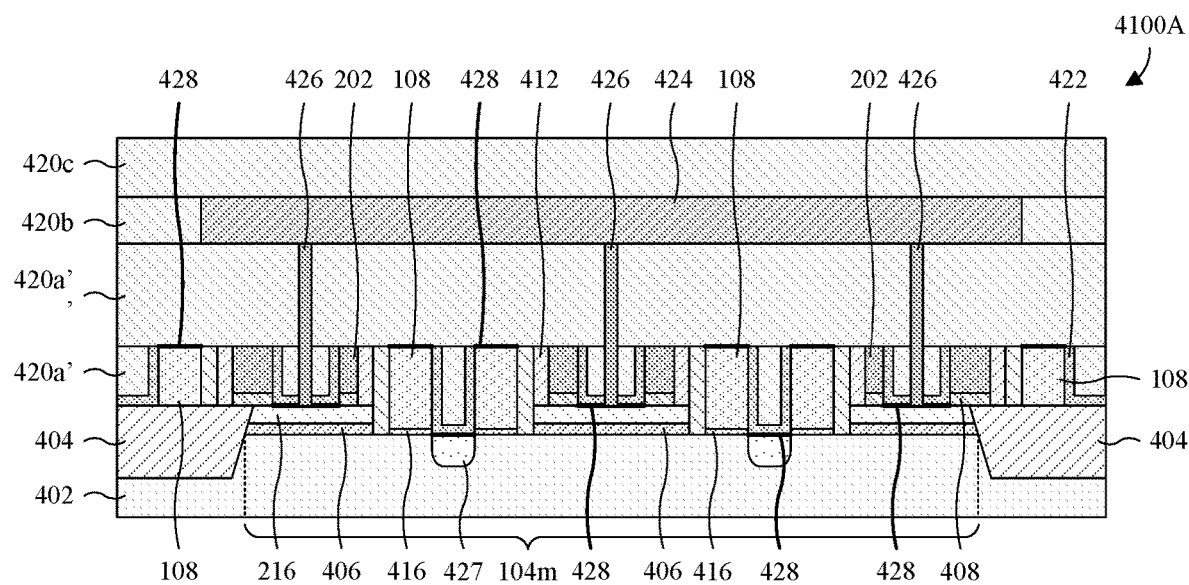
Figure 41B:
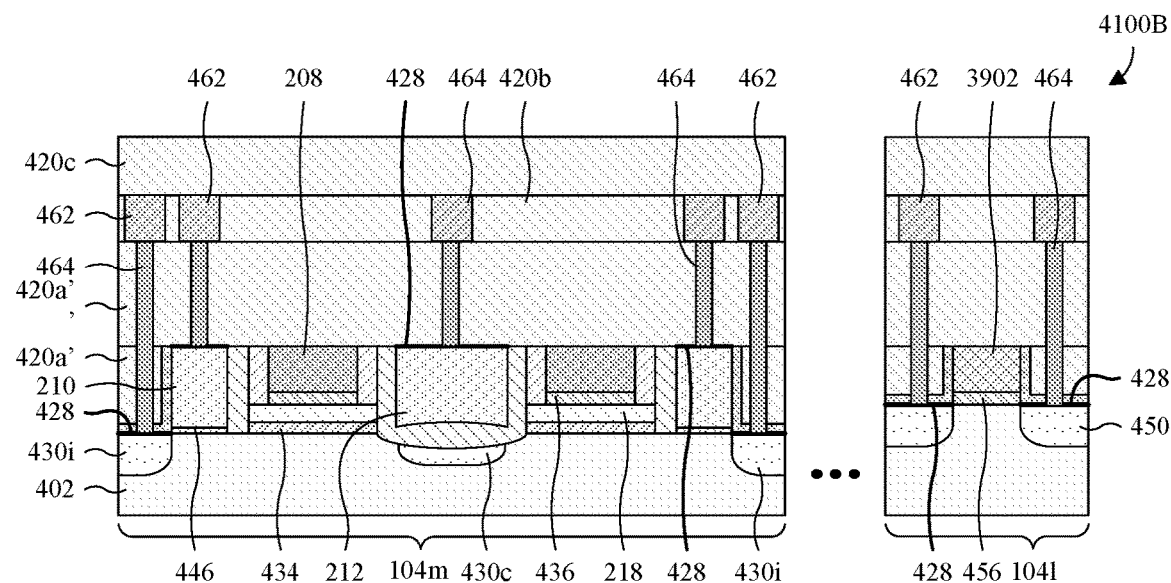

As illustrated by the cross-sectional views 4100A, 4100B of FIGS. 41A and 41B, a wire 424 is formed overlying and contacting the contact vias 426. Further, a plurality of additional wires 462 are respectively formed overlying and contacting the additional contact vias 464. The wire 424 and the additional wires 462 are laterally surrounded by the first ILD layer 420b and are covered by the second ILD layer 420c. The wire 424, the additional wires 462, the first ILD layer 420b, and the second ILD layer 420c are formed as illustrated and described with regard to FIGS. 27A and 27B.

In some embodiments, the present application provides a method for forming an IC, the method including: forming a floating gate test device structure on a semiconductor substrate, wherein the floating gate test device structure includes a first floating gate electrode and a first control gate electrode overlying the first floating gate electrode, wherein the first floating gate electrode and the first control gate electrode partially define an array of islands, and further partially define a plurality of bridges interconnecting the islands; forming a memory cell structure on the semiconductor substrate, wherein the memory cell structure includes a second floating gate electrode and a second control gate electrode overlying the second floating gate electrode; and depositing an etch-back layer covering the floating gate test device structure and the memory cell structure, wherein the etch-back layer has a first thickness directly over the first control gate electrode and a second thickness directly over the second control gate electrode, and wherein the first and second thicknesses are the same or substantially the same. In some embodiments, the method further includes: performing an etch into the etch-back layer, the floating gate test device structure, and the memory cell structure to uniformly or substantially uniformly decrease heights respectively of the floating gate test device structure and the memory cell structure; and removing the etch-back layer. In some embodiments, the method further includes: forming a memory hard mask covering the floating gate test device structure and the memory cell structure, but not a semiconductor logic region of the semiconductor substrate; and forming a logic device structure of the semiconductor logic region, wherein the forming of the logic device structure partially etches the memory hard mask, but not the memory cell structure and the floating gate test device structure. In some embodiments, the forming of the logic device structure includes: forming a plurality of logic device layers covering the memory hard mask and the semiconductor logic region; patterning the logic device layers to define the logic device structure on the semiconductor logic region; and removing the memory hard mask. In some embodiments, the forming of the memory hard mask includes: forming a hard mask layer covering the floating gate test device structure, the memory cell structure, and the semiconductor logic region; performing a planarization into a top surface of the hard mask layer to flatten the top surface of the hard mask layer; and patterning the hard mask layer to remove the hard mask layer from the semiconductor logic region, without removing the hard mask layer from the floating gate test device structure and the memory cell structure. In some embodiments, the forming of the floating gate test device structure includes: forming the first floating gate electrode including a floating gate array of floating gate islands, and further including a plurality of floating gate bridges, wherein the floating gate bridges interconnect the floating gate islands; and forming the first control gate electrode including a control gate array of control gate islands, and further including a plurality of control gate bridges, wherein the control gate islands respectively overlie the floating gate islands, and wherein the control gate bridges interconnect the control gate islands. In some embodiments, the method further includes: forming an ILD layer covering the floating gate test device structure and the memory cell structure; forming a plurality of contact vias extending through the ILD layer, wherein the contact vias respectively overlie the floating gate islands and respectively overlie the control gate islands, and wherein the contact vias extend respectively through the control gate islands and respectively to direct contact with the floating gate islands; and forming a conductive wire covering and directly contacting the contact vias.

In some embodiments, the present application provides an IC including: a semiconductor substrate; and a floating gate test device on the semiconductor substrate, wherein the floating gate test device includes a floating gate electrode and a control gate electrode overlying the floating gate electrode, wherein the floating gate electrode and the control gate electrode partially define an array of islands, and further partially define a plurality of bridges, and wherein the bridges interconnect the islands. In some embodiments, the array is limited to a single row or column. In some embodiments, the array includes a plurality of rows and a plurality of columns. In some embodiments, the plurality of bridges includes a bridge for each pair of neighboring islands in the array, wherein the bridge extends from direct contact with a first island of the pair to a second island of the pair. In some embodiments, the islands have substantially the same top layout, wherein the bridges have substantially the same top layout. In some embodiments, the floating gate electrode includes a floating gate array of floating gate islands, wherein the floating gate electrode further includes a plurality of floating gate bridges, wherein the floating gate islands partially define the islands, respectively, wherein the floating gate bridges partially define the bridges, respectively, and wherein the floating gate bridges interconnect the floating gate islands. In some embodiments, the IC further includes a BEOL interconnect structure covering the semiconductor substrate and the floating gate test device, wherein the BEOL interconnect structure includes an ILD layer, a plurality of contact vias, and a wire, wherein the wire overlies the floating gate test device, and wherein the contact vias respectively overlie the islands and extend from direct contact with the wire, through the control gate electrode, to direct contact with the floating gate electrode. In some embodiments, the control gate electrode includes a control gate array of control gate islands, wherein the control gate electrode includes a plurality of control gate bridges interconnecting the control gate islands, wherein the control gate islands partially define the islands, respectively, and wherein the control gate bridges partially define the bridges, respectively, and wherein the control gate bridges interconnect the control gate islands. In some embodiments, the IC further includes a memory cell on the semiconductor substrate, wherein the memory cell includes a second floating gate electrode, a second control gate electrode, an erase gate electrode, and a select gate electrode, wherein the second control gate electrode overlies the second floating gate electrode, and wherein the erase gate electrode and the select gate electrode respectively border opposite sidewalls of the second control gate electrode. In some embodiments, the floating gate electrode is independent of the second floating gate electrode, and wherein the IC further includes an inter-device line extending continuously from direct contact with the control gate electrode to direct contact with the second control gate electrode.

In some embodiments, the present application another method for forming an IC, the method including: forming a floating gate layer covering a semiconductor substrate; patterning the floating gate layer to define a first floating gate region and a second floating gate region independent of the first floating gate region; forming a control gate layer covering the first and second floating gate regions; patterning the control gate layer to define a first control gate electrode and a second control gate electrode, wherein the first control gate electrode overlies the first floating gate region, wherein the first control gate electrode has a control gate array of control gate islands, and further has a plurality of control gate bridges interconnecting the control gate islands, and wherein the second control gate electrode overlies the second floating gate region and is connected to the first control gate electrode; and performing a first etch into the first and second floating gate regions with the first and second control gate electrodes in place to form a first floating gate electrode and a second floating gate electrode respectively underlying the first and second control gate electrodes. In some embodiments, the method further includes: forming a pad layer covering the semiconductor substrate; patterning the pad layer and the semiconductor substrate to define a trench demarcating a semiconductor device region of the semiconductor substrate, and extending in a closed path along a boundary of the semiconductor device region; filling the trench with a dielectric layer; performing a second etch to remove a portion of the pad layer from the semiconductor device region, and to form an opening in place of the removed portion of the pad layer; and forming the floating gate layer covering the dielectric layer and filling the opening. In some embodiments, the patterning of the floating gate layer includes: performing a planarization into the floating gate layer until the dielectric layer is reached to localize the floating gate layer to the opening, wherein the floating gate layer has the same to layout as the semiconductor device region upon completion of the planarization; and performing a third etch into the floating gate layer to define the first and second floating gate regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a semiconductor substrate; and
a floating gate test device on the semiconductor substrate, wherein the floating gate test device comprises a floating gate electrode and a control gate electrode overlying the floating gate electrode, wherein the floating gate electrode and the control gate electrode partially define an array of islands in a plurality of rows and a plurality of columns, and further partially define a plurality of bridges, wherein the bridges interconnect the islands, wherein the control gate electrode partially defines each of the islands and each of the bridges, and wherein the floating gate electrode partially defines each of the islands in a first row of the plurality of rows and each bridge in the first row;
wherein the first row comprises a first island, a second island, and a third island between the first and second islands, wherein a first axis extends from the first island to the second island and overlaps with the first, second, and third islands and with bridges in the first row, wherein a second axis extends in parallel with the first axis from the first island to the second island and overlaps with the first, second, and third islands, but not with the bridges in the first row, wherein the floating gate electrode is continuous from the first island to the second island along the first axis, and wherein the floating gate electrode is discontinuous from the first island to the second island along the second axis.

2. The IC according to claim 1, wherein the islands have substantially the same top layout, and wherein the bridges have substantially the same top layout.

3. The IC according to claim 1, wherein the floating gate electrode comprises a floating gate array of floating gate islands, wherein the floating gate electrode further comprises a plurality of floating gate bridges, wherein the floating gate islands partially define the islands, respectively, wherein the floating gate bridges partially define the bridges, respectively, and wherein the floating gate bridges interconnect the floating gate islands.

4. The IC according to claim 1, further comprising:
a back-end-of-line (BEOL) interconnect structure covering the semiconductor substrate and the floating gate test device, wherein the BEOL interconnect structure comprises an interlayer dielectric (ILD) layer, a plurality of contact vias, and a wire, wherein the wire overlies the floating gate test device, and wherein the contact vias respectively overlie the islands and extend from direct contact with the wire, through the control gate electrode, to direct contact with the floating gate electrode.

5. The IC according to claim 1, wherein the control gate electrode comprises a control gate array of control gate islands, wherein the control gate electrode comprises a plurality of control gate bridges interconnecting the control gate islands, wherein the control gate islands partially define the islands, respectively, and wherein the control gate bridges partially define the bridges, respectively, and wherein the control gate bridges interconnect the control gate islands.

6. An integrated circuit comprising:
a memory array comprising a plurality of memory cells in a plurality of memory rows and a plurality of memory columns, and further comprising a plurality of control gate lines and a plurality of floating gate electrodes, wherein the control gate lines are individual to, and are elongated respectively along, the memory columns, such that the control gate lines each individually extends across the memory rows, wherein the control gate lines respectively overlie the floating gate electrodes, and wherein the plurality of control gate lines comprises a first control gate line; and
a floating gate test device at an end of the first control gate line and distinct from the memory array, wherein the floating gate test device comprises a first gate electrode that is integrated with the first control gate line and that comprises a plurality of large-area regions and a plurality of small-area regions, wherein the large-area regions have individual top surface areas that are large compared to individual top surface areas of the small-area regions, and wherein the first gate electrode alternates periodically between the large-area regions and the small-area regions in a first direction crosswise to the memory columns;
wherein the plurality of large-area regions comprises a first large-area region, a second large-area region, and a third large-area region between the first and second large-area regions, wherein the plurality of small-area regions comprises a first small-area region and a second small-area region, wherein the first and second small-area regions extend from the third large-area region respectively to the first and second large-area regions respectively in the first direction and a second direction opposite the first direction, and wherein the first gate electrode is continuous from the first large-area region to the second large-area region along an axis at a single elevation.

7. The integrated circuit according to claim 6, wherein the large-area regions are in a plurality of peripheral rows and a plurality of peripheral columns, and wherein the small-area regions each extend laterally from one of the large-area regions to another one of the large-area regions.

8. The integrated circuit according to claim 6, wherein the small-area regions are each laterally elongated in the first direction crosswise to the memory columns.

9. The integrated circuit according to claim 6, wherein a dimension of the large-area regions in a direction parallel to the memory columns is larger than that of the small-area regions.

10. The integrated circuit according to claim 6, wherein the floating gate test device comprises a second gate electrode that underlies the first gate electrode and that is electrically floating, and wherein the large-area regions are each directly over the second gate electrode.

11. The integrated circuit according to claim 6, wherein the floating gate test device further comprises a second gate electrode that is laterally recessed into a side of the first gate electrode and that has a U-shaped top layout.

12. An integrated circuit comprising:
a plurality of memory floating gate electrodes in a plurality of gate rows and a plurality of gate columns;
a plurality of conductive inter-device lines continuously extending in parallel across the gate rows in a first direction and further continuously extending respectively along the gate columns, wherein the conductive inter-device lines overlie memory floating gate electrodes in the respective gate columns, and wherein the plurality of conductive inter-device lines comprises a first conductive inter-device line;
a test-device control gate electrode first at an end of the first conductive inter-device line, wherein the test-device control gate electrode is continuous with the first conductive inter-device line; and
a test-device floating gate electrode that is conductive and underlies the test-device control gate electrode, wherein the test-device floating gate electrode defines a plurality of island-type regions and a plurality of bridge-type regions, wherein the island-type regions are in one or more island rows and a plurality of island columns, wherein the island columns are spaced in a second direction transverse to the first direction, and wherein the island-type regions are interconnected by the bridge-type regions;
wherein a first island row of the one or more island rows comprises a first island-type region and a second island-type region that are respectively on opposite ends of the first island row, wherein the first island-type region has a first sidewall facing away from the second island-type region and the second island-type region has a second sidewall facing away from the first island-type region, and wherein the test-device floating gate electrode is continuous linearly from the first sidewall to the second sidewall.

13. The integrated circuit according to claim 12, further comprising:
an interlayer dielectric layer covering the plurality of conductive inter-device lines and the test-device control gate electrode, wherein the interlayer dielectric layer protrudes through the test-device control gate electrode at each of the island-type regions.

14. The integrated circuit according to claim 12, further comprising:
a conductive wire overlying the island-type regions; and
a plurality of contact vias between the test-device floating gate electrode and the conductive wire, wherein the contact vias extend from the conductive wire respectively to the island-type regions while passing through the test-device control gate electrode.

15. The integrated circuit according to claim 12, further comprising:

a test-device select gate electrode extending vertically through the test-device control and floating gate electrodes, wherein the test-device control gate electrode extends laterally in a closed path to surround the test-device select gate electrode, and wherein the test-device select gate electrode is ring shaped.

16. The IC according to claim 1, further comprising:
an array of memory cells having a plurality of memory rows and a plurality of memory columns, wherein the array of memory cells comprises a second control gate electrode, wherein the second control gate electrode has a greatest dimension in a first direction along a first memory column of the plurality of memory columns and further defines multiple memory cells of the array of memory cells in the first memory column, wherein the floating gate test device is at periphery of the array of memory cells, wherein islands in the first row of the plurality of columns are spaced in a second direction transverse to the first direction, and wherein the control gate electrode and the second control gate electrode directly contact.

17. The IC according to claim 1, wherein a first column of the plurality of columns comprises the first island, a fourth island, and a fifth island between the first and fourth islands, wherein a third axis extends from the first island to the fourth island and overlaps with the first, fourth, and fifth islands and with bridges in the first column, wherein a fourth axis extends in parallel with the third axis from the first island to the fourth island and overlaps with the first, fourth, and fifth islands, but not with the bridges in the first column, wherein the control gate electrode is continuous from the first island to the fourth island along the third axis, and wherein the control gate electrode is discontinuous from the first island to the fourth island along the fourth axis.

18. The integrated circuit according to claim 6, wherein the third large-area region directly contacts the first control gate line at the single elevation.

19. The integrated circuit according to claim 6, wherein the plurality of large-area regions comprises a fourth large-area region, wherein the plurality of small-area regions comprises a third small-area region, wherein the third small-area region extends from the first large-area region to the fourth large-area region in a third direction transverse to the first and second directions, and wherein the first gate electrode is continuous from the first large-area region to the fourth large-area region along a second axis extending transverse to the axis and at the single elevation.

20. The integrated circuit according to claim 12, wherein the test-device control gate electrode further defines the plurality of island-type regions and the plurality of bridge-type regions, wherein the first island row comprises a third island-type region between the first and second island-type regions, wherein the test-device control gate electrode is continuous linearly from the first island-type region to the second island-type region and alternates in a periodic pattern between a first width and a second width linearly from the first island-type region to the second island-type region, and wherein first and second widths extend in the first direction.

* * * * *